(12) United States Patent  (10) Patent No.: US 7,658,586 B2
Niewmierzycki et al.  (45) Date of Patent: Feb. 9, 2010

(54) ADVANCED LOW COST HIGH THROUGHPUT PROCESSING PLATFORM

(75) Inventors: Leszek Niewmierzycki, San Jose, CA (US); David Barker, Walnut Creek, CA (US); Michael Kuhlman, Fremont, CA (US); Ryan Pakulski, Discovery Bay, CA (US); Hongqing Shan, Cupertino, CA (US); Martin Zucker, Orinda, CA (US)

(73) Assignee: Mattson Technology, Inc, Fremont, CA (US)

( * ) Notice: Subject to any disclaimer, the term of this patent is extended or adjusted under 35 U.S.C. 154(b) by 267 days.

(21) Appl. No.: 11/097,412

(22) Filed: Apr. 1, 2005

(65) Prior Publication Data

US 2006/0039781 A1  Feb. 23, 2006

Related U.S. Application Data

(63) Continuation-in-part of application No. 10/919,582, filed on Aug. 17, 2004.

(51) Int. Cl.
 *H01L 21/67* (2006.01)
(52) U.S. Cl. .................. 414/217; 414/935; 414/939
(58) Field of Classification Search .............. 414/217, 414/805, 939, 935
 See application file for complete search history.

(56) References Cited

U.S. PATENT DOCUMENTS

| | | | |
|---|---|---|---|
| 3,125,232 A | | 3/1964 | Brinkman et al. |
| 4,373,988 A | | 2/1983 | Buaser et al. |
| 4,687,542 A | | 8/1987 | Davis et al. |
| 4,836,733 A | * | 6/1989 | Hertel et al. ............. 414/744.5 |
| 4,885,946 A | * | 12/1989 | Balter ....................... 74/18.1 |
| 4,927,484 A | | 5/1990 | Mitomi |
| 5,011,366 A | * | 4/1991 | Miller ....................... 414/811 |
| 5,584,647 A | * | 12/1996 | Uehara et al. ............. 414/744.5 |
| 5,713,717 A | | 2/1998 | Cho |
| 5,765,444 A | | 6/1998 | Bacchi et al. |
| 5,944,857 A | | 8/1999 | Edwards et al. |
| 5,961,269 A | | 10/1999 | Krocker |
| 6,042,623 A | * | 3/2000 | Edwards ..................... 29/25.01 |
| 6,071,055 A | | 6/2000 | Tepman |

(Continued)

OTHER PUBLICATIONS

File History for co-pending U.S. Appl. No. 10/919,582, filed Aug. 17, 2004, Publication No. 2006-0045664-A1.

(Continued)

*Primary Examiner*—Michael S Lowe
(74) *Attorney, Agent, or Firm*—Pritzkau Patent Group LLC

(57) ABSTRACT

A wafer processing system and method in which a wafer, having a diameter, is movable between a loadlock and a processing chamber. A transfer chamber is arranged for selective pressure communication with the loadlock and the processing chamber. The transfer chamber having a configuration of lateral extents such that the wafer is movable through the transfer chamber between the loadlock and processing chamber along a wafer transfer path and the configuration of lateral extents causes the wafer, having the wafer diameter and moving along the wafer transfer path, to interfere with at least one of the loadlock and the processing chamber for any position along the wafer transfer path. The wafer includes a center and the wafer transfer path cab be defined by movement of the center through the transfer chamber. Swing arms are described that can independently move by different angles in opposing directions from a home position.

32 Claims, 41 Drawing Sheets

U.S. PATENT DOCUMENTS

| | | | |
|---|---|---|---|
| 6,082,950 A * | 7/2000 | Altwood et al. | 414/217 |
| 6,095,741 A | 8/2000 | Krocker et al. | |
| 6,105,454 A | 8/2000 | Bacchi et al. | |
| 6,315,512 B1 | 11/2001 | Tabrizi et al. | |
| 6,318,945 B1 | 11/2001 | Hofmeister | |
| 6,350,097 B1 | 2/2002 | Mitchell et al. | |
| 6,395,094 B1 | 5/2002 | Tanaka et al. | |
| 6,429,139 B1 | 8/2002 | Ryan et al. | |
| 6,464,448 B1 | 10/2002 | Ha | |
| 6,537,415 B2 | 3/2003 | Kojima et al. | |
| 6,568,552 B1 | 5/2003 | Tabrizi et al. | |
| 6,568,896 B2 * | 5/2003 | Franklin et al. | 414/217 |
| 6,585,470 B2 | 7/2003 | Van Der Meulen | |
| 6,610,150 B1 | 8/2003 | Savage et al. | |
| 6,663,333 B2 | 12/2003 | Kinnard et al. | |
| 6,675,069 B2 | 1/2004 | Uratani | |
| 6,692,219 B2 * | 2/2004 | Coomer et al. | 414/754 |
| 6,719,517 B2 | 4/2004 | Beaulieu et al. | |
| 6,737,826 B2 | 5/2004 | Gilchrist | |
| 6,748,293 B1 | 6/2004 | Larsen | |
| 6,755,092 B2 | 6/2004 | Wakabayashi et al. | |
| 6,893,204 B1 | 5/2005 | Suzuki et al. | |
| 2002/0006323 A1 | 1/2002 | Yoshida et al. | |
| 2002/0033136 A1 | 3/2002 | Savage et al. | |
| 2002/0131848 A1 * | 9/2002 | Kurata | 414/217 |
| 2002/0137354 A1 | 9/2002 | Timperio et al. | |
| 2002/0159864 A1 * | 10/2002 | Lowrance | 414/217 |
| 2003/0035705 A1 | 2/2003 | Johnson | |
| 2003/0108415 A1 * | 6/2003 | Hosek et al. | 414/783 |
| 2003/0113187 A1 | 6/2003 | Lei et al. | |
| 2004/0013497 A1 | 1/2004 | Shirai | |
| 2004/0240971 A1 * | 12/2004 | Tezuka et al. | 414/217 |
| 2006/0258128 A1 | 11/2006 | Nunan et al. | |

OTHER PUBLICATIONS

File History for co-pending U.S. Appl. No. 11/622,361, filed Jan. 11, 2007, Publication No. 2007-0175864-A1.
Amendment E dated Oct. 8, 2008 for co-pending U.S. Appl. No. 10/919,582, filed Aug. 17, 2004.
Office Action dated Jan. 22, 2009 for co-pending U.S. Appl. No. 10/919,582, filed Aug. 17, 2004.
Amendment F and IDS dated Oct. 8, 2008 for co-pending U.S. Appl. No. 10/919,582, filed Aug. 17, 2004.
Office Action dated Nov. 26, 2008 for co-pending U.S. Appl. No. 11/622,361, filed Jan. 11, 2007.
Amendment A dated Mar. 10, 2009 for co-pending U.S. Appl. No. 11/622,361, filed Jan. 11, 2007.
Notice of Allowance dated Jun. 12, 2009 for co-pending U.S. Appl. No. 11/622,361, filed Jan. 11, 2007.

* cited by examiner

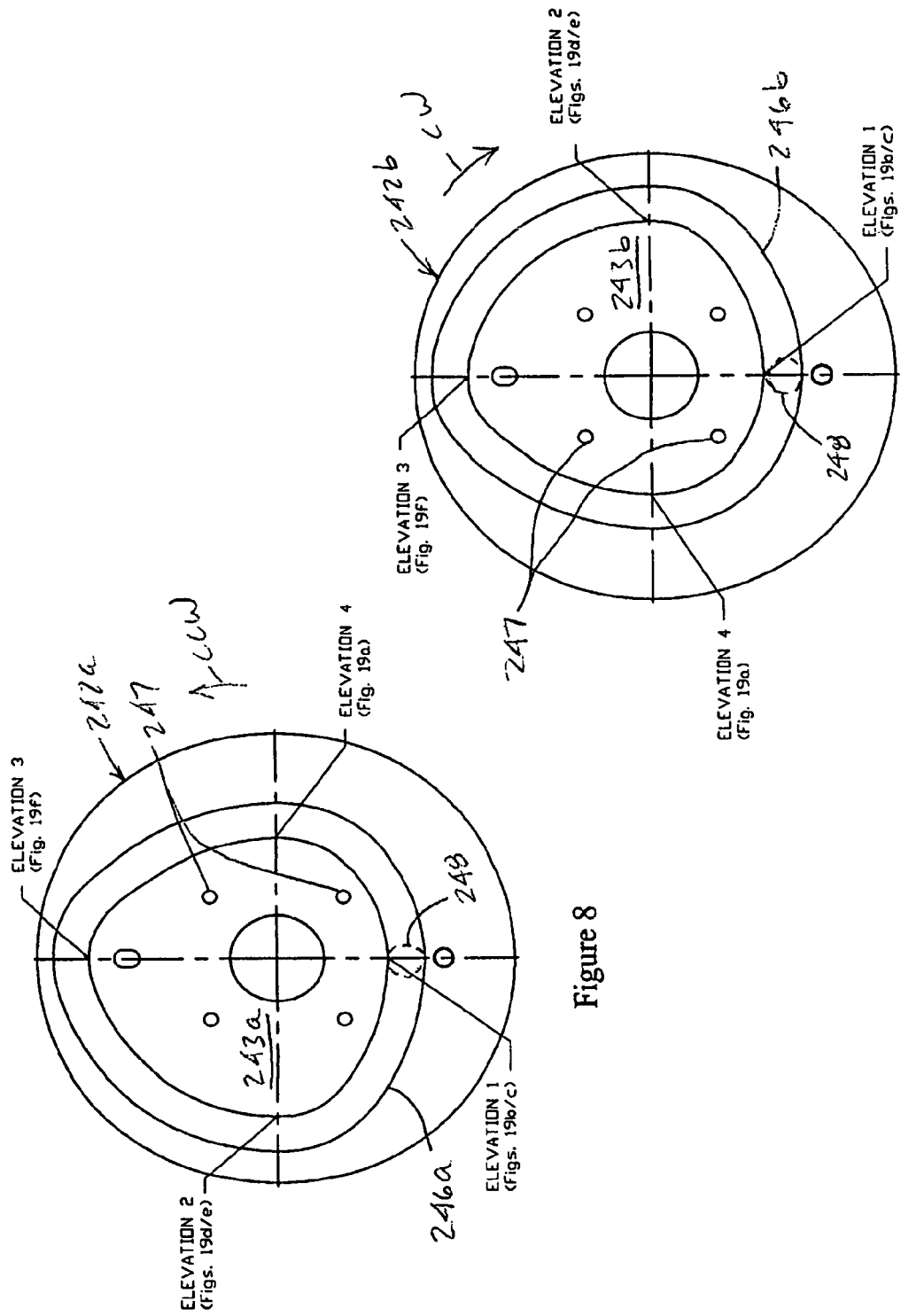

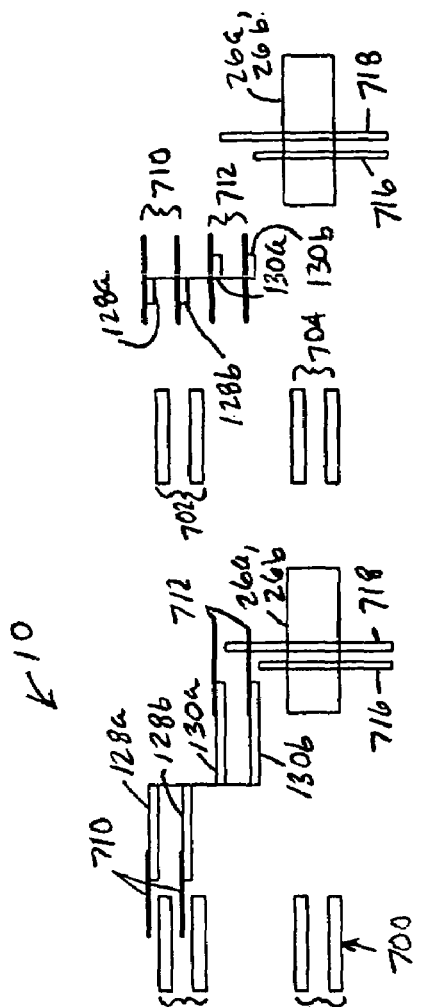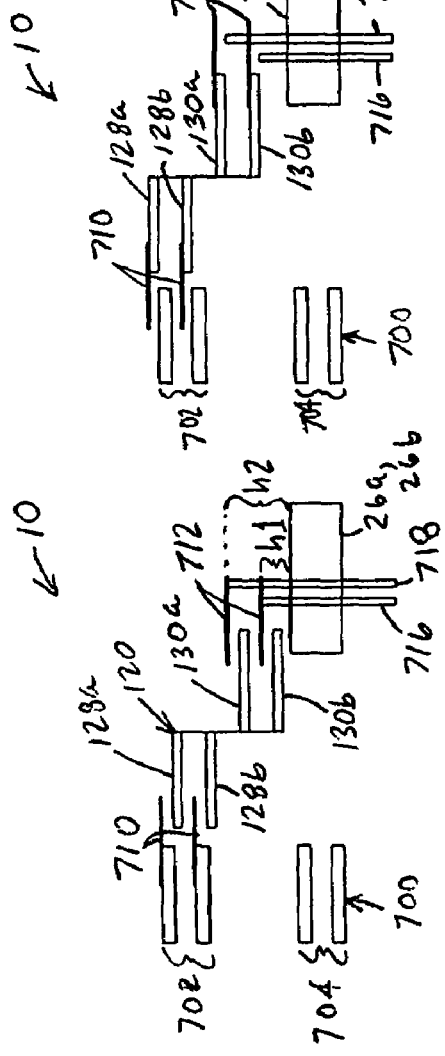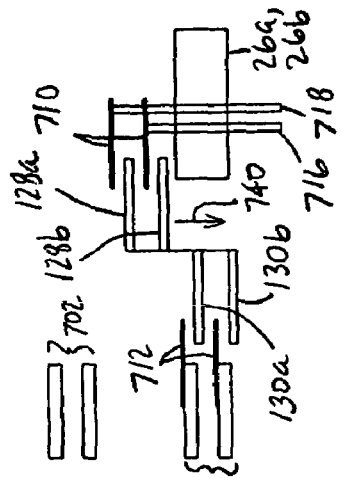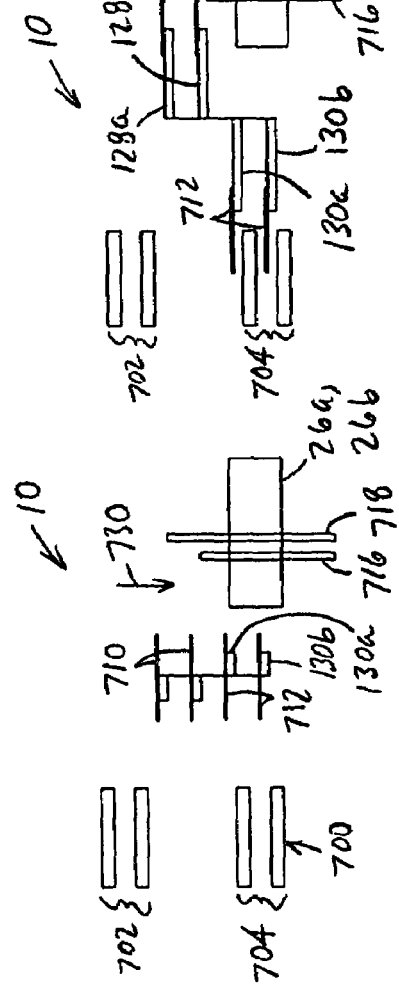
FIGURE 19a FIGURE 19b FIGURE 19c
FIGURE 19d FIGURE 19e FIGURE 19f

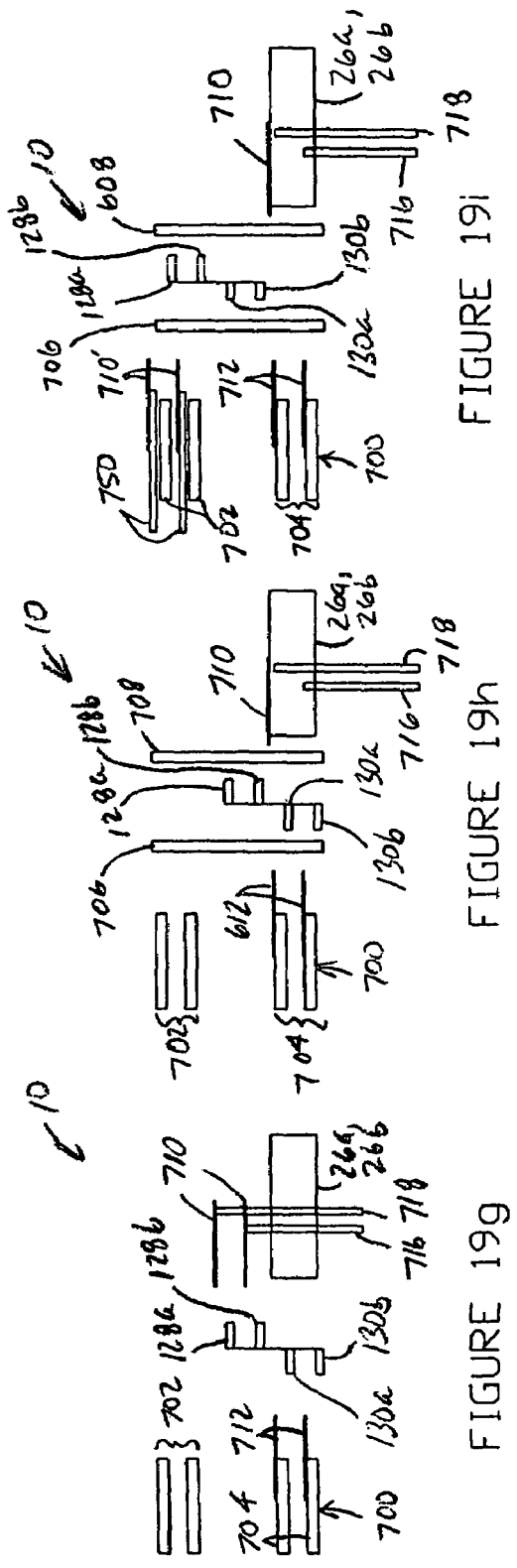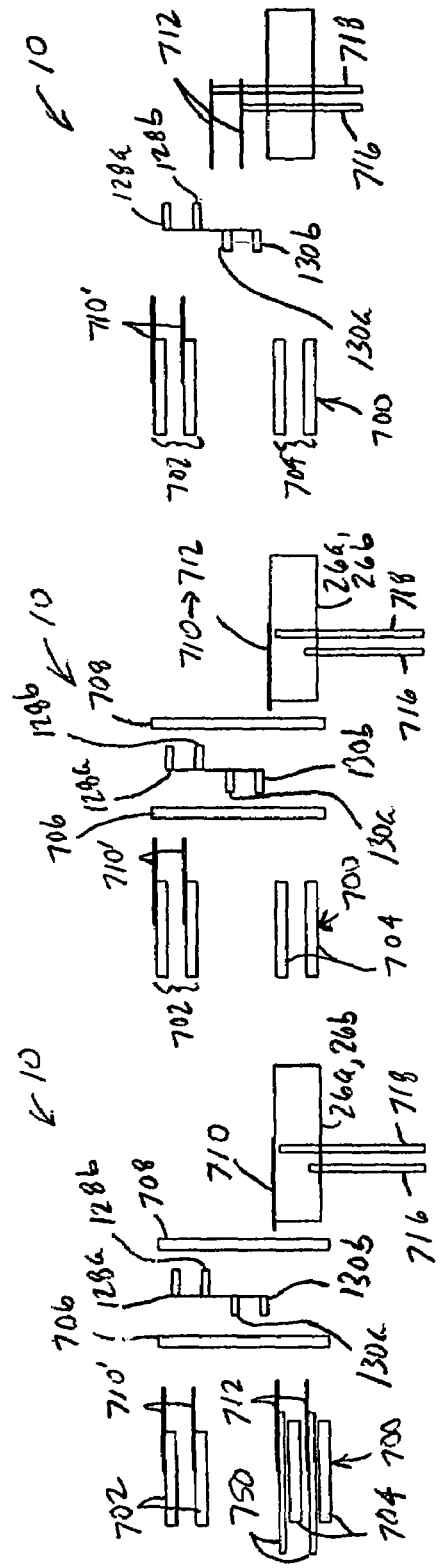

ADVANCED LOW COST HIGH THROUGHPUT PROCESSING PLATFORM

RELATED APPLICATION

The present application is a Continuation-In-Part of U.S. patent application Ser. No. 10/919,582, entitled LOW COST HIGH THROUGHPUT PROCESSING PLATFORM, filed on Aug. 17, 2004 which is incorporated herein by reference in its entirety.

BACKGROUND OF THE INVENTION

Processing systems which expose workpieces such as, semiconductor wafers or other suitable substrates, to an overall treatment regimen for forming a particular device generally employ a plurality of treatment steps. In order to sequentially carry out these steps, each workpiece is typically moved a number of different times, for example, into the system, between various processing stations and out of the system. With the foregoing in mind, it is noted that the prior art contains a number of alternative approaches for use in performing such workpiece transfers and related functions, certain ones of which are interest here, as will be described in further detail immediately hereinafter.

One prior art workpiece transfer approach is demonstrated in U.S. Pat. No. 6,429,139 (hereinafter the '139 patent). More specifically, the '139 patent, in FIGS. 5, 6 and 7A-D, illustrates the use of an articulated robot arm for use in workpiece transfer. While the use of a single wafer paddle is illustrated, it should be appreciated that multiple paddles have been provided using such an articulated robot arm. It should also be appreciated that this particular robot is somewhat simplified to the extent that the prior art provides such a configuration in which vertical movement of the workpiece is also accomplished by the robot. While such articulated robotic arm configurations effectively provide essentially unlimited capabilities with respect to moving workpieces; unfortunately, they are relatively complex and, therefore, expensive to manufacture and maintain.

A simple swing arm, as taught by the prior art, generally comprises an arm member which extends from a pivot point to a wafer paddle. Such a swing arm, therefore, provides for rotational motion of a workpiece. While a swing arm configuration represents a dramatic simplification over the use of an articulated robotic arm, at least generally thought to be accompanied by improved reliability and lower cost, it also represents far more limited capabilities with respect to wafer positioning. Specifically, the swing arm, in its basic configuration, is capable only of moving one wafer along a single diameter, planar circular path. One early swing arm approach is seen in U.S. Pat. No. 4,927,484 (hereinafter the '484 patent). FIGS. 1 and 2 of this patent demonstrate a typical prior art approach in which a plurality of simple swing arms cooperate in order to provide greater workpiece movement flexibility. Again, however, these swing arms appear to be limited to rotation of a workpiece in a single plane.

As an alternative approach to the articulated robotic arm and an improvement over the simple swing arm, the '139 patent also teaches the use of a double-ended swing arm arrangement. Swing arm capability is enhanced through providing an elongated swing arm member having a wafer paddle positioned at each of its opposing ends, with a pivot point centered therebetween, as can be seen in FIG. 8A of the '139 patent. Further, the '139 patent, as seen in FIGS. 9A-D, describes wafer paddles that are rotatable at the ends of the swing arm member so as to at least somewhat improve the positioning capabilities and flexibility of the swing arm over earlier prior art configurations. Unfortunately, however, swing arm positioning capabilities remain limited, despite these improvements, particularly with respect to the capability to move the wafer only in one plane of rotation.

A more recent approach with respect to the use of a swing arm is seen in U.S. Pat. No. 6,610,150 issued to Savage et al (hereinafter Savage). Savage illustrates, in FIG. 8 of the patent, a swing arm having an end effector that is configured for supporting a pair of workpieces. Like the remaining prior art, only simple rotational motion is described wherein typical prior art expedients such as lift pins are used to remove a workpiece from the end effector.

Another area of concern with respect to prior art workpiece processing systems resides in the door arrangements that are used to seal various portions of the system from one another. Many systems utilize, for example, a loadlock chamber (i.e., a chamber that facilitates both workpiece load and unload functions), a transfer chamber and one or more process chambers. Workpieces are typically transferred between the loadlock chamber and the process chamber through the transfer chamber. It is necessary, in such a configuration, to selectively seal the loadlock chamber from the transfer chamber. For purposes of workpiece transfer, a slot or slit is generally defined between the two chambers. Sealing is often performed using a slit door arrangement in which a platelike door member is used to seal the elongated slit. Concerns with respect to prior art slit door arrangements include contamination production, the need for precision alignment and sealing mechanisms.

One prior art slit door configuration is described in U.S. Pat. No. 6,095,741 (hereinafter the '741 patent) having a blade member which is hinged to its actuation arm for pivotal movement about a horizontal axis. This arrangement is considered to be unacceptable, particularly with respect to precision alignment of the elongated, horizontal dimension of the sealing blade and the potential production of contaminants in the absence of such precision alignment, as will be appreciated in view of the descriptions which follow.

With respect to sealing mechanisms, the '741 patent uses a bellows as part of its slit door arrangement, illustrated as item number 704 in FIG. 6A of the patent. While such a bellows mechanism may be effective for purposes of the '741 patent, it is considered as problematic for reasons which include cost and reliability concerns. As will be further described, the prior art has adopted other approaches as alternatives to the bellows mechanism.

One such alternative to the bellows mechanism is illustrated in FIG. 29, which is a partially cutaway view of a prior art slit door configuration that is generally indicated by the reference number 1700. This prior art configuration includes a pivot shaft 1702 that is connected at an upper end to a sealing blade (not shown) for pivotal motion, as indicated by a double headed arrow 1704 about a pivot axis 1706. Pivot shaft 1702 is received in a housing 1710. Sealing between housing 1710 and pivot shaft 1702 is accomplished using a seal flange 1712 that is received on housing 1710 and sealed thereagainst using an O-ring 1714. A seal hat 1716 is supported on pivot shaft 1702 and sealed thereagainst using an O-ring 1718. Seal hat 1716 supports an O-ring 1720 for sealing against a sealing surface 1722 that is defined by seal flange 1712 such that side-to-side motion of O-ring 1720 against sealing surface 1722 is accommodated. Unfortunately, however, pivotal motion of pivot shaft 1702 also imparts tilting of seal hat 1716 thereby compressing one portion of the O-ring 1720 while releasing an opposing portion of the O-ring. This behavior is disadvantageously considered to limit the range of pivotal motion of pivot shaft 1702.

The present invention resolves the foregoing limitations and concerns while providing still further advantages.

SUMMARY OF THE INVENTION

A system for processing workpieces, as well as an associated apparatus and method are described. A plurality of workpieces are movable to and from a process chamber arrangement in the system. The process chamber arrangement uses at least two side-by-side, first and second process stations each of which is configured for executing a treatment process on one of the workpieces located at each of the first and second process stations such that two workpieces can simultaneously be exposed to the treatment process. In one aspect of the present invention, a workpiece support arrangement, separate from the process chamber arrangement, is used for supporting at least two of the workpieces at least generally in a stacked relationship to form a workpiece column. A workpiece transfer arrangement, also separate from the process chamber arrangement, is used for transporting at least two of the workpieces between the workpiece column and the process chamber arrangement by simultaneously moving the two workpieces at least generally along first and second transfer paths, respectively, that are defined between the workpiece column and the first and second process stations.

In another aspect of the present invention, workpieces are movable to and from a process chamber arrangement, the process chamber arrangement using at least two side-by-side process stations, each of which is configured for treating individual ones of the workpieces located at each of the process stations such that at least two workpieces can simultaneously be treated. A workpiece support arrangement, separate from the process chamber arrangement, supports at least two of the workpieces at least generally in a stacked relationship to form a workpiece column. A workpiece transfer arrangement, separate from the process chamber arrangement, is configured at least for simultaneously moving two pre-treatment ones of the workpieces from the workpiece column to each of the side-by-side process stations.

In still another aspect of the present invention, workpieces are movable to and from a process chamber arrangement that is configured for executing a treatment process on at least one of the workpieces. A workpiece support arrangement, separate from the process chamber arrangement, supports at least one of the workpieces for movement in relation to the process chamber arrangement. A swing arm arrangement, separate from the process chamber arrangement, includes at least a first swing arm for providing pivotal rotation of at least one workpiece about an axis of rotation, as part of transporting the workpiece between the workpiece support arrangement and the process chamber arrangement, and for moving in a direction that is at least generally along the axis of rotation, as another part of transporting the workpiece, to change an elevation of the swing arm such that the workpiece being transported can be moved between different spaced-apart elevational planes in addition to the pivotal rotation.

In yet another aspect of the present invention, workpieces are movable to and from a process chamber arrangement that is configured for executing a treatment process on at least one of the workpieces. A swing arm arrangement includes at least a first swing arm for providing pivotal rotation of at least one workpiece about an axis of rotation, as part of transporting the workpiece at least in relation to the process chamber arrangement, and for moving in a direction that is at least generally along the axis of rotation, as another part of transporting the workpiece, to change an elevation of the swing arm such that the workpiece being transported can be moved between different spaced-apart elevational planes in addition to the pivotal rotation.

In a continuing aspect of the present invention, workpieces are movable to and from a process chamber arrangement in a system, the process chamber arrangement using at least one process station that is configured for executing a treatment process on at least one of the workpieces. A workpiece support arrangement is arranged in one spaced apart relationship from the process chamber arrangement for supporting at least one of the workpieces. A swing arm arrangement is positioned in another spaced apart relationship from the process chamber arrangement including at least a first swing arm and a second swing arm configured for coaxial rotation about a common axis of rotation for use in transporting the workpieces between the workpiece support arrangement and the process chamber arrangement.

In a further aspect of the present invention, workpieces are movable to and from a process chamber arrangement in a system. The process chamber arrangement uses at least one process station that is configured for executing a treatment process on at least one of the workpieces. A swing arm arrangement, forming part of the system, includes at least a first swing arm and a second swing arm configured for coaxial rotation about a common axis of rotation for use in transporting the workpieces in relation to the process chamber arrangement.

In another aspect of the present invention for processing workpieces using a treatment process, a system configuration includes a pair of side-by-side first and second process stations, each process station configured for applying the treatment process to one of the workpieces. A workpiece support arrangement is configured for supporting one or more of the workpieces. The workpiece support arrangement being positioned at a first distance at least approximately equally from each of the process stations. First and second swing arm arrangements are arranged to pivot about a first axis and a second axis, respectively, such that each one of the first axis and the second axis is positioned at least approximately at a second distance from the workpiece support arrangement while the first axis is at least approximately spaced away from the first process station by the second distance and the second axis is at least approximately spaced away from the second process station by the second distance, such that the first process station, the second process station, the first axis, the second axis and the wafer column cooperate to define a pentagonal shape.

In still another aspect of the present invention, a workpiece processing system, for processing workpieces using a treatment process, includes a configuration having a pair of side-by-side first and second process stations defining a line extending through a first center of the first process station and a second center of the second process station, each process station is configured for applying the treatment process to at least one of the workpieces. A workpiece support arrangement is configured for supporting at least one of the workpieces laterally offset from the line. First and second swing arm arrangements, each of which pivots about a first axis and a second axis, respectively, are arranged at a first swing arm location and a second swing arm location, and each of the first swing arm location and the second swing arm location is offset from the line on a common side thereof toward, but not beyond the workpiece support arrangement such that the first process station, the second process station, the first axis, the second axis and the wafer column cooperate to define a pentagonal shape.

In a continuing aspect of the present invention, in using a first, driven shaft to rotationally drive a second shaft, a configuration includes first and second toothed flexible closed-loop members. A first pulley arrangement is mounted on the first shaft and a second pulley arrangement is mounted on the second shaft for receiving the first and second toothed flexible members in a side-by-side relationship such that at least a particular one of the pulley arrangements includes a first pulley engaging the first toothed flexible member and a second pulley engaging the second toothed flexible member, each of the first and second pulleys having a tooth receiving configuration which cooperates with the first and second toothed flexible members to provide a given backlash clearance when engaged with the first and second toothed belt members, respectively. The first pulley and the second pulley are mounted with a rotational offset therebetween such that the tooth receiving configuration of the first pulley is rotationally offset with respect to the tooth receiving configuration of the second pulley, based on the given backlash clearance, in a way which limits an operational backlash of the particular pulley arrangement with respect to movement of the first and the second toothed flexible members to a value that is less than the given backlash clearance.

In still another aspect of the present invention, a valve apparatus and method are described for use in a workpiece processing system for processing workpieces. The system includes at least two adjacent chambers with a slot defined therebetween, through which slot the workpieces are transportable and a chamber sealing surface, that is at least generally planar, surrounding the slot and supporting a sealing arrangement surrounding the slot. The valve apparatus being configured for selectively opening and closing the slot using a sealing blade member including a blade surface that is configured for sealingly engaging the sealing arrangement. An actuator arrangement moves the sealing blade member between an open position, away from the slot, to provide for passage of the workpieces therethrough, and a closed position in which the sealing blade member is brought into sealing contact at least with the sealing arrangement and for supporting the sealing blade member in a way which provides for movement of the blade surface, at least responsive to engagement with the sealing arrangement, that is characterized by two degrees of freedom for aligning the blade surface with the sealing arrangement and, thereby, the sealing surface.

In a still further aspect of the present invention, a configuration is described for use in a workpiece processing system for processing workpieces. The system having at least two adjacent chambers that are subject to contamination from internally and externally produced contaminants. The configuration includes a chamber body arrangement which serves to define the adjacent chambers and a slot between the adjacent chambers, through which slot the workpieces are transportable and a chamber sealing surface, that is at least generally planar, surrounding the slot. The chamber body arrangement further defining a chamber trough adjacent the slot and therebelow to form a portion of a particular one of the adjacent chambers such that the chamber trough establishes a lowermost region of the chamber body arrangement serving as a collection region for the contaminants, at least in being under an influence of the Earth's gravity, and the chamber body arrangement further defines a pumping port at least for use in evacuation of the particular chamber. A valve arrangement is supported in the particular chamber for selective movement between a closed position, in which a sealing blade thereof seals against the slot to isolate the adjacent chambers from one another, and an open position, in which the sealing blade retracts into the trough. A pumping arrangement is connected to the pumping port at least for use in evacuation of the particular chamber by pumping from the trough in a way which serves to remove at least a portion of the contaminants collected in the trough.

In an additional aspect of the present invention, a wafer processing system and associated method are described in which at least one wafer is movable between a loadlock and a processing chamber. The wafer includes a wafer diameter. A transfer chamber is arranged for selective pressure communication with the loadlock and the processing chamber. The transfer chamber having a configuration of lateral extents such that the wafer is movable through the transfer chamber between the loadlock and processing chamber along a wafer transfer path and the configuration of lateral extents causes the wafer, having the wafer diameter and moving along the wafer transfer path, to interfere with at least one of the loadlock and the processing chamber for any given position along the wafer transfer path. In one feature, the wafer includes a wafer center and the wafer transfer path is defined by movement of the wafer center through the transfer chamber.

In another aspect of the present invention, a system and method are described for processing wafers including at least one loadlock. A transfer chamber is arranged in selective communication with the loadlock. A processing chamber includes at least one processing station such that the processing chamber is in selective communication with the transfer chamber and the wafers can be transferred between the loadlock and the processing chamber through the transfer chamber. A swing arm arrangement is configured to include at least one swing arm that is pivotally supported in the transfer chamber and having a distal end that is configured for moving the wafers between the loadlock and the processing chamber. The swing arm being positionable in a home position within the transfer chamber, when the loadlock and the transfer chamber are in isolation from one another, and the swing arm is configured for swinging the distal end a first angular displacement in one direction from the home position to the loadlock and for swinging the distal end a second angular displacement in an opposite direction from the home position to the processing station such the first angular displacement is different from the second angular displacement. In one feature, the first angular displacement is less than the second angular displacement.

In still another aspect of the present invention, a system and associated method are described for processing wafers at least including a loadlock having a wafer station and a processing chamber having a processing station. A transfer arrangement is configured to include a swing arm arrangement having at least a first swing arm and a second swing arm configured for coaxial rotation about a common axis of rotation for use in transporting the wafers between the wafer station in the loadlock and the processing station in the processing chamber. The first and second swing arms being configured so that one of the swing arms can rotate toward the processing station while the other one of the swing arms independently rotates toward the wafer station. In one feature, each of the first and second swing arms moves through a home position in rotating between the wafer station and the processing station, and the wafer station is reached by rotating through a first angular offset from the home position with the processing station being reached by rotating through a second angular offset from the home position such that the first angular offset is different from the second angular offset. In a related feature, the first angular offset is less than the second angular offset. In another feature, the swing arm arrangement is configured to include a drive arrangement at least for selectively rotating the first swing arm and the second swing arm at different angular velocities. In still another feature, the swing arm arrangement is configured to include a drive arrangement at least for selectively rotating the first swing arm and the second swing arm in opposite directions by different angular amounts. In another related feature, the first swing arm and the second swing arm each rotate at least approximately at the same given angular velocity in the opposite directions such that one of the swing arms rotates for a first length of time from the home position to reach the wafer station and the other one of the swing arms rotates for a second length of time, that is different from the first length of time, from the home position to reach the processing station.

In yet another aspect of the present invention, a system and method are described for processing wafers at least including a loadlock having a wafer station and a processing chamber having a processing station. A transfer arrangement is configured to include a swing arm configured for rotation about an axis of rotation for use in transporting the workpieces between the wafer station and the processing station. The swing arm being configured to rotate in one direction by a first angular value from a home position to the processing station and to rotate in an opposite direction by a second angular value from the home position to reach the wafer station, and the first angular value is different from the second angular value. In one feature, the loadlock and the processing chamber form portions of an overall chamber arrangement which cooperates with the transfer arrangement in a way which serves, at least in part, to define the home position of the swing arm. In another feature, the loadlock and the processing chamber are pressure isolatable from one another substantially only when the swing arm is in the home position. In still another feature, the overall chamber arrangement includes a transfer chamber that is in selective communication with each of the loadlock and the processing chamber and the transfer arrangement is supported in the transfer chamber such that the home position is defined within the transfer chamber. In yet another feature, the loadlock is in direct communication with the processing chamber and the transfer arrangement is supported in the loadlock such that the home position is defined within the loadlock.

BRIEF DESCRIPTION OF THE DRAWINGS

The present invention may be understood by reference to the following detailed description taken in conjunction with the drawings briefly described below.

FIG. 5b is a diagrammatic partially cut-away view, in cross-section, illustrating details of an end effector height adjustment arrangement, shown here to illustrate features that are not visible in the view of FIG. 5a.

FIGS. 8 and 9 are diagrammatic plan views of cams that are used in the swing arm assembly of FIG. 5a-7, for use in establishing the height of each swing arm.

FIG. 11 is a diagrammatic view, in perspective, illustrating further details with respect to one swing arm arrangement of the dual swing arm arrangement of FIG. 5a.

FIGS. 19a-19l form a series of diagrammatic elevational views which cooperate with the plan views of FIGS. 18a-18e to illustrate further details of the process.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein including alternatives, modifications and equivalents, as defined within the scope of the appended claims. It is noted that the drawings are not to scale and are diagrammatic in nature in a way that is thought to best illustrate features of interest. Further, like reference numbers are applied to like components, whenever practical, throughout the present disclosure. Descriptive terminology such as, for example, uppermost/lowermost, right/left, front/rear and the like has been adopted for purposes of enhancing the reader's understanding, with respect to the various views provided in the figures, and is in no way intended as been limiting.

Figure 1A:
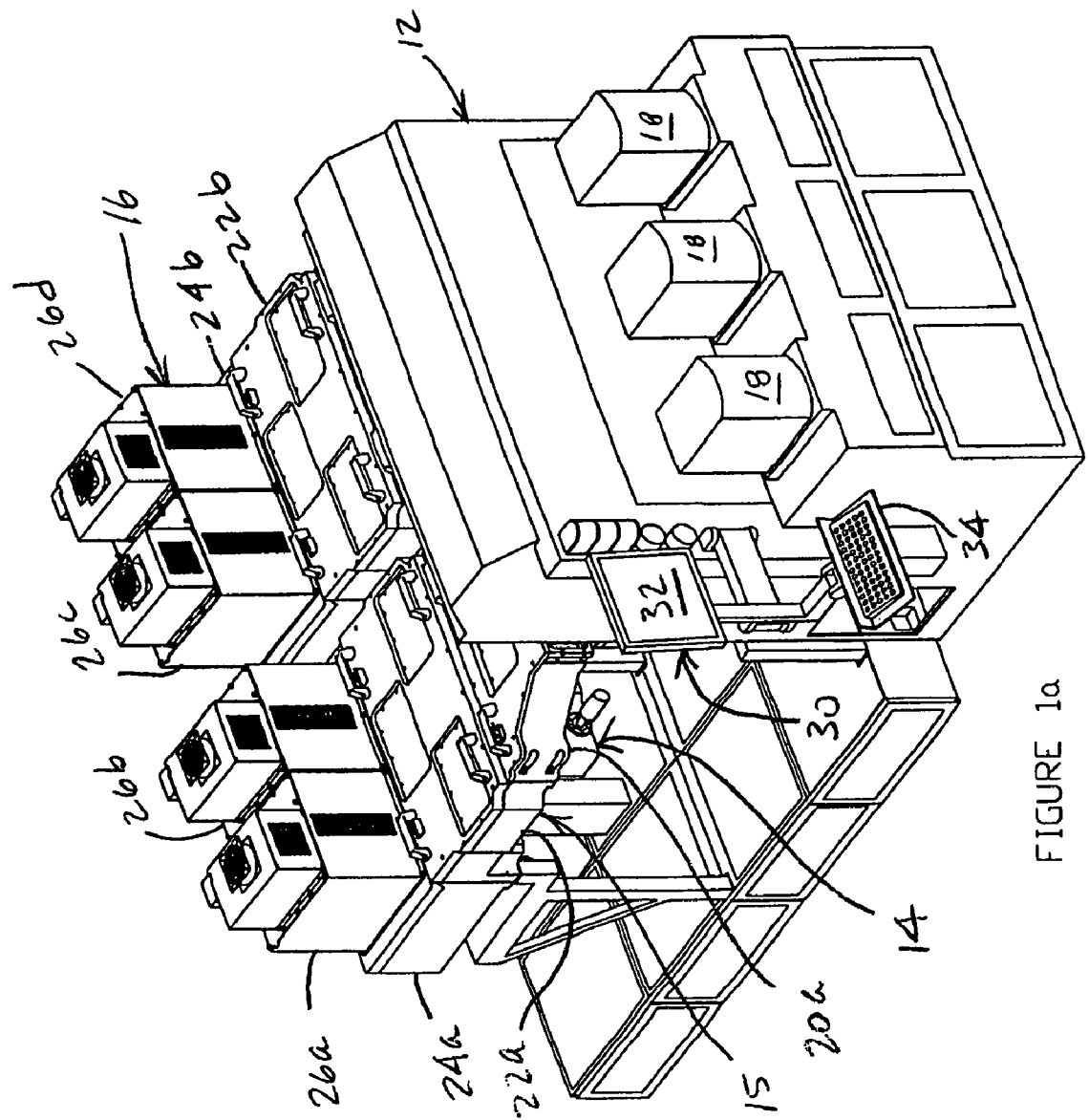
FIG. 1a is a diagrammatic view, in perspective, of a workpiece processing system that is produced in accordance with the present invention.
Figure 1B:
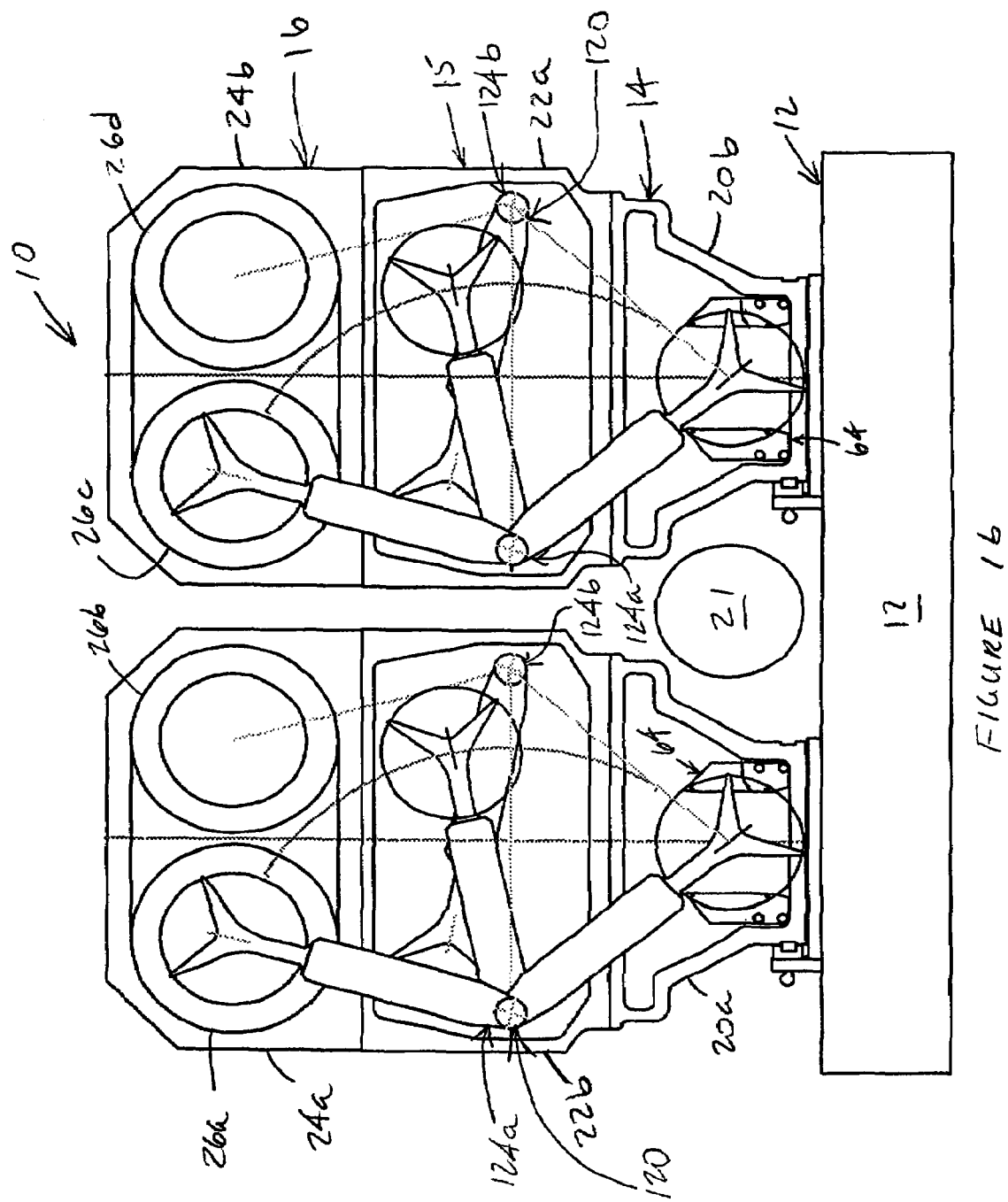
FIG. 1b is a diagrammatic plan view of the system of FIG. 1a, shown here to illustrate further details of its structure.

Referring to FIGS. 1a and 1b, the former is a diagrammatic view, in elevation, of a processing system, generally indicated by the reference number 10, according to one embodiment of the present invention. FIG. 1b is a diagrammatic plan view of system 10. The processing system is generally made up of a front end 12, a loadlock section 14, a wafer handling section 15 and a processing section 16. This system can be employed to perform a wide variety of processes on suitable workpieces such as, for example, various implementations of etching (plasma etching, photochemical etching, chemical vapor etching, thermally driven etching, ion etching, etc.), planarization (combination of etching and deposition), cleaning and residue removal, and various implementations of chemical, physical and ion deposition (PECVD, ALD, MOCVD, sputtering, evaporation, etc.). Suitable workpiece types include, but are not limited to semiconductor, opto-electronic, memory media, and flat panel displays. Suitable workpiece materials include, but are not limited to silicon, silicon germanium, glass and plastic. Suitable plasma based process sources include, for example, inductively coupled plasma (ICP) sources, microwave sources, surface wave plasma sources, ECR plasma sources, and capacitively coupled (parallel plate) plasma sources. Any appropriate process-defined pressure may be utilized.

Still referring to FIGS. 1a and 1b, front end 12 is generally at atmospheric pressure and defines a "mini-environment" that is configured for engaging a plurality of cassettes or FOUPs (Front Opening Unified Pods shown in FIG. 1a) 18 or other suitable workpiece transfer positions each of which, in the present example, is configured for supporting 25 semiconductor wafers. Opposite the engagement surfaces for the FOUPs, front end 12 is configured for engaging a pair of first and second loadlocks 20a and 20b (only first loadlock 20a is visible in the view of FIG. 1a), collectively or individually referred to as loadlock(s) 20. FIG. 1b illustrates, an intermediate station 21, which may comprise, for example, a cooling station, that is positioned between loadlocks 20a and 20b. The first and second loadlocks are generally identical to one another and engage first and second transfer chambers, individually indicated by the reference numbers 22a and 22b, and collectively or individually referred to as transfer chamber(s) 22. The transfer chambers, in turn, engage first and second process chambers 24a and 24b, and may be referred to collectively or individually referred to as process chamber(s) 24. Each process chamber, as will be seen below, employs a side-by-side workpiece arrangement or side-by-side process stations in which each process chamber can simultaneously expose a pair of workpieces to the same process. It is to be understood that process chambers 24a and 24b may be used to practice the same process or to practice different processes.

With continuing reference to FIGS. 1a and 1b, in the present example, four plasma sources 26a-d are used, corresponding to the four process stations, collectively provided by the process chambers for purposes of convenience. Reference numbers 26a-d may be used to refer to associated ones of the process stations. It is noted that one suitable process chamber configuration, that is useful in the context of the present invention, is described in copending U.S. patent application Ser. No. 10/828,614 (attorney docket no. MAT-17) which is commonly owned with the present application and incorporated herein by reference. Appropriate valves are provided between the various chambers, as will be further described, since processing is usually accomplished by way of a staged vacuum sequence, starting from front end 12. In such a processing regimen, loadlocks 20 can be pumped down to a treatment or intermediate pressure from atmospheric pressure prior to transferring workpieces to and from process chambers 24 through transfer chambers 22. It should be appreciated that system 10 can readily be configured with only one process chamber 24, one transfer chamber 22 and one loadlock 20, for example, in the case where one process chamber can achieve a desired level of throughput or where sequential processing is not required. An operator station 30, including a display 32 and input device 34, is provided connected with a computer 40 for use in controlling the system. It is considered that one having ordinary skill in the art is capable of appropriately programming computer 40 in order to achieve the functionality described herein, in view of this overall disclosure.

It is noted that piping and pumping facilities have not been illustrated in FIG. 1a for purposes of illustrative clarity. A common facilities input can be used for the distribution of pneumatics air, purge gas, process gas(es), and cooling water to one or two module configurations. Similarly, a single vacuum pump can be incorporated for single or dual module loadlock pumping accommodations. Separate gas panels can be used to deliver process gasses to each module and each process module has been configured with its own vacuum pump and pressure control devices, allowing for parallel processing capabilities. Pressure transducers affixed to the loadlock(s), transfer chamber(s) and process chamber(s) are used to communicate pressures associated with processing functionality. Additionally, an assortment of vacuum and pressure switches affixed to vacuum roughing lines are used for interlock purposes. In view of this overall disclosure, it is considered that one having ordinary skill in the art is capable of implementing such facilities.

Figure 2:
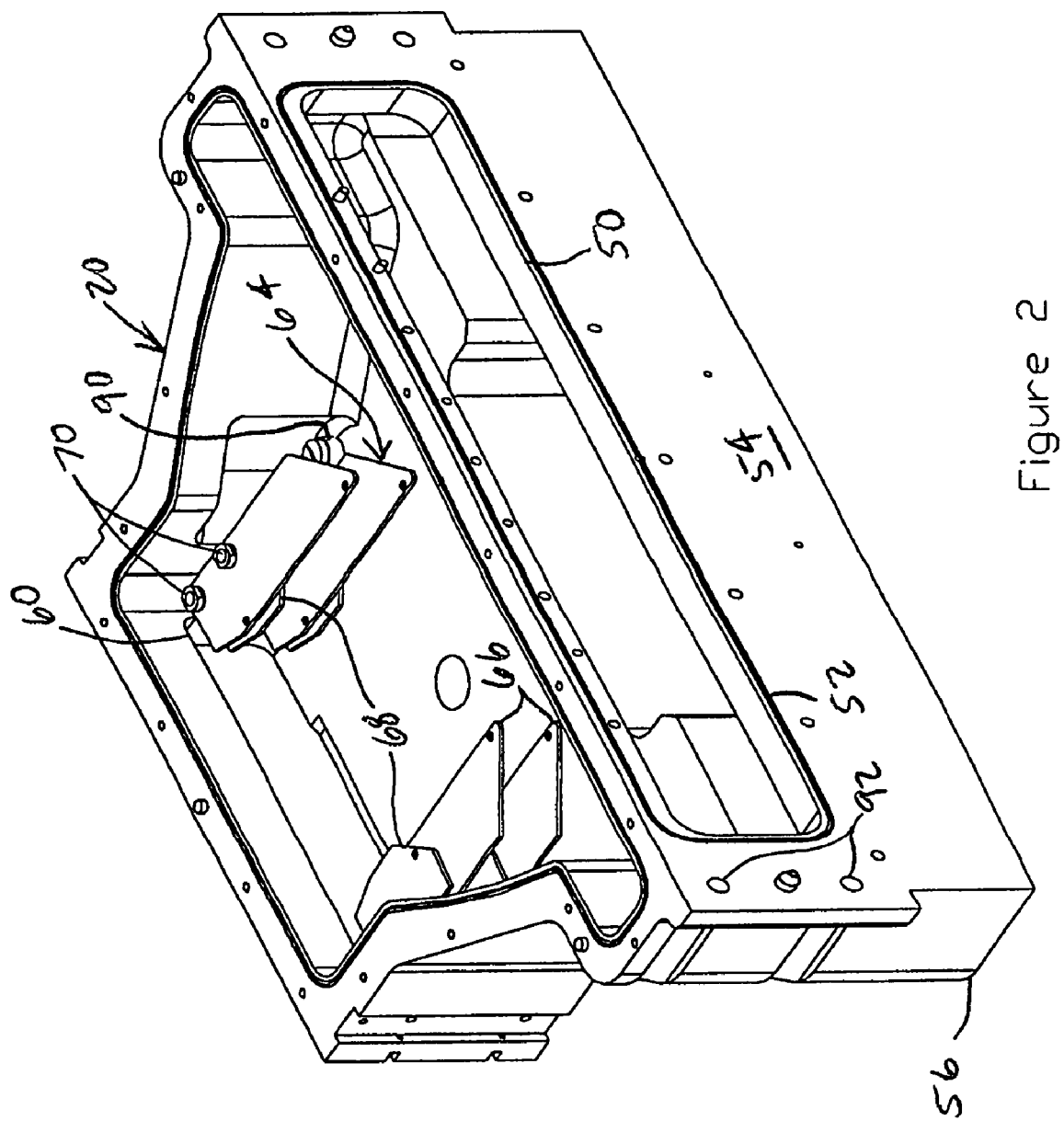
FIG. 2 is a diagrammatic perspective view of a loadlock used in the system of FIG. 1a, shown here to illustrate details of its structure.

Attention is now directed to FIG. 2 which shows one of loadlocks 20 in isolation from the remainder of the system. It is noted that the top plate of the loadlock has not been shown to facilitate a view of interior details of its structure. Loadlock 20 includes an overall body which defines a slit aperture 50 for communicating with one of transfer chambers 22. An o-ring 52 is received in a face or chamber sealing surface 54 of the loadlock for sealing against the associated transfer chamber. A trough 56 is formed by the loadlock chamber body for receiving a valve arrangement (not shown) having a blade member that is used to seal against the surface of the wall which opposes face 54, as will be further described in detail below. For the moment, it is appropriate to note that the blade member advantageously retracts into trough 56 when the valve arrangement is in an open position. On an opposing portion of the transfer chamber body, essentially opposite slit aperture 50, a front end slit 60 is defined through which workpieces are transferred to and from front end 12 of FIG. 1a. Any appropriate slit door arrangement may be used for purposes of sealing front end slit aperture 60 including, for example, the arrangement that is used on slit aperture 50, yet to be described. Other suitable door arrangements including a magnetic door and a pneumatic door are described in U.S. Pat. No. 6,315,512, which is commonly owned with the present application, and incorporated herein by reference.

Still referring to FIG. 2, a shelf arrangement 64 is provided for supporting workpieces in loadlock 20 as these workpieces are transferred to and from both the front end and the process chamber of FIGS. 1a and 1b. The shelf arrangement is made up of two sets of spaced apart blade members alternating between a long blade 66 and a short blade 68 in an overall stacked relationship. Accordingly, each set of blade members includes two long blades 66 and two short blades 68. It should be noted that one long blade in combination with one short blade serves to make up a shelf for an individual workpiece such that each shelf includes an asymmetric configuration. The long and short shelf blades may be formed using any suitable material such as, for example, aluminum. Further details will be provided below with respect to the use of this asymmetric configuration. Each shelf arrangement is supported using a pair of fasteners 70 which may be of any suitable type such as, for example, stainless steel. Spacers may be used to achieve the appropriate spaced apart relationship between the shelf blade member. The spacers may be formed, for example, using the same material from which the shelf blades are formed. The shelf arrangement is configured for supporting four workpieces in four vertically spaced apart support stations. As will be described in further detail below, the two uppermost workpiece support shelves are dedicated for use in supporting a pair of preprocess ones of the workpieces while the two lowermost workpiece support shelves are dedicated for use in supporting a pair of postprocess ones of the workpieces. Thus, preprocess workpieces are always moved from front end 12 of FIG. 1a to the preprocess workpiece support shelves and then on to an associated one of process stations 26. Conversely, the lower pair of workpiece support stations is dedicated to the postprocess workpieces such that processed workpieces are always moved from an associated one of process stations 26 to the postprocess pair of shelves. Workpieces are stacked in the shelves so as to form a workpiece column, as will be further described below. It is appropriate to note, for the moment, that pairs of workpieces can be moved simultaneously to and from this workpiece column.

Figure 3:
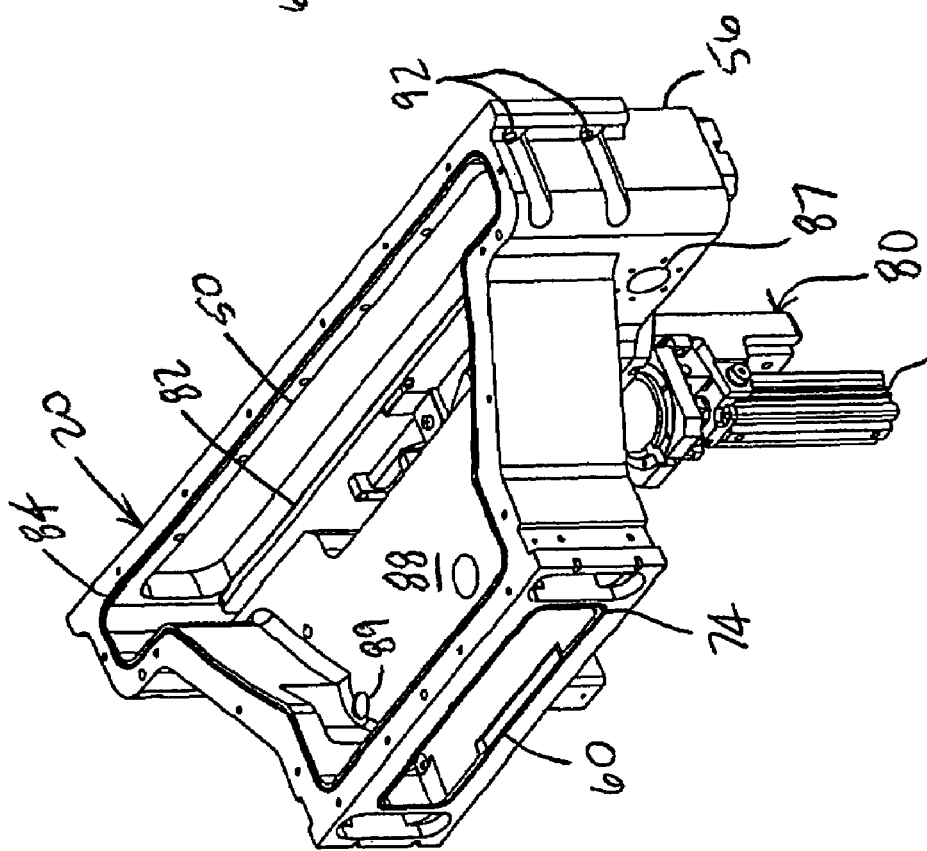
FIG. 3 is another diagrammatic perspective view of the loadlock of FIG. 2 further illustrating the appearance of a slot door arrangement, as well as further details of the structure of the loadlock.

Referring now to FIG. 3 in conjunction with FIG. 2, the former illustrates loadlock 20, in a perspective view, to illustrate further details of its construction, having shelf arrangement 64 removed. It is again noted that the top plate of the loadlock has not been shown to facilitate a view of interior details of its structure. Specifically, front end slit aperture 60 is shown surrounded by an O-ring seal 74. Further, a slit door valve arrangement 80 is shown installed for sealing slit aperture 50. The slit valve arrangement includes a sealing blade 82 which is illustrated retracted into trough 56 of the loadlock body. Loadlock 20 is illustrated, like other chambers in the various figures, having its cover or lid removed for purposes of illustrative clarity. FIG. 1a, however, shows these covers as they appear installed. A suitable seal, such as, for example, an O-ring seal 84 may be used to seal the lid against the chamber body. Slit valve arrangement 80 is actuated, in the present example, using a pneumatic linear actuator 86. Loadlock 20 defines a pair of pumping ports, only one of which is visible, indicated by the reference number 87. It is of interest to note that these pumping ports are arranged to pump from trough 56. This arrangement is considered to be advantageous since this trough comprises a low point within the overall loadlock. Accordingly, the trough serves as a collection area for particles and other contamination that is introduced into the loadlock during normal operation of the system. By pumping from the trough, as a low point, it is intended to remove particles and contamination as a normal consequence of operating the system. Loadlock 20 also includes a floor 88, above trough 50, which defines a pair of purge ports, only one of which is visible in the floor, indicated by the reference number 89. Purge ports 89 can be used in cooperation with pumping ports 87 to provide a crossflow during pumping of the loadlock. That is, appropriate gases can be introduced through purge ports 89 while pumping takes place from pump ports 87. In this way, contaminants can advantageously be caused to flow toward and into trough 56 for removal therefrom by pumping, as will be further described. In FIG. 2, it is noted that the illustrated purge port receives a diffuser 90, which can be formed, for example, from sintered metal, or porous ceramic or composite material (such as stainless steel, aluminum oxide, impregnated carbon fibers, among others).

Figure 4:
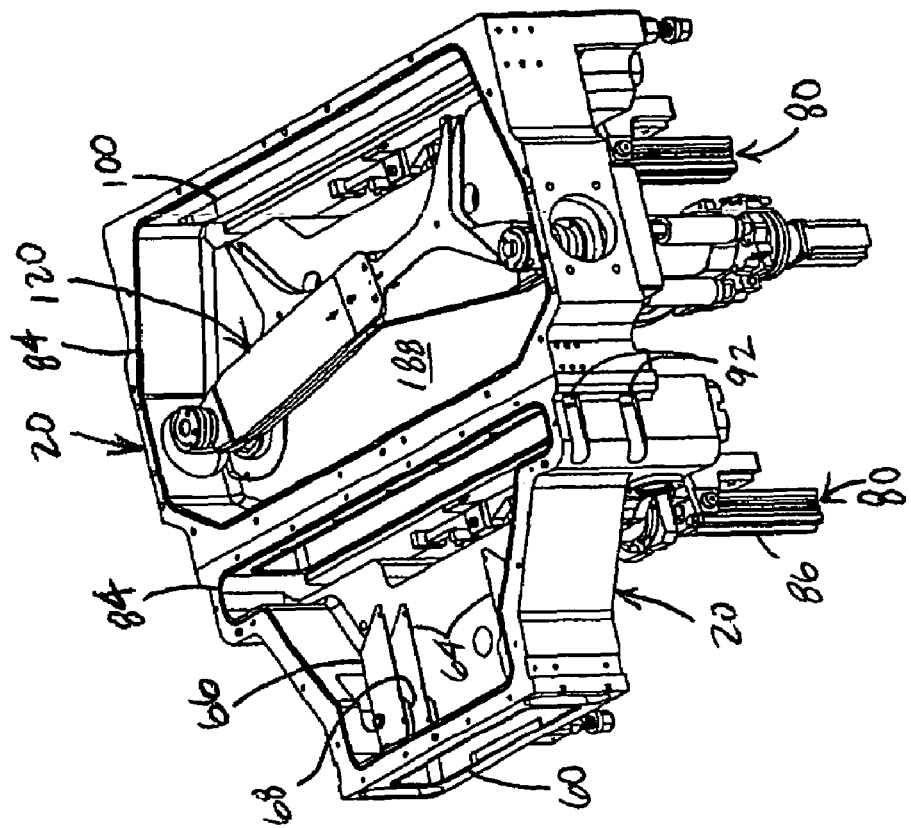
FIG. 4 is a diagrammatic view, in perspective, showing a transfer chamber that is used in the system of FIG. 1a connected to the loadlock also used in the system and shown in further detail in FIGS. 2 and 3.

Attention is now directed to FIG. 4, which illustrates loadlock 20 connected to transfer chamber 22. It is also noted that various features that are the subject of the present discussion can be seen in prior figures such as, for example, FIGS. 1a and 1b. Further, the top plate of both the loadlock and the transfer chamber have not been shown to facilitate a view of interior details of their features. The two chambers can be affixed to one another in any suitable manner such as, for example, using threaded fasteners that are inserted through mounting holes 92, shown in FIGS. 2-4. Transfer chamber 22 defines a process chamber slit door 100 configured for interfacing with one of process chambers 24, shown in FIGS. 1a and 1b. In the present example, slit door valve arrangement 80 is also used for purposes of opening and closing process chamber slit door 100. Process chamber 22 is configured for supporting a swing arm arrangement 120 that is made up of four individual swing arms arranged in counterrotating pairs, as will be described immediately hereinafter.

Figure 5A:
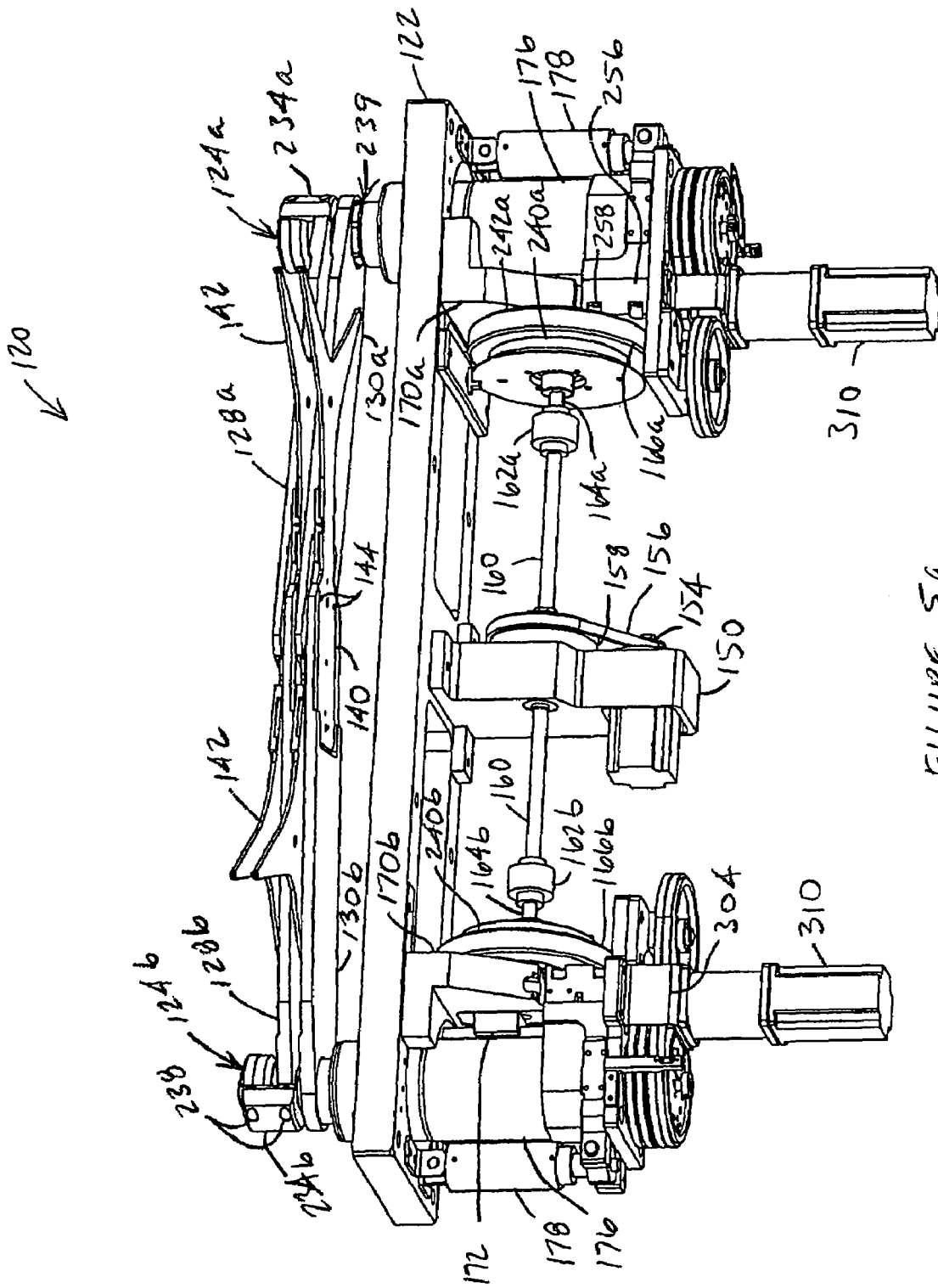
FIG. 5a is a diagrammatic perspective, isolated view illustrating details of a dual swing arm arrangement that is used in the transfer chamber of FIG. 4.

Turning now to FIG. 5a in conjunction with FIG. 4, the former figure illustrates swing arm arrangement 120 in a perspective view and removed from transfer chamber 22 for purposes of illustrative clarity. It is noted that FIG. 1b diagrammatically illustrates swing arm arrangement 120 with respect to counterrotation, however, its full symmetric movement capabilities are seen in figures yet to be described. An overall baseplate 122 supports first and second swing arm pairs 124a and 124b, respectively. It is noted that identical reference numbers will be used to refer to the first and second swing arm pairs, having components associated with a particular pair identified by using "a" or "b" appended to the appropriate reference number. Thus, components that are identical in each of the swing arm pairs may be referred to individually or collectively without the appended "a" or "b". For example, the swing arm pairs collectively include upper blades 128a and 128b, which may be referred to collectively or individually, for purposes of convenience, as upper blade (s) 128. The swing arm pairs further include lower swing arm blade(s) 130. Each of the upper swing arm blades extends to a distal end 140 that is configured for attachment of an end effector 142 that is best seen as attached to swing arm blade 130b, in FIG. 5a. Another end effector is similarly attached to swing arm blade 130a. A group of threaded fasteners 144 is used to adjustably attach end effector 142 to each swing arm blade. In this way, alignment adjustments are provided such that the end effectors appropriately interlace with the shelves of shelf arrangement 64 of FIGS. 2 and 4, as well as being properly interlaced with one another in a non-interfering manner, even when loaded with workpieces. It is noted that the swing arms are shown in a convenient "home" position above baseplate 122, as will be further described. Further, a reference to a swing arm(s) can refer to the combination of one or more swing arm blades with an associated end effector. Thus, swing arm 130b refers to swing arm blade 130a in combination with an attached one of end effectors 142.

Figure 5B:
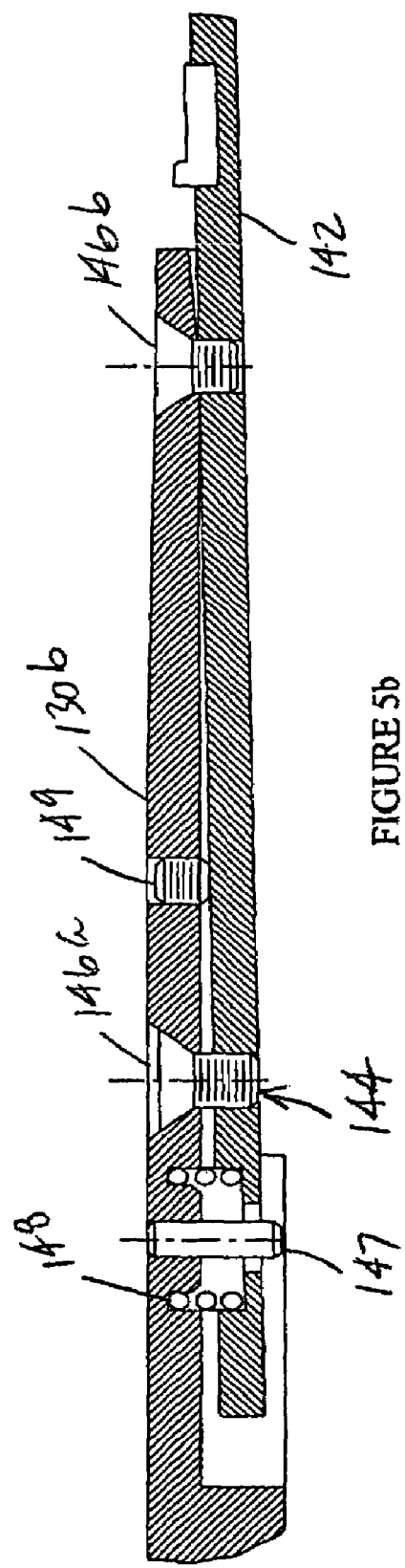

Referring to FIG. 5b in conjunction with FIG. 5a, the former is a cross-sectional view of the adjustable manner in which end effector 142 is attached to distal end 140 of each swing arm blade such as, for example, swing arm blade 130b. In particular, fastener group 144 includes a pair of locking flat head fasteners 146a and 146b, although any appropriate fastener can be used. A dowel pin 147 is press-fitted into an aperture that is defined by swing arm blade 130b, having a free end that projects through another aperture that is defined by end effector 142. A helical coil spring 148 surrounds dowel pin 147 and resiliently, locally biases the end effector away from the swing arm blade. A hex screw 149, or other suited threaded device, is threadingly received by swing arm blade 130b for use in adjusting the end effector height in combination with fasteners 146a and 146b. It is noted that the surface of swing arm blade 130b confronting end effector 142 and surrounding fastener 146b is arcuate in configuration to accommodate changes in the angle of end effector 142 relative thereto with height adjustment. End effector height adjustment may be accomplished, in one exemplary way, by initially tightening fastener 146b "snuggly" and fastener 146a at least slightly withdrawn from a seated position. Fastener 146a is then adjusted to set end effector 142 at a desired angle. Hex screw 149 is then tightened to lock the desired end effector orientation.

Referring to FIG. 5a, a bracket 150 extends downward from baseplate 122 for supporting a lift motor 152 which rotates a lift motor pulley 154 which, in turn, engages a lift belt 156. Lift belt 156 is received around a lift pulley 158 that is supported on a shaft 160 which is itself rotatably supported by bracket 150. It is noted that lift belt 156 may be tensioned in any suitable manner that is available in the prior art. As one example, one or more fasteners used to mount lift motor 152 may be received in slotted holes such that the motor can be pivoted to tension lift belt 156. Having accomplished tensioning, the fasteners are then tightened. Any suitable motor may be used as lift motor 152 such as, for example, a servo or stepper based motor. As will be seen, no more than one full revolution of pulley 158 is needed. It is noted that this motor includes an encoder for reading the position of its output shaft and thereby identifying the position of lift pulley 158 with a suitable degree of precision. Opposing ends of shaft 160 are received in couplers 162 (where coupler 162a is associated with first swing arm pair 124a and coupler 162b is associated with second swing arm pair 124b), each of which then engages a cam drive shaft 164 (where cam drive shaft 164a is associated with first swing arm pair 124a and cam drive shaft 164b is associated with second swing arm pair 124b). Cams 166a and 166b will be described in further detail below. For the moment, it is appropriate to note that these cams facilitate customized vertical motion of each swing arm pair, responsive to rotation of lift motor 152. The arrangement described herein is advantageous with respect to providing synchronous vertical motion at spaced apart swing arm configuration locations, using a single drive motor. In the alternative, however, separate drive motors can be used to produce vertical motion of each swing arm pair. In this case, each motor may include an encoder, or a separate encoder may be provided for use in reading the vertical position of each swing arm pair.

Figure 6:
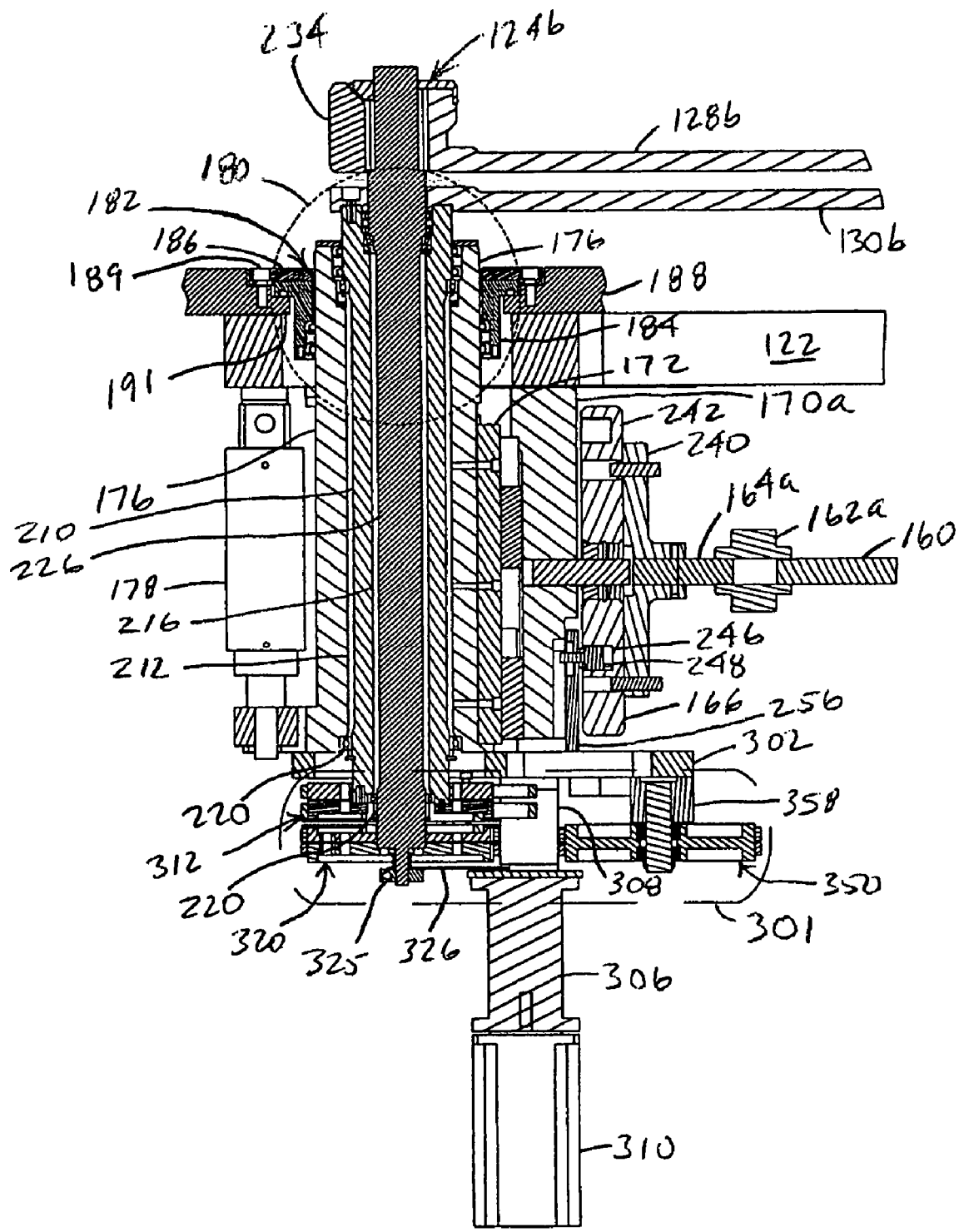
FIG. 6 is a diagrammatic enlarged cut-away view, in cross-section, of the swing arm arrangement of FIG. 5a, shown here to illustrate further details of its structure.

Referring to FIG. 6 in conjunction with FIG. 5a, attention is now directed to details of the swing arm mechanisms. To that end, FIG. 6 is a partial, further enlarged cross-sectional view, in elevation, of swing arm pair 124*b*. It is to be understood, that swing arm pair 124*a* is essentially identically configured, with certain exceptions to be noted. The first and second swing arm pairs are supported using brackets 170*a* and 170*b* that are suitably attached to base plate 122 so as to extend downwardly therefrom. A linear stage 172 is used to engage a swing arm housing 176 so as to provide for up/down linear motion of the swing arm housing relative to brackets 170. One suitable linear stage 172 is available from NSK Japan, although any number of alternative configurations can be provided which accomplish the desired linear motion. Pneumatic cylinders 178 are provided, pivotally engaging and captured between base plate 122 and housing 176 of each swing arm arrangement. Cylinders 178 are provided for counterbalance purposes and can provide downward and upward biasing force for the swing arm arrangements with respect to base plate 122. For example, the cylinders can provide a force that counteracts that of atmospheric pressure, when the transfer chamber is under vacuum. As another example, when the transfer chamber is running at atmospheric pressure, a force can be provided to counter the weight of the robot under the force of gravity. In this regard, pressure regulation is provided to the cylinders in a known way to produce and change the applied biasing force. Moreover, one or more additional cylinders can be provided depending upon load demands or a single cylinder can be used.

Figure 7:
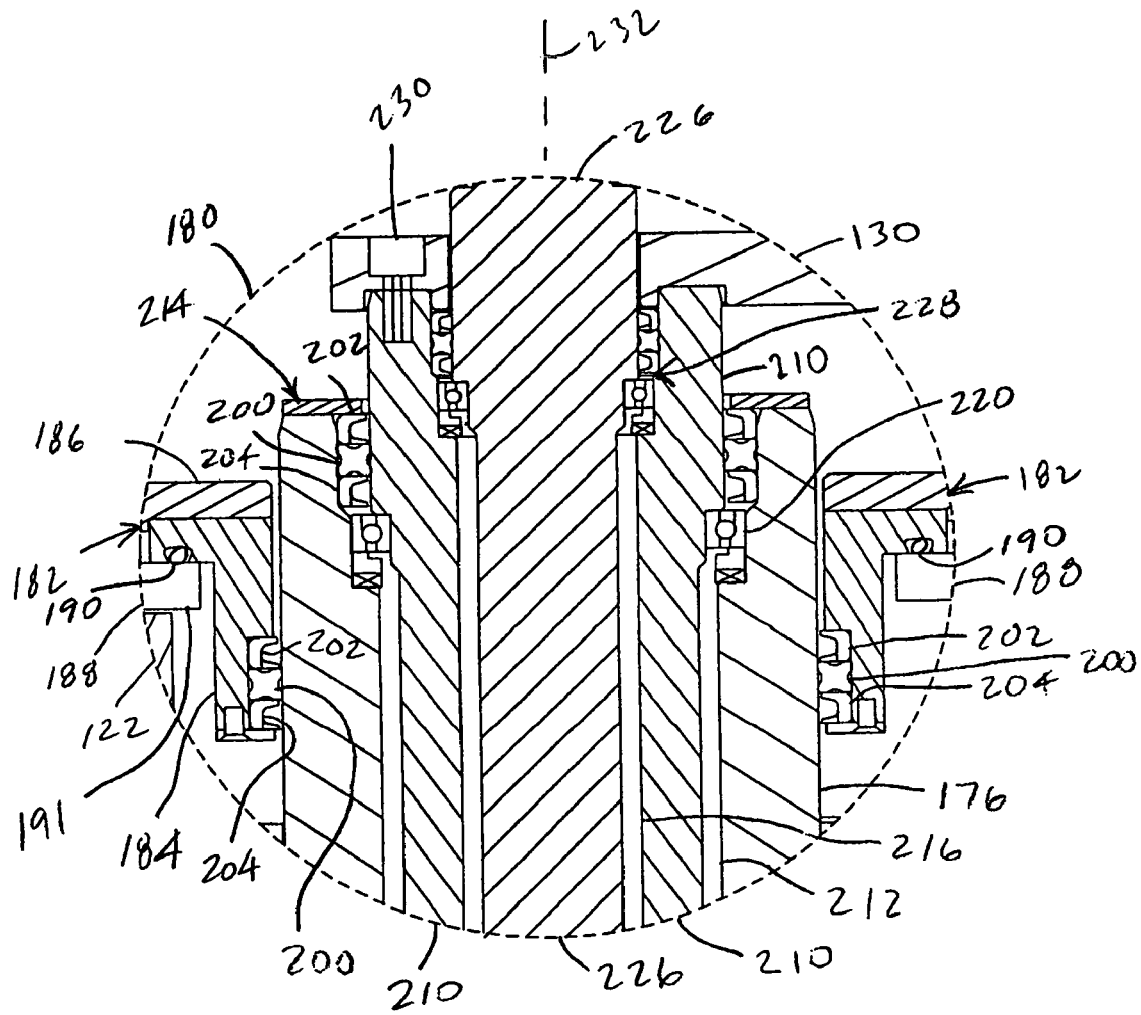
FIG. 7 is a diagrammatic enlarged cut-away view, in cross-section, of the swing arm arrangement of FIG. 6 that is further enlarged to illustrate details with respect to inner and outer swing arm shafts as well as a housing therefor.

Referring to FIGS. 5*a*-7, attention is now directed to further details with respect to the configuration of swing arm arrangement 120. FIG. 7 is a further enlarged view, showing details within a dashed circle 180 which appears in FIG. 6. Housing 176, being supported for vertical motion, is sealed against the transfer chamber bottom using a seal arrangement 182. The latter includes an annular L-bracket 184 (FIG. 7) having one end that is captured between an annular sealing ring 186 and a bottom wall 188 of transfer chamber 20 (see also FIG. 4). Sealing ring 186 can be retained in position, for example, using threaded fasteners 189. An O-ring 190 is captured within an annular O-ring groove so as to seal L-bracket 184 against a peripheral step 191 (FIGS. 6 and 7) that is defined by transfer chamber bottom 188. An opposing end of L-bracket 184 includes an annular seal arrangement that is made up of a quad seal 200 that is held in position using a pair of grease retainers 202 and 204 positioned above and below the quad seal, respectively. This quad seal, like all other such seals described herein, should be lubricated using an appropriate lubricant such as, for example, a fluorinated grease that is carried by grease retainers 202 and 204. Moving inward with respect to housing 176, an outer swing arm shaft 210 supports lowermost swing arm 130 of each swing arm pair. Outer swing arm shaft 210 is supported for rotation, at least in part, within a through passage 212, defined by housing 176, using an upper bearing and seal assembly 214 (FIG. 7). The latter includes another quad seal 200 and grease retainers 202 and 204 that are captured within an annular groove configuration which surrounds an uppermost opening leading into a through passage 216 which is defined by outer swing arm shaft 210. Below the seal arrangement, in the view of FIG. 7, a bearing 220 is received for rotationally supporting the upper end of outer swing arm shaft 210. A similar bearing 220 (FIG. 6) supports a lowermost end of outer swing arm shaft 210. An inner swing arm shaft 226 is received for rotation within through passage 216 of outer swing arm shaft 210.

FIG. 7 illustrates the way in which an upper end of inner swing arm shaft 226 is supported for rotation using a bearing/seal arrangement 228 that is essentially identical, from a functional standpoint, to the seal arrangement that is used between housing 176 and the uppermost end of outer swing arm shaft 210. It is noted that any suitable type of bearing can be used for rotationally supporting both the inner and outer swing arm shafts. Suitable bearing types include, but are not limited to angular contact and radial contact ball bearings. Bearing arrangement 228 is retained between the inner and outer swing arm shafts by attachment of lower swing arm 130 to outer swing arm shaft 210 using a plurality of threaded fasteners 230 (only one of which is shown) that are distributed around an axis of symmetry 232 of the swing arm arrangement. Hence, the lower swing arm serves as a seal and bearing retainer. Bearing 220 (FIG. 6) can also be used between the lowermost ends of the inner and outer swing arm shafts and, hence, will not be described for purposes of brevity. It is noted that upper swing arm 128 is affixed to inner swing arm shaft 226 using a clamping arrangement (FIG. 5*a*) having a clamp shell 234 (where clamp shell 234*a* is associated with first swing arm pair 124*a* and clamp shell 234*b* is associated with second swing arm pair 124*b*) which engages a clamping end of upper swing arm 128 via threaded fasteners received in clamp apertures 238 such that the rotational position of the upper swing arm can be adjusted in relation to the lower swing arm. Any number of alternatives may be employed for purposes of insuring that the swing arms interlace properly. As one example (not shown), outer swing arm shaft 210 and inner swing arm shaft 226 of swing arm assembly 124*a* can be appropriately longer than the corresponding components that are used in swing arm assembly 124*b*. As another example, an extension spacer 239 arrangement can be added, as will be described in further detail below.

With reference to FIGS. 5*a*-10*a*, attention is now directed to the configuration of the dual swing arm assembly with respect to the way in which vertical motion is achieved using cams 166. Each of these cams includes a cam mounting plate 240 (FIG. 6 and see also FIG. 5*a* where cam mounting plate 240*a* is associated with first swing arm pair 124*a* and cam mounting plate 240*b* is associated with second swing arm pair 124*b*) that is fixedly attached to a cam plate 242 such that the cams rotate with cam drive shafts 164*a* and 164*b*. FIGS. 8 and 9 illustrate the appearance of cam faces 243*a* and 243*b* of cam plates 242*a* and 242*b*, respectively, as will be further described below.

Figure 10B:
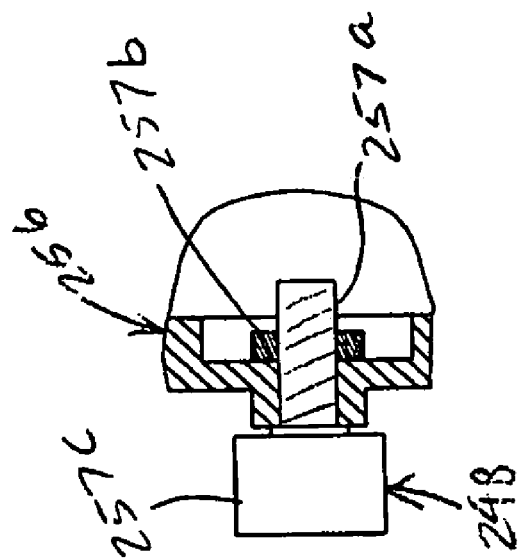
FIG. 10b is a diagrammatic partially cross-sectional view of the cam follower and a portion of the bridge bracket of FIG. 10a, shown here to illustrate further details of the structure of these components.
Figure 10A:
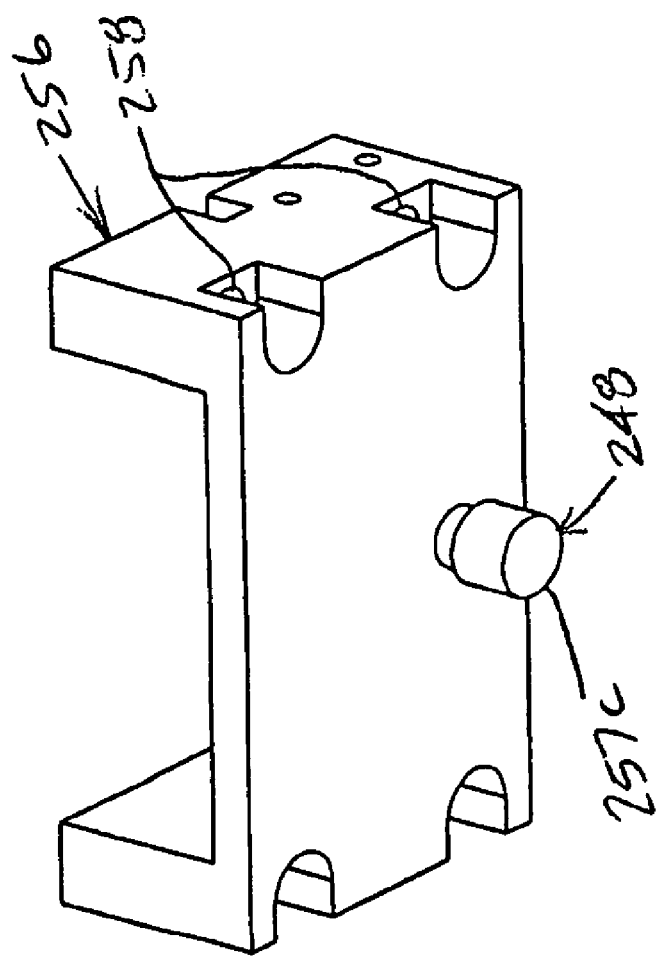
FIG. 10a is a diagrammatic view, in perspective, of a bridge bracket that supports a cam follower for engagement with the cams of FIGS. 8 and 9.

Referring to FIGS. 8-9, 10*a* and 10*b*, each cam plate defines a cam groove 246 which receives a cam follower 248. FIGS. 8 and 9 illustrate that cam grooves 246*a* and 246*b* are mirror images of one another. Rotation of each cam moves the associated swing arms between elevations 1-4, as identified around each cam groove through engagement by cam follower 248. In FIGS. 8 and 9, the cams and, thereby, the swing arm pairs are at elevation 1, since each cam follower is received at a low point in each cam groove (as shown in phantom in FIGS. 8 and 9), although many alternative configurations can be provided. The swing arm height that is associated with each of the cam elevations will be described in conjunction with subsequent ones of the figures. It should be appreciated that cam plates 242*a* and 242*b* are interchangeable so long as such interchange is accompanied by a reversal in rotation direction. In the present example, cam plate 242*a* rotates in an indicated counterclockwise direction (CCW), while cam plate 242*b* rotates in an indicated clockwise (CW) direction. Apertures 247 are provided for use in attaching the cam plates to the cam mounting plates. FIG. 10*b* is a partially cutaway view, in partial cross-section, of cam follower 248, as it is received in a bridge bracket 256. For example, cam follower 248 includes a threaded mounting shaft 257*a* that is received in an aperture that is defined by bridge bracket 256. A nut 257*a* threadingly engages shaft 257*a*. An opposite end of shaft 257*a* supports a cam roller 257c for rotation. The cam roller is sized to be received in one of cam grooves 246. Such rotational support can be provided in many well-known ways such as, for example, by using a bearing (not shown). Bridge bracket 256 is connected to housing 176 (FIG. 5a) using threaded fasteners received in apertures 258 and includes a U-shaped configuration for purposes of bridging bracket 170 so that cam follower 248 provides vertical motion of housing 176, as limited by linear stage 172, and the swing arm shafts supported therein.

Figure 11:
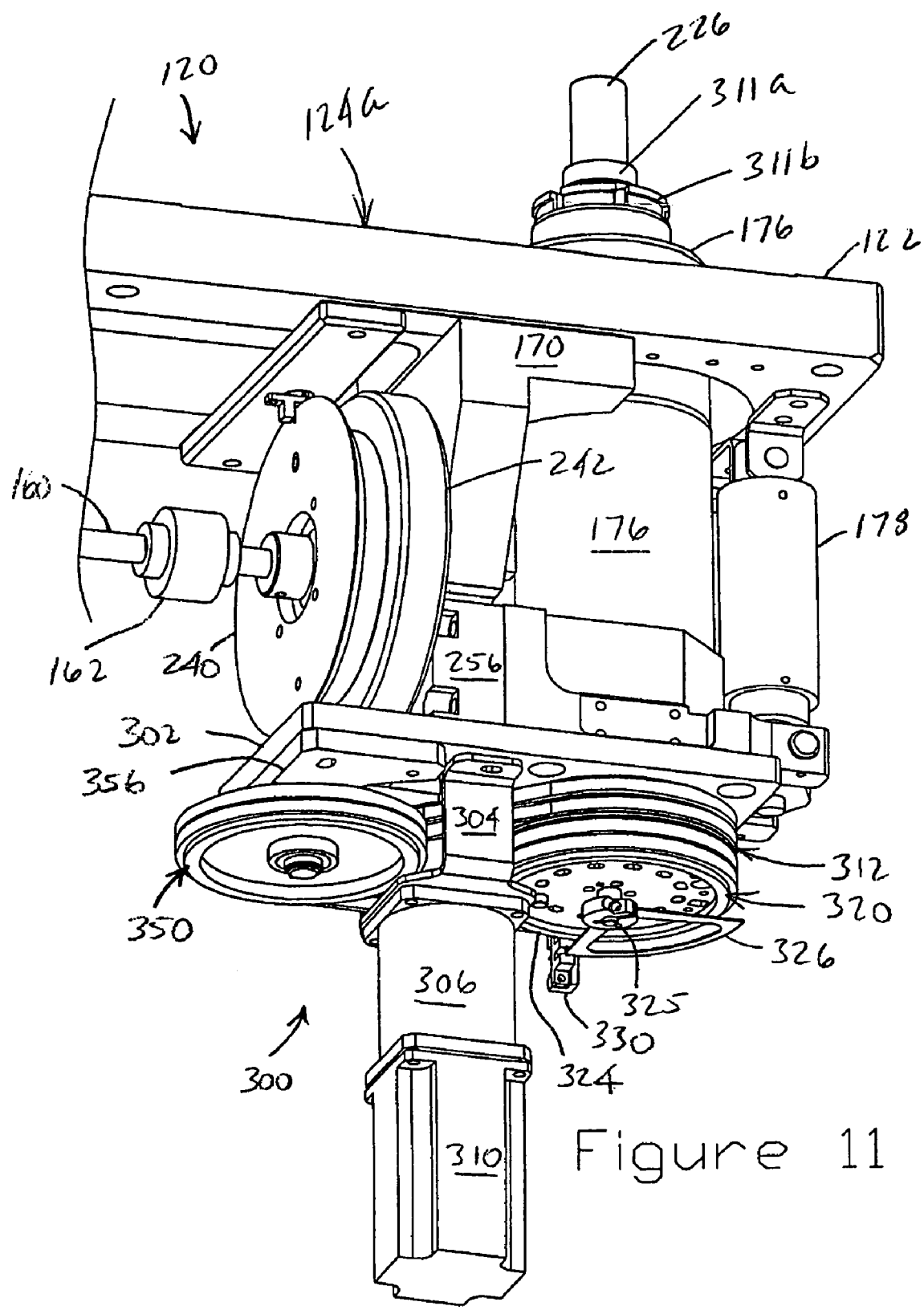
Figure 12:
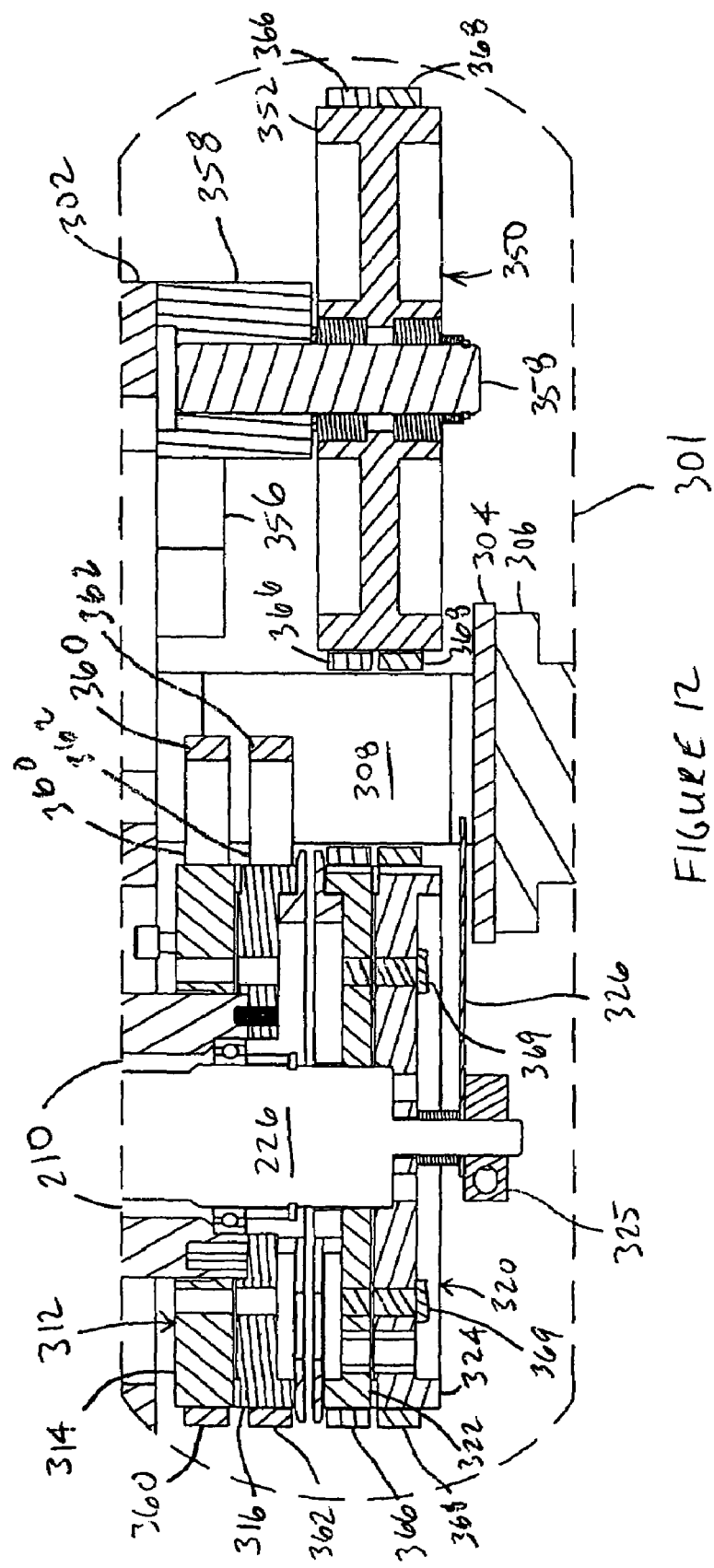
FIG. 12 is another diagrammatic enlarged cut-away view, in cross-section, of the swing arm arrangement of FIG. 6 that is further enlarged to illustrate details with respect to the swing arm drive assembly.

Referring primarily to FIGS. 6, 11 and 12, a rotational drive arrangement, generally indicated by the reference number 300 in FIG. 11, for use in counterrotating the upper and lower swing arm of each swing arm pair, will now be described in detail. FIG. 11 provides a general perspective view of this arrangement for swing arm pair 124a with the swing arm blades removed, while FIG. 12 provides an enlarged view within a dashed line 301, shown in FIG. 6. Drive arrangement 300 includes a drive base plate 302 that is mounted to a lowermost end of housing 176. A U-bracket 304 includes a lowermost surface to which a gear drive 306 is mounted and which is, in turn, driven by a motor 310 (FIGS. 5a, 6 and 11). Motor 310 may comprise any suitable type of motor such as, for example, servo or stepper motor. Gear drive 306 drives a toothed pulley 308 (FIG. 6). This latter pulley will be described in further detail below, however, for the moment, is appropriate to note that the pulley must be sufficiently long so as to be capable of simultaneously driving a plurality of four spaced apart timing belts along its overall length. Spacer arrangement 239 is shown in FIG. 11, made up of an upper swing arm spacer 311a and a lower swing arm spacer 311b in order to appropriately elevate swing arm arrangement 124a with respect to swing arm arrangement 124b to provide for the swing arm interlacing shown in FIG. 5a.

Referring primarily to FIG. 12, a first pulley arrangement 312 is made up of first and second side-by-side pulleys 314 and 316 that are received by the lowermost end of outer swing arm shaft 210. This latter pulley arrangement may be referred to as a split pulley arrangement. A second pulley arrangement 320 is similarly made up of first and second pulleys 322 and 324 that are received by a lowermost end of inner swing arm shaft 226. With brief reference to FIG. 11, it is noted that an arrangement of elongated apertures is defined by pulley 324 for pulley offset purposes. A clamp 325 holds a flag plate 326 in position on a reduced diameter distal end of the lowermost end of the inner swing arm shaft. The flag plate is configured to block light emitted by an optical sensor 330 (FIG. 11) that is mounted to base plate 302 over an angular displacement that is equal to the total angular movement of upper swing arm 128a between the workpiece column and its corresponding process station. A third, idler pulley arrangement 350 includes a pulley 352, configured for receiving belts 366 and 368, which is itself rotationally supported by an idler pulley mount 356 that adjustably engages base plate 302 such that pulley 352 rotates on an idler pulley shaft 358. In this regard, both gear drive 306 and pulley mount 356 are mounted in a way which provides for a degree of pivotal rotation, generally in the manner described above with respect to lift motor 152 of FIG. 5a, for example, using fasteners which pass through slotted holes in a manner that is known in the useful arts. Such pivotal rotation is useful for purposes of adjusting belt tension, as will be described immediately hereinafter.

Still referring primarily to FIG. 12, four belts are rotated by driven pulley 308. A first pair of lower swing arm timing belts includes a lower arm leading belt 360 and a lower arm lagging belt 362 that engage pulleys 314 and 316, respectively. A second pair of upper swing arm timing belts includes an upper arm leading belt 366 and an upper arm lagging belt 368. The reason for the use of "lagging" and "leading" nomenclature applied in naming these belts will be made apparent below. Suitable belts for use in this application, including lift belt 156 of FIG. 5a, should be formed from materials resistant stretching such as, for example, polyurethane and/or Kevlar reinforced neoprene. A pair of bolts 369 (FIG. 12) is illustrated for holding pulleys 322 and 324 in a fixed rotational offset.

Figure 13:
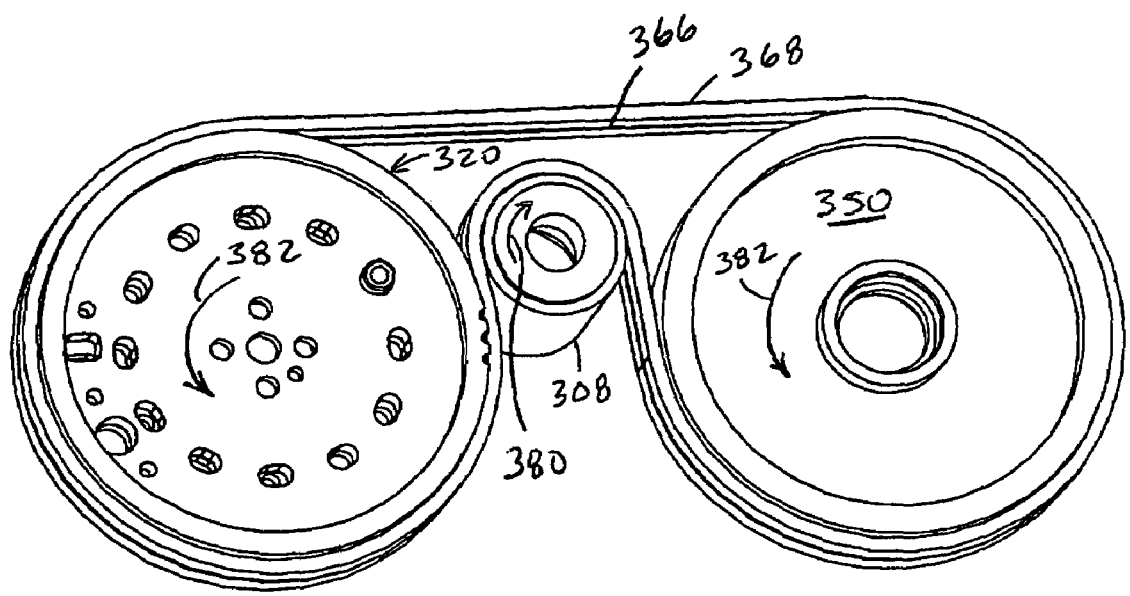
FIG. 13 is a diagrammatic perspective view illustrating a counter rotation drive belt and pulley arrangement that is used to counter rotate one swing arm of a coaxial pair of swing arms.
Figure 14:
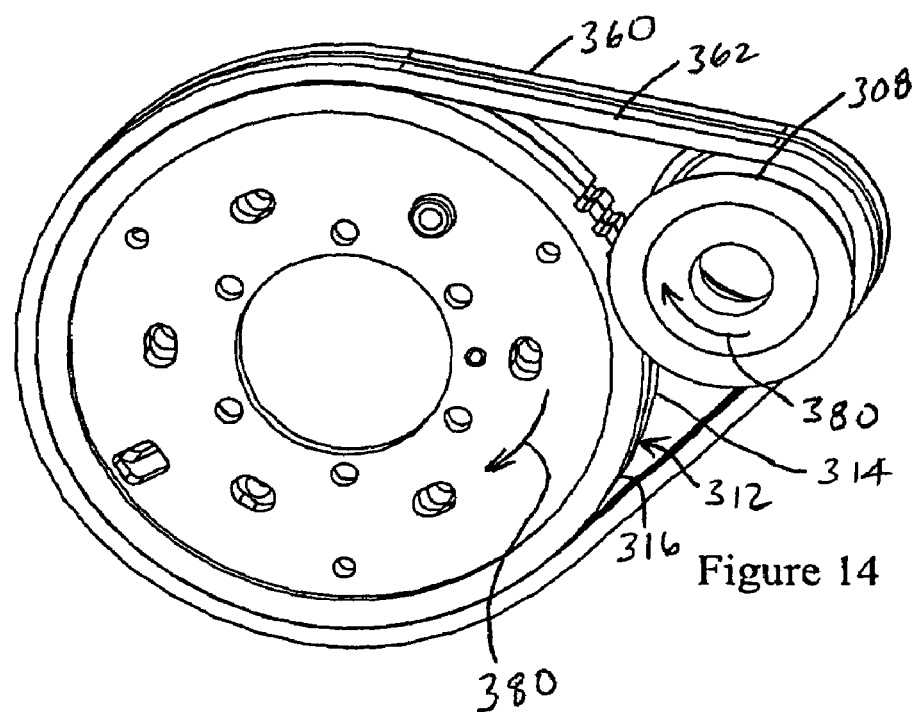
FIG. 14 is a diagrammatic perspective view illustrating a drive belt and pulley arrangement that is used to rotate the other swing arm of the coaxial pair of swing arms.

Turning now to FIGS. 13 and 14 in conjunction with FIG. 12, attention is now directed to the arrangement of the belt drive shown in FIG. 12, as it appears in diagrammatic perspective views, taken from below, for purposes of generally illustrating the paths taken by the belts. To that end, FIG. 13 illustrates pulley arrangements 320 and 350 in relation to driven pulley 308, as engaged by belts 366 and 368. It is noted that teeth have been illustrated on only a portion of the pulleys for purposes of simplicity, although it is to be understood that each pulley includes an essentially identical toothed configuration that is matched by all of the belts in use. Each of pulley arrangements 320 and 312 includes a pattern of elongated slots for receiving threaded fasteners (see bolts 369 of FIG. 12) in order to fixedly offset the tooth pattern of each pair of pulleys, for reasons which will be made apparent.

It should be appreciated that belts 366 and 368 are configured having teeth on both opposing major surfaces of the belts. Therefore, the "front side" of each belt engages pulley arrangements 320 and 350 while the "back side" of each belt engages driven pulley 308. Accordingly, in the instance where driven pulley 308 rotates clockwise as indicated by an arrow 380, pulley arrangements 320 and 350 will rotate counterclockwise, as indicated by an arrow 382.

FIG. 14 illustrates pulley arrangement 312 in relation to driven pulley 308, as engaged by belts 360 and 362. In this case, clockwise rotation of driven pulley 308 produces clockwise rotation of pulley arrangement 312. Therefore, pulley arrangements 312 and 320 coaxially counterrotate with respect to one another, since all of the pulley arrangements are driven by a common driven pulley 308. Therefore, because pulley arrangement 312 is supported by outer swing arm shaft 210, while pulley arrangement 320 is supported by inner swing arm shaft 226, the inner and outer swing arm shafts, likewise, counterrotate with respect to one another responsive to any rotation of driven pulley 308.

Referring briefly to FIGS. 5a and 6, the reader will recall that outer swing arm shaft 210 supports one of lower swing arms 130, while inner swing arm shaft 226 supports one of upper swing arms 128. The upper and lower swing arms of each swing arm pair 124, therefore, counterrotate with respect to one another by an equiangular amount for any given rotation of pulley 308. In this regard, it is noted that flag plate 326 (FIG. 11) co-rotates with inner swing arm shaft 226. As a result of the counter rotation configuration that is used, after initial alignment, identification of the position of the inner swing arm shaft also causes the position of the outer swing arm shaft to be known. As should be evident in the context of this application for driving swing arms, no more than one full revolution of each swing arm is required and, generally, significantly less than one revolution is often the requirement. In the present example, each swing arm rotates approximately +/−60 degrees from a center or home position, thereby exhibiting a total rotation of approximately twice that value. The swing arm arrangement of the present invention advantageously provides for adjustment of the overall angular displacement in view of a particular installation, as will be further described in detail at appropriate point hereinafter.

Figure 15:
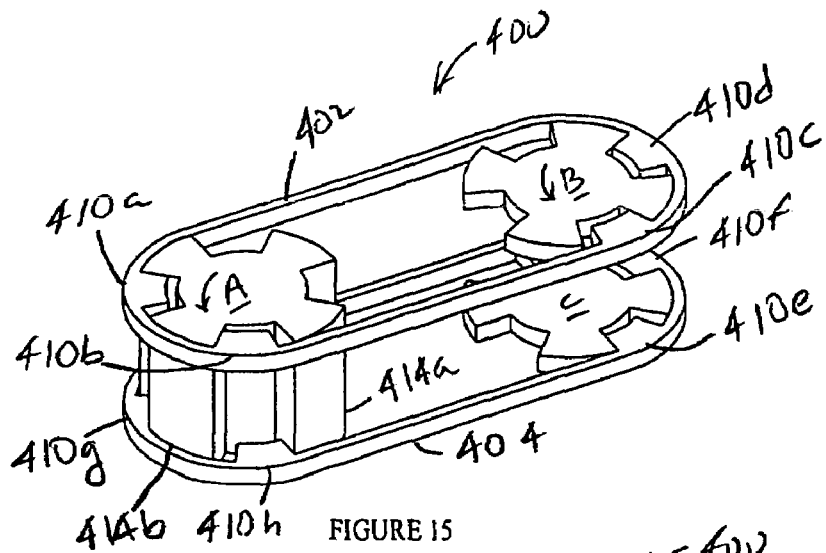
FIG. 15 is a simplified illustration, in perspective, of a drive belt and pulley arrangement that is used for purposes of minimizing drive belt backlash.

Referring now to FIG. 15, a simplified example will now be provided for purposes of explaining the backlash compensation concept of the present invention using a diagrammatic perspective view of a pulley arrangement that is generally indicated by the reference number 400. The latter is made up of pulley A, pulley B and pulley C. Pulley A is driven by a suitable arrangement such as, for example, a motor (not shown) and functions in a manner that is similar to that described above with respect to pulley 308 of FIG. 12, wherein the pulley is sufficiently elongated so as to support a plurality of spaced apart toothed belts. All of these pulleys include an identical tooth receiving pattern.

Figure 16A:
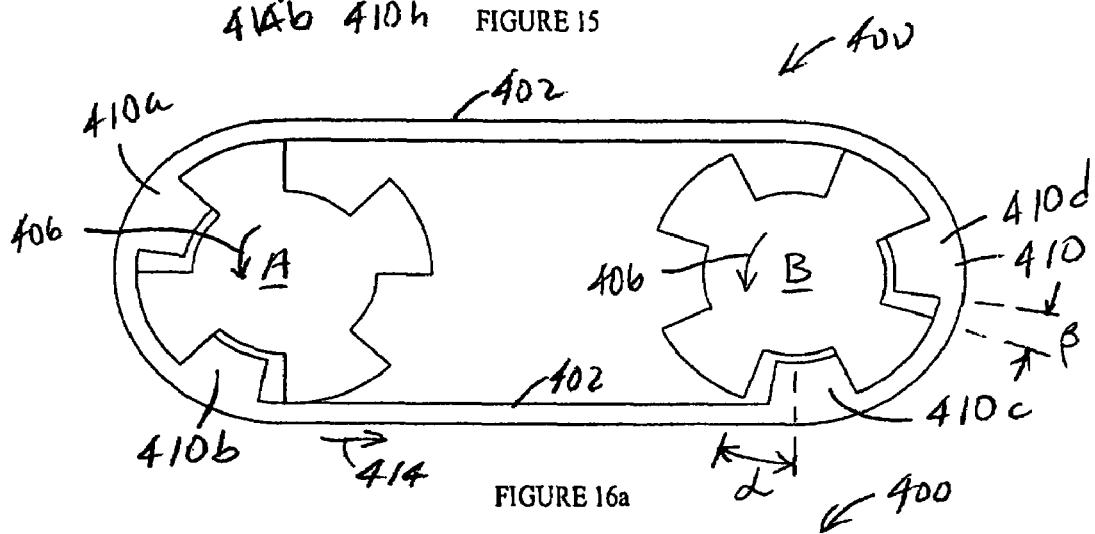
FIGS. 16a and 16b are diagrammatic plan views of the drive belt and pulley arrangement of FIG. 15, shown here to illustrate further details with respect to its arrangement.
Figure 16B:
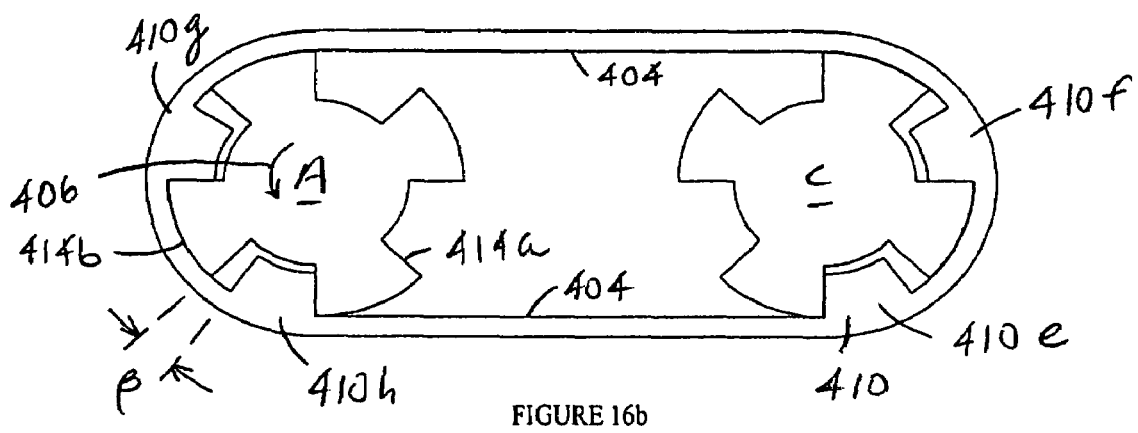

Referring to FIGS. 16*a* and 16*b*, in conjunction with FIG. 15, pulleys B and C are mounted on a common shaft, which has not been shown for purposes of illustrative clarity, such that the tooth receiving pattern of pulley B is offset with respect to that of pulley C which may be accomplished for example using a elongated slot aperture configuration, as described above. This offset may be on the order of the backlash value that is present between one of the pulleys and its engaging belt. It is noted that the backlash value has been exaggerated in the figures for illustrative purposes. Such a value may be specified, for example, by a manufacturer. In the present example, a backlash value of approximately 0.02 inch is seen. Therefore, the offset between the pulleys may be set to this value or slightly less. Depending on a particular direction of rotation, one of the belts or pulleys may be described as leading or lagging the other belt, as mentioned above. Of course, the relative leading/lagging phase of the respective belts may be reversed by simply rotationally offsetting the pulleys in an opposite direction with respect to one another.

Still referring to FIGS. 15, 16*a* and 16*b*, in the present example, a belt 402 engages pulleys A and B, while a belt 404 engages pulleys A and C. Pulley A is being rotated in a counterclockwise direction as is indicated by an arrow 406. For purposes of simplicity, only a limited number of teeth 410 have been illustrated on belts 402 and 404. It is noted that the present figures illustrate the pulley arrangement at a given point in time such that pulley A is in the same rotational position in all of the figures. Pulleys B and C are understood to be coaxially mounted in a way which provides for adjustment of an angular offset therebetween. It is considered that one of ordinary skill in the art is capable of implementing such an offset arrangement in view of this overall disclosure. The angular offset is indicated by an offset angle α that is shown in FIG. 16*a*. In this example, pulley C leads pulley B by angle α. The backlash value is illustrated by an angle β in FIG. 16*a*. In the present example, the offset angle has been shown as approximately double the backlash value to compensate for backlash that is introduced by belts 402 and 404.

Still considering pulley arrangement 400, teeth 410*a* and 410*b* of belt 402 are engaged by pulley A (FIG. 16*a*) thereby causing belt 402 to move in a direction indicated by an arrow 414. Responsive to movement of belt 402, teeth 410*c* and 410*d* engage pulley B to cause it to rotate in counterclockwise direction 406. Pulley C (FIG. 16*b*) co-rotates with pulley B such that it engages belt teeth 410*e* and 410*f*. This action, in turn, causes teeth 410*g* and 410*h* of belt 404 to engage pulley A so that a leading edge of each belt tooth rotates pulley A. In this way, backlash angle β trails belt teeth 410*g* and 410*h*, as illustrated in FIG. 16*b* with respect to belt tooth 410*g*. Subsequently, when pulley A reverses to clockwise rotation, belt teeth 410*g* and 410*h* will immediately be engaged by pulley teeth 414*a* and 414*b*, respectively, of pulley A. Responsive thereto, belt teeth 410*e* and 410*f* will immediately engage pulley teeth 414*c* and 414*d* of pulley C in a clockwise direction such that backlash is eliminated, at least from a practical standpoint. At the same time, tension transfers from belt 402 to belt 404. It is to be understood that this highly advantageous configuration, while being described in the context of driving counter rotating swing arms, is not limited to the applications described herein but may enjoy a wide range of applicability in virtually any situation where it is desired to eliminate backlash arising from the use of toothed pulleys and flexible drive members.

Figure 17A:
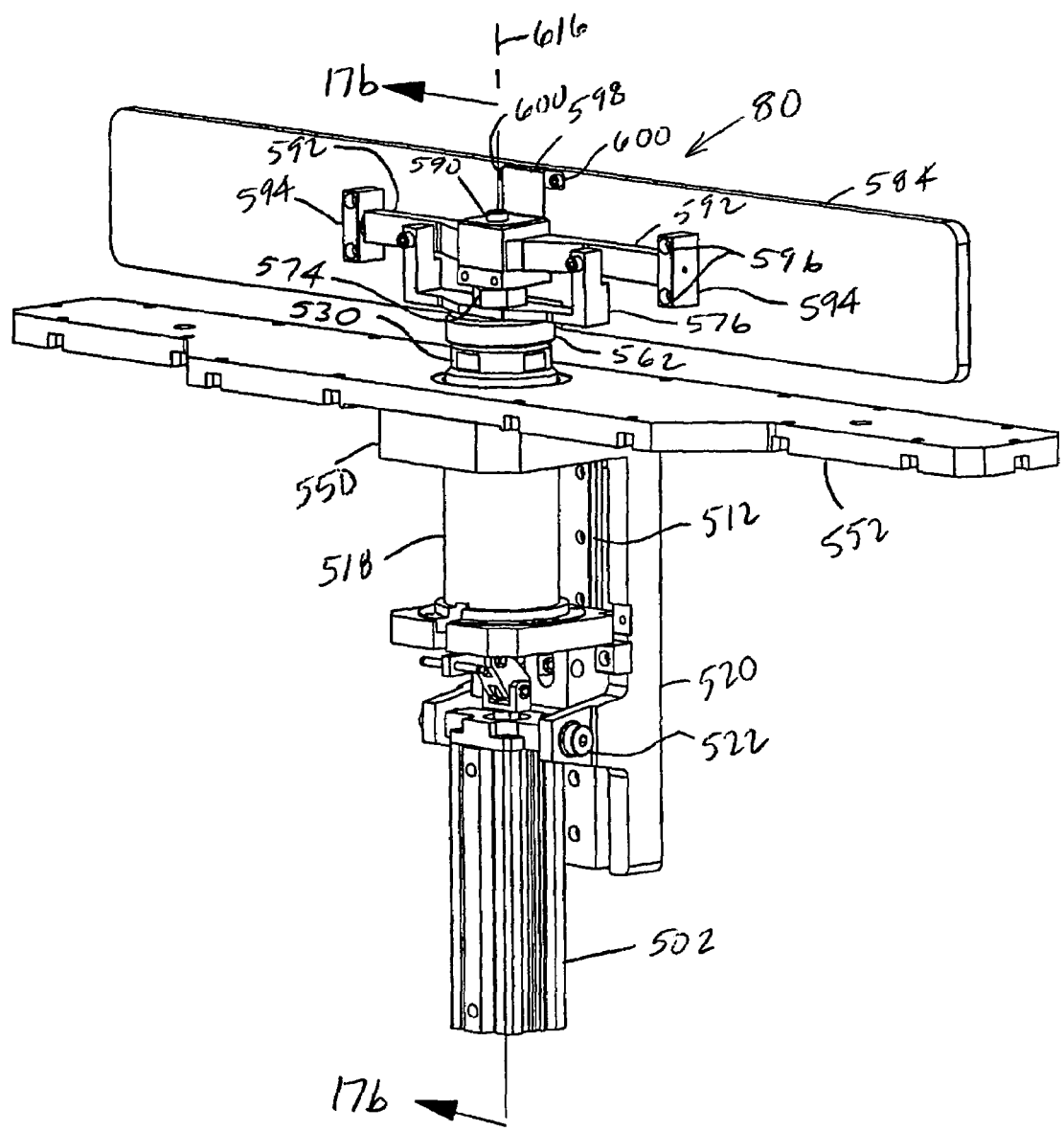
FIG. 17a is a diagrammatic view, in perspective, illustrating a slot valve arrangement that is produced in accordance with the present invention.
Figure 17B:
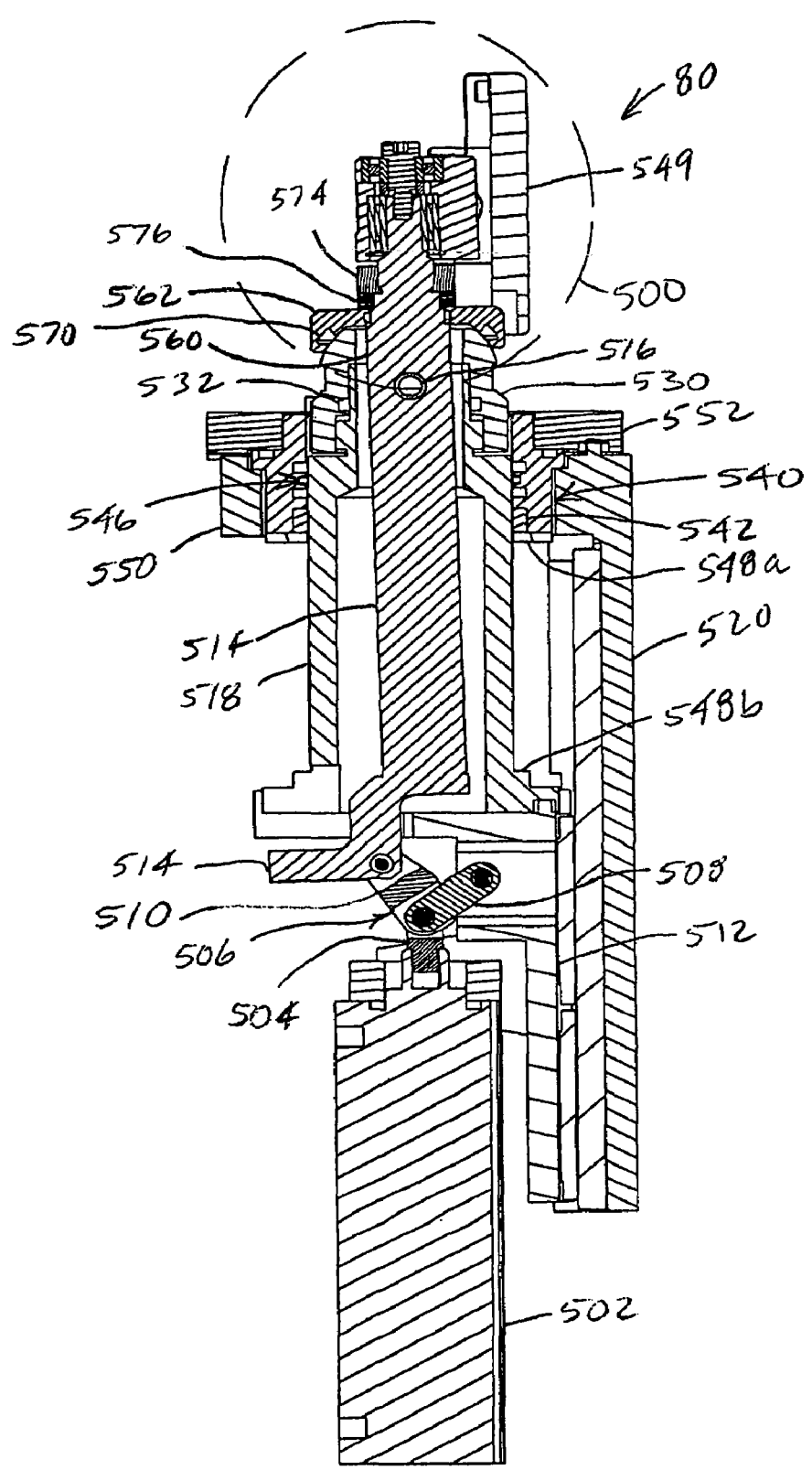
FIG. 17b is a diagrammatic view, in cross-sectional elevation, showing the slot valve arrangement of FIG. 17a illustrate further details of its structure.
Figure 17C:
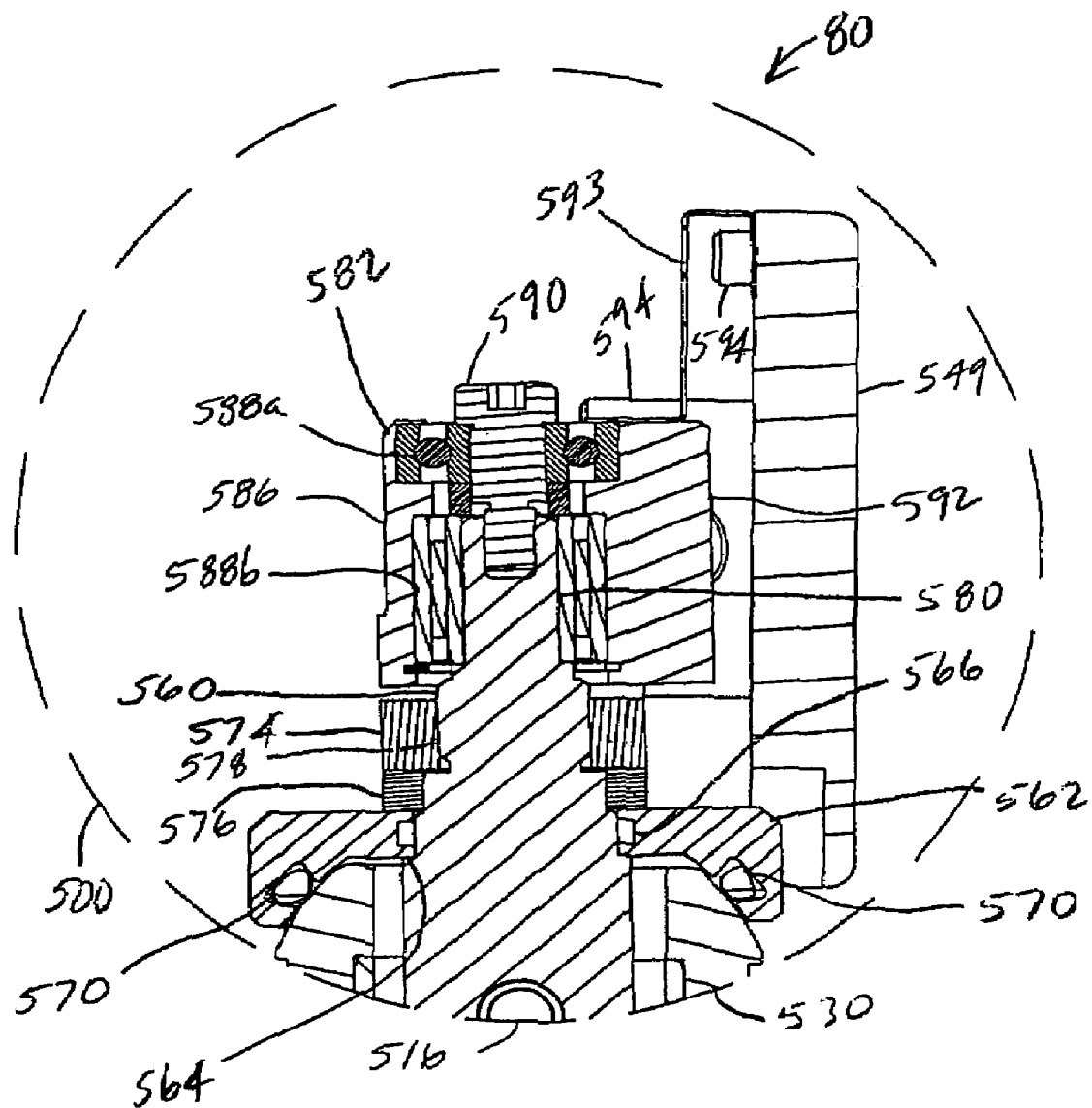
FIG. 17c is a diagrammatic partially cut-away view, in cross-sectional elevation, showing an enlarged region of the view of FIG. 17b, illustrating still further details of its structure.
Figure 17D:
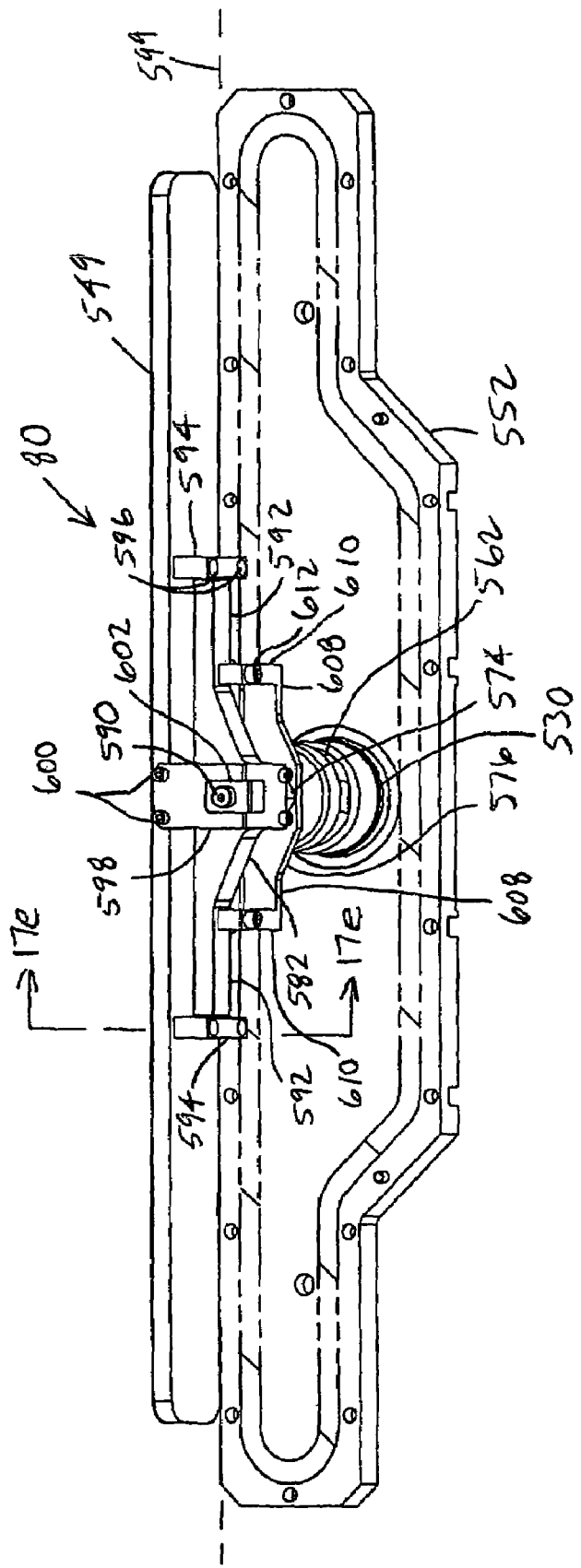
FIG. 17d is a diagrammatic view, in perspective, of the slot valve arrangement of FIG. 17a illustrating further details with respect to a blade suspension mechanism.

Referring generally to FIGS. 17*a* through 17*d*, attention is now directed to details with regard to slit door valve arrangement 80, which was previously shown in FIGS. 3 and 4. FIG. 17 provides a prospective view of slit door arrangement 80, while FIG. 17*b* is a diagrammatic cross-sectional view taken along a line 17*b*-17*b* shown in FIG. 17*a*. FIG. 17*c* is a further enlarged view of a portion of the slit door valve arrangement within an area 500, indicated by a dashed line in FIG. 17*b*. FIG. 17*d* is a perspective view, looking angularly downward on an upper portion of arrangement 80.

Referring to FIGS. 17*a* and 17*b*, slit door valve arrangement 80 includes a linear actuator 502 such as, for example, a pneumatic linear actuator. This actuator includes a drive shaft 504 that is capable of vertical movement in the view of these figures. Shaft 504 is connected to a linkage arrangement 506 that is comprised of a first link 508 and a second link 510. One end of first link 508 is pivotally attached to a slide bracket 512 while its opposing end is pivotally attached to shaft 504. Link 510 includes one end that is pivotally attached to a blade lever 514 and an opposing end that is pivotally attached to shaft 504. Blade lever 514 is supported at an axle 516 within a pivot shaft 518 such that lever 514 can be rotated about axle 516 within pivot shaft 518 responsive to movement of the lowermost end of the lever produced by linkage arrangement 506, as will be described. Pivot shaft 518 is supported by linear slide 512 which, in turn, slidingly engages a fixed bracket 520. Bracket 520 also supports actuator 502 in a suitable manner such as through the use of an appropriate fastener 522, so that the actuator is positionally fixed for applying movement forces to blade lever 514 via linkage 506. Accordingly, lever 514 can be moved upward and downward responsive to actuator 502. Movement forces are then transferred to pivot axle 516 through the length of the blade lever which, in turn, causes pivot shaft 518 to move in concert with the blade lever. An uppermost end of pivot shaft 518 sealingly receives a ball flange 530. Sealing can be accomplished, for example, using an O-ring received within an annular groove 532. Ball flange 530 can be fixedly attached to pivot shaft 518 in any suitable manner such as, for example, by threaded engagement. A sealing and guiding arrangement 540 includes an annular bushing 542 which serves to constrain nonvertical movements of pivot shaft 518. A sealing arrangement 546 is positioned immediately above bushing 542 for sealing against pivot shaft 518. Any suitable sealing arrangement may be utilized including, for example, the quad seal arrangement described above with regard to FIG. 7. During operation, upward movement initially causes the blade lever to move upward, without rotation, until a peripheral cover hard stop 548*a* (FIG. 17*b*), encounters a pivot shaft stop step 548*b*, and limits any further vertical rise. At this point, links 506 and 508 pivot in a way which rotates the lower end of blade lever 514 clockwise in the view of FIG. 17*b*. A sealing blade 549 responsively advances to contact a confronting chamber sealing surface (see FIG. 3). The sealing blade and other components may be formed from any suitable material such as, for example, the particular material that the engaged chamber body is formed and aluminum. Downward motion of pivot shaft 518, of course, results in an opposite behavior of the mechanism.

Referring again to FIGS. 17*a*-17*d*, sealing and guiding arrangement 540 (FIG. 17*b*) is received in an uppermost opening that is defined by an upper end 550 (FIG. 17*a*) of bracket 520. In this regard, it is noted that bracket 520 includes a general inverted L shape. Upper end 550 of bracket 520 is attached to an adapter plate 552 in any suitable manner such as, for example, using threaded fasteners (not shown). It should be appreciated that an uppermost end 560 of lever 514 can move laterally, in the view of the figure, with pivotal motion of the lever in relation to ball flange 530. Therefore, an appropriate sealing arrangement must be provided between uppermost lever end 560 and ball flange 530. To this end, a socket cap 562 is received around upper lever end 560 against an annular step 564 defined thereby. Socket cap 562 is sealed against uppermost lever end 560, for example, using an O-ring that is received in an annular groove 566. An outermost annular periphery of socket cap 562 is sealed against ball flange 530 using an O-ring 570 (FIG. 17*c*) that is received within an annular groove 572. A jam nut 574, or other suitable mechanical expedient, is used to retain socket cap 562 against ball flange 530 while capturing an alignment yoke 576 therebetween. Jam nut 574 can be threadingly received on an enlarged diameter, threaded portion 578 of uppermost end 560 of lever 514. In the current embodiment, jam nut 574 is tightened until it reaches hardstop. This ensures that the position of socket cap 562 is held in toleranced proximity to ball flange 530. Ideally, the spherical surfaces exhibited by both the socket cap and ball flange share a common center point. The ball and socket sealing configuration provided by this configuration is considered to be advantageous with respect to accommodation of significant lateral movement, while maintaining a seal between ball flange 530 and socket cap 560.

Figure 29:
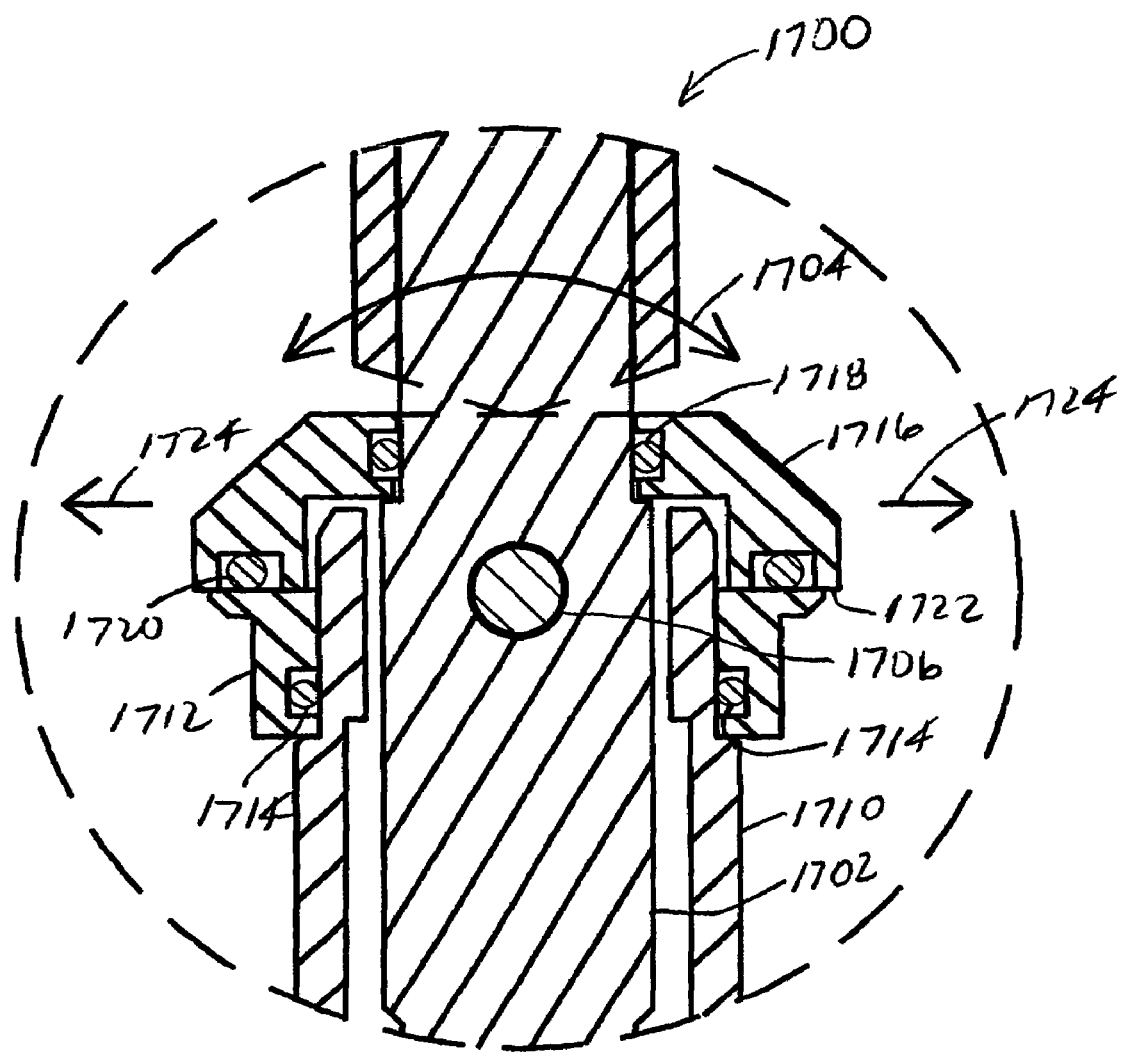
FIG. 29 is a diagrammatic partially cutaway cross-sectional view, in elevation, of one embodiment of a prior art slit door arrangement, shown here to illustrate details of its sealing configuration.

As compared to the prior art, embodied, for example, by slit door 1500 of FIG. 29, slit door arrangement 80 accommodates more pivotal movement which allows for increased movement away from sealing surface which, in turn, reduces the possibility of rubbing contact during the vertical motion phase. Still further advantages are provided with dual degree of motion capability so as to avoid a need for precise installation adjustments.

Referring primarily to FIGS. 17*a*, 17*c* and 17*d*, uppermost lever end 560 includes a distal end 580 (FIG. 17*c*) which supports a blade suspension member 582, in turn, for supporting sealing blade 549. Blade suspension member 582 is itself pivotally supported on distal end 580 using first and second bearings 588*a* and 588*b*, respectively. These bearings are configured for providing rotational movement of the suspension stage. First bearing 588*a*, in the present example, is a ball bearing, while second bearing 588*b* is a needle bearing. It is contemplated that any number of alternative bearing arrangements may be used for supporting blade suspension member 582, so long as appropriate pivotal motion is achieved in conjunction with the capability to transfer sufficient radial force. The suspension member and bearing 588 are held to distal end 580, for example, by using a shoulder screw 590 which threadingly engages the distal end and retains bearings 588*a* and 588*b*. Suspension member 582 includes a pair of laterally extending suspension arms 592 (FIGS. 17*a* and 17*d*). Distal ends of arms 592 are pivotally received in pivot blocks 594 that are fixedly attached to a backside surface of sealing blade 549, for example, using threaded fasteners (not shown) that are received in a pair of openings 596 and extend into sealing blade 549 in a familiar manner. A pitch biasing spring 598 is attached at one end using fasteners 600 to blade 549. The pitch biasing spring, as best seen in FIG. 17*d*, then wraps around suspension member 582 for attachment to a surface thereof which is opposite sealing blade 549, using another pair of fasteners 600. A cut-out area 602 (FIG. 17*d*) of the biasing spring provides an access margin for shoulder screw 590. While spring 598 is shown attached to a rearward facing surface of blade member 549 in FIGS. 17*a-c* and 17*e*, it can be designed for attachment to an upper surface of the blade member, as is shown in FIG. 17*d*, depending on the sealing blade geometry and clearance requirements in a particular application. It is noted that pitch biasing spring 598 maintains a desired rotational position of blade 549 with respect to rotation about an axis 599 (indicated by a dashed line in FIG. 17*a*) of blade suspension member 582 when valve arrangement 80 is in its open position. That is, this desired rotational position is invoked when blade member 549 is not contacting or draws away from a chamber wall sealing surface surrounding a slit opening (see FIG. 3). On the other hand, when blade member 549 contacts such a chamber wall sealing surface, pitch biasing spring 598 allows pivotal rotation about axis 599 of suspension member 582 such that the blade member rotates to accommodate a vertical tolerance between the blade member and the chamber wall, in order to provide an acceptable seal without a need for precision tolerance adjustments.

Referring to FIGS. 17*a* and 17*d*, yoke 576 includes opposing arms 608 (FIG. 17*d*) having vertically extending distal ends 610, each of which defines a through opening for receiving a threaded fastener 612 which threadingly engages arms 592 of suspension member 582.

Figure 17E:
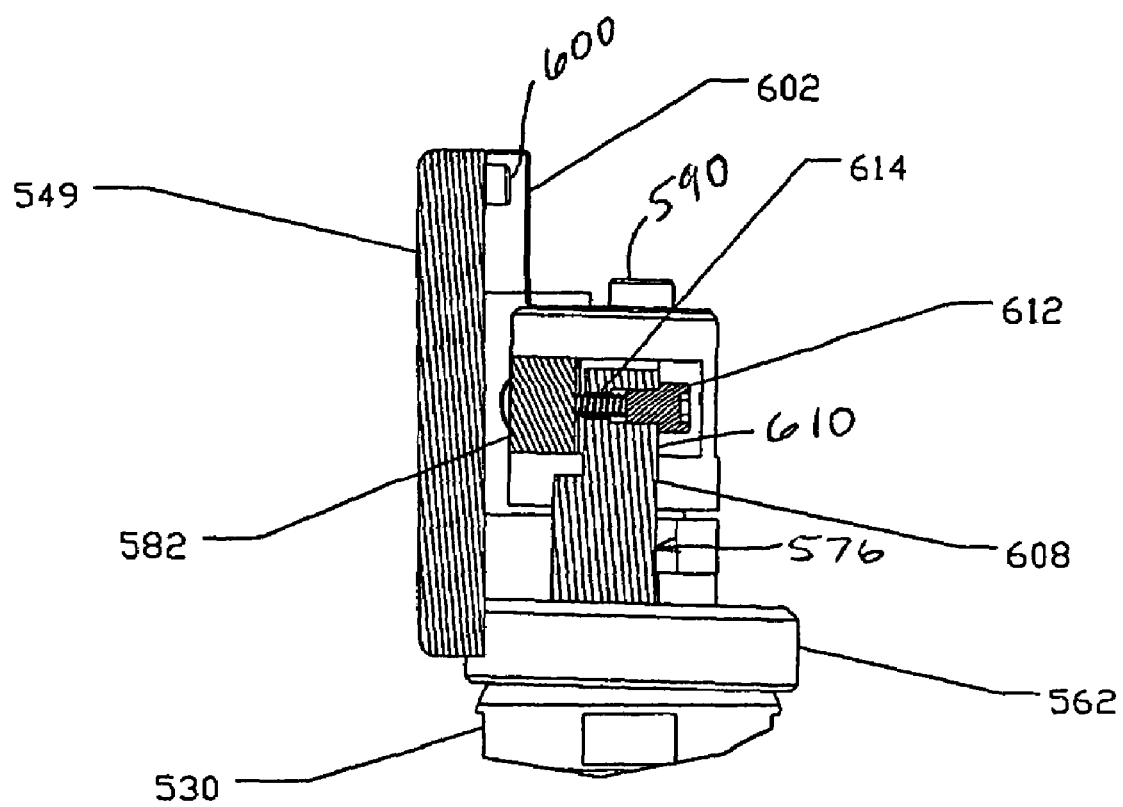
FIG. 17e is a diagrammatic view, in cross-section, illustrating details with respect to one feature of the blade suspension mechanism.

As seen in FIG. 17*e*, which is a cross-sectional view that is taken along a line 17*e*-17*e* in FIG. 17*d*, biasing springs 614 are captured by fasteners 612 between each distal end 610 of yoke 576 and each one of the suspension arms to resiliently bias each distal end 610 away from its associated suspension arm 592. Springs 614 thereby serve in an advantageous manner so as to center blade member 549 with respect to rotation about an axis 616 (indicated using a dashed line in FIG. 17*a*) of lever 514 when the blade member is not contacting a chamber sealing surface. When the chamber sealing surface is contacted by the blade member, however, springs 614 accommodate limited rotation of the blade member about lever 514 in order to compensate for a lateral or horizontal tolerance between blade member 549 and a chamber sealing surface by rotating about axis 616. Thus, the configuration of valve arrangement 80 advantageously provides for two degrees of freedom for blade member 549, as it engages a chamber sealing surface so as to avoid a need for high precision alignment, since a significant range of tolerance range can be compensated with respect to the vertical and horizontal axes of rotation. For example, assembly variations of approximately 0.100 inch are permissible. Moreover, it should be appreciated that the "ball and socket" configuration provided by ball flange 530 and socket cap 562 accommodates substantial lateral movement of blade member 549 toward and away from the chamber sealing surface. In this way, substantial lateral movement, prior to vertical movement of the sealing blade, allows increased rotational tolerances and/or relatively larger sealing blades, provided by significantly greater clearance between the chamber wall and sealing blade during vertical movement so as to avoid rubbing contact which can generate particles.

Figure 18B:
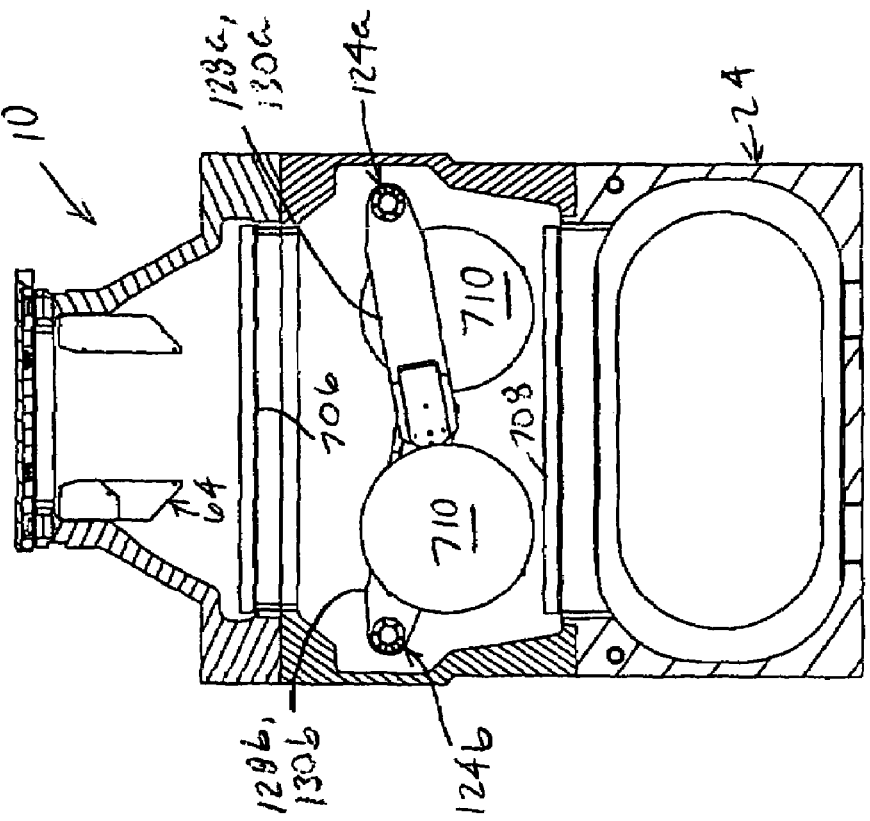
FIGS. 18a-18e form a series of diagrammatic plan views illustrating one process for implementing workpiece transfer and treatment in a highly advantageous way.

Having described the various components of system 10 in detail above, attention is now directed to the operation of the system, with particular regard to the use of the swing arm arrangement of the present invention. A first series of FIGS. 18*a-e* diagrammatically illustrate system 10 in a plan view, sequentially showing transfer of workpieces with ongoing processing. This first series of figures is supplemented by a second series of FIGS. 19*a-l* which diagrammatically illustrate sequential movements of the workpieces in an elevational view with ongoing processing. For purposes of simplicity, the present description may refer to workpieces as wafers. Most of the subject figures are limited to illustrating the combination of one loadlock 20, interfaced with one transfer chamber 22 which is, in turn, interfaced with one process chamber 24 having dual process stations 26a and 26b. Components of front end 12 will be illustrated as necessary. A workpiece or wafer column 700 is positioned in loadlock 20, as defined by shelf arrangement 64 of FIGS. 2 and 4. As seen in FIG. 19a, workpiece column 700 includes a pair of preprocess shelves 702 and a pair of postprocess shelves 704. In this regard, it should be appreciated that preprocess wafers are always moved from the front end to preprocess shelves 702 and postprocess wafers are always moved from postprocess shelves 704 back into the front end. Slit doors are indicated as being closed between the various chambers, as needed, using rectangles in the FIG. 18 series and using cross-hatching in the FIG. 19 series. For example, slit doors 706 and 708 are open in FIGS. 18a-d and FIGS. 19-a-g and 19l, while being shown as closed in FIG. 18e and FIGS. 19h-k. FIGS. 18b, 18d and 18e, as well as FIGS. 19c, 19d and 19g-l further illustrate the swing arm arrangement in a home or parked position at some point during ongoing operation of the system, as will be further described.

Figure 18A:
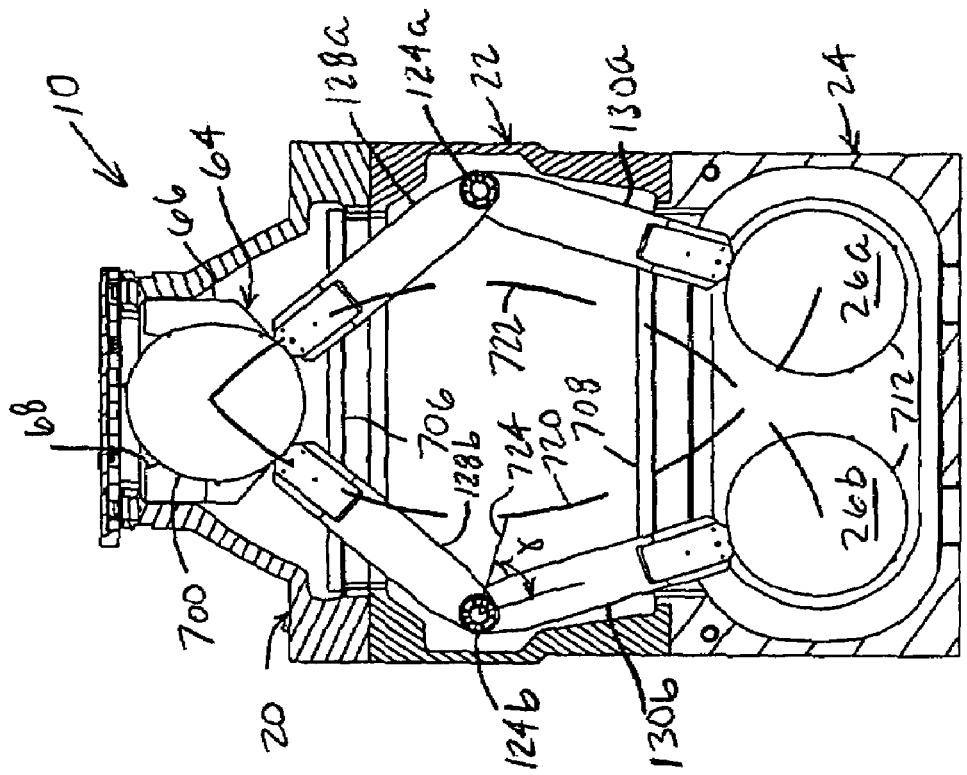

Turning to FIG. 18a in conjunction with FIG. 19a, the latter figure, as is the case with all of the figures in the FIG. 19 series, is an elevational view of system 10 having workpiece column 700 shown at the left and process stations 26 at the right in the view of the figure. An upper swing arm pair, as previously described with regard to FIG. 5a, includes swing arms 128a and 128b, for use in moving preprocess wafers while a lower swing arm pair includes swing arms 130a and 130b, for use in moving postprocess wafers. Upper swing arms 128 are rotated to workpiece column 700 while lower swing arms 130 are rotated to process stations 26. In FIG. 19a, upper swing arms 128 are poised to lift a pair of preprocess wafers 710 from preprocess shelves 702 while swing arms 130 are concurrently poised to lift a pair of postprocess wafers 712 at process stations 26a and 26b. It is noted that elevation 4 in FIGS. 8 and 9 produces this swing arm height. Postprocess wafers 712 are supported at different, spaced apart heights h1 and h2, respectively, above the process stations by first and second sets of lift pins 716 and 718 such that lower swing arms 130 are poised to pick postprocess wafers 712 from the lift pins.

Referring to FIG. 18a, it should be appreciated that the preprocess and postprocess wafers are moved along first and second arcuate, semicircular transfer paths 720 and 722, indicated by dashed lines, between workpiece column 700 and process stations 26. It is of interest that paths 720 intersect at workpiece column 700, but cross one another, thereby intersecting again, near the process stations. An angle γ represents the rotation of each swing arm from a home position, corresponding to the position of a dashed line 724, along paths 720 and 722. Thus, the full travel of each swing arm between workpiece column 700 and its associated process station 26 is 2γ. It is of further interest that the wafer column, pivot axes of the two swing arm arrangements and the two process stations cooperatively define a pentagonal shape. An uppermost shelf of shelf arrangement 64 is partially visible, comprising one long blade 66 and one short blade 68 (also see FIG. 2). These blades are arranged in a way that accommodates a particular angle of entry by the swing arm that services a particular shelf so as to avoid interference therebetween. In the present example, upper swing arm 128a accesses the uppermost shelf. Short blade 68 is therefore positioned on the left side of the shelf arrangement, in the view of the figure to prevent interference with end effector 142a of upper swing arm 128a. Since upper swing arm 128b swings-in from an opposite direction with respect to upper swing arm 128a, the shelf blades are reversed for its associated shelf, as can best be observed in FIG. 2. Thus, the shelf blade configuration is customized in view of the approach angle of each accessing swing arm.

In FIG. 19b, swing arm pairs 124a and 124b have executed an upward vertical motion, using lift motor 152 of FIG. 5a, so as to use upper swing arms 128 to lift preprocess wafers 710 off of preprocess shelves 702, while using lower swing arms 130 to lift postprocess wafers 712 off of lift pins 716 and 718. It is noted that rotation of cam plates 242a and 242b of FIGS. 8 and 9, respectively, from elevation 4 to elevation 1 produces this upward vertical movement.

Turning to FIGS. 18b and 19c, swing arms 128a, 128b, 130a and 130b all rotate simultaneously to the home position such that preprocess wafers 710 and postprocess wafers 712 are in a spaced apart vertical relationship (FIG. 19c), but only the preprocess wafers are visible in the view of FIG. 18b. Cam plates 242a and 242b of FIGS. 8 and 9, respectively, remain at elevation 1.

Referring to FIG. 19d in conjunction with FIG. 18b, while the swing arms remain in the parked position, a downward vertical movement in a direction indicated by an arrow 730 is executed, responsive to lift motor 152 of FIG. 5a. It is noted that lift pins 716 and 718 can remain in their "up" position, as also shown in FIG. 19c. It is noted that rotation of cam plates 242a and 242b of FIGS. 8 and 9, respectively, from elevation 1 to elevation 2 produces this downward vertical movement.

Figure 18C:
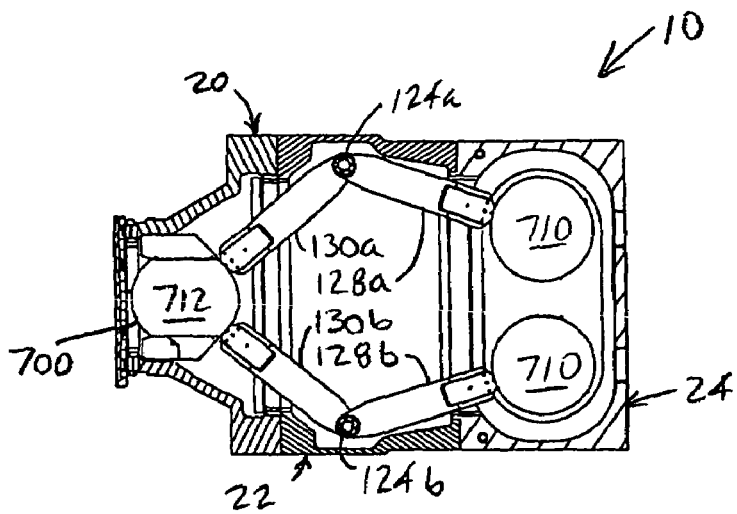
Figure 18D:
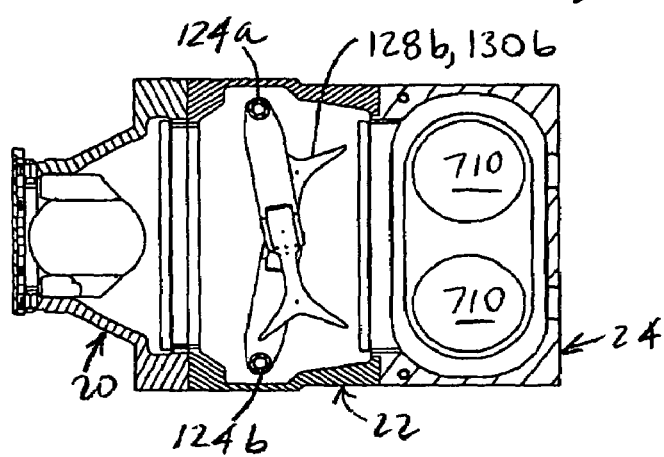
Figure 18E:
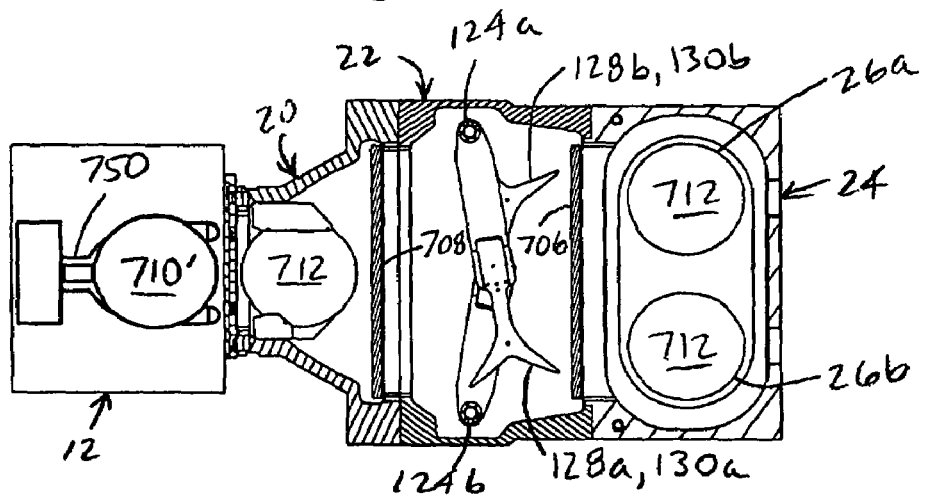

FIGS. 18c and 19e, cooperatively illustrate the result of rotation of lower swing arms 130a and 130b to wafer column 700 to deliver post process wafers 712 while upper swing arms 128a and 128b each deliver one preprocess wafer 710 to one of process stations 26a and 26b. Lift pins 716 and 718 can remain in their up positions, while cam plates 242a and 242b of FIGS. 8 and 9 remain oriented at elevation 2.

In FIG. 19f, the swing arm arrangement is moved downward in a direction indicated by an arrow 740 to place preprocess wafers 710 on lift pins 716 and 718 while postprocess wafers 712 are placed on postprocess shelves 704. It is noted that rotation of cam plates 242a and 242b of FIGS. 8 and 9, respectively, from elevation 2 to elevation 3 produces this downward vertical movement. Further, returning post-process workpieces entails a reversal of rotation of cam plates 242a and 242b, as will be evident to one having ordinary skill in the art in view of the foregoing disclosure.

FIGS. 18d and 19g illustrate swing arms 128a, 128b, 130a and 130b, then rotated to the home position. At this point, the swing arms are not carrying wafers and lift pins 716 and 718 remain raised to support preprocess wafers 710.

Referring to FIGS. 18e and 19h, it is noted that the former figure illustrates a front end robot 750 that is configured for moving wafers between loadlock 20, FOUPs 18 and intermediate station 21 (FIG. 1b) in the front end. It is noted that intermediate station 21 can be used for a variety of different functions including a cooling station, a wafer alignment station, a pre- and/or post process metrology station or two or more functions can be incorporated into this space. The front end robot arm supports a pair of wafers, using an over/under pair of paddles, and is configured for placing on preprocess shelves 702 and picking from post process shelves 704. Of course, the front end robot arm can pick and place from any pair of adjacent positions or from any individual position in any FOUP or any position in cooling station 21 (FIG. 1b). In the present example, front end robot 750 is poised to deliver a new pair of preprocess wafers 710' (FIG. 8e) at atmospheric pressure to preprocess shelves 702. In this regard, a suitable door configuration is used between front end 12 and loadlock 20, which is not shown since such door configurations are known. It is sufficient to say that this door must be in an open position before the front end robot can enter loadlock 20. FIG. 19h illustrates that lift pins 716 and 718 have been lowered to place preprocess wafers 710 on their respective process stations. Both FIGS. 18e and 19h illustrate slit doors 706 and 708 as closed for the processing mode. It should be appreciated that the relationship between these various events, as well as the actual initiation of processing, may be changed in many suitable ways in timed relation to one another. Processing then proceeds so as to transform the preprocess wafers into postprocess wafers 712 at process stations 26a and 26b.

Referring briefly to FIGS. 1a and 1b, with regard to front end robot 750, it is noted that, while two wafers can be transferred at the same time, the robot readily accommodates the transfer of the 25th wafer in a 25 wafer FOUP singularly by using independent motion of its over/under paddles. Moreover, this robot is inherently flexible in readily accommodating a variety of wafer positions within the FOUPs and cooling station 21, for example, when not all FOUP's come in fully loaded, since one or two wafers are selectively transferred at a time. That is, robot 750 may readily pick one wafer from one FOUP and another wafer from another FOUP, if necessary, using independent paddle motion, in order to enhance system throughput. The converse is likewise true for placing wafers in the FOUPs.

Referring to FIG. 19i, during processing, front end robot 750 places a new pair of preprocess wafers 710 onto preprocess shelves 702. At this time, the postprocess and preprocess shelves of wafer column 700 are all filled.

Referring to FIG. 19j, immediately after placing the new preprocess wafers, front end robot 750 picks postprocess wafers 712 from postprocess shelves 704. It should be appreciated that this movement from dropping off the new preprocess wafers to immediately picking up the postprocess wafers can be executed very quickly, if mandated by a relatively short process time and, therefore, may be referred to as a "fast wafer swap."

In FIG. 19k, the system is ready for the conclusion of processing with empty postprocess shelves 704 and with the new pair of preprocess wafers 710' waiting on preprocess shelves 702. Wafers at the process stations are indicated as transformed to post process wafers.

FIG. 19l, illustrates the conclusion of processing, with the slit doors opened and newly processed wafers 712 raised by lift pins 716 and 718. The next step is essentially identical to that of previously described FIG. 19a such that the processing cycle may repeat as necessary.

Having described system 10 in detail above, as well as its method of operation, at this juncture, is appropriate to discuss certain advantages that it provides, particularly with respect to system throughput in the instance of relatively short processing times. When processing times are short, it is important to effectuate transfer of workpieces in a way that does not add overhead time to the overall time which is required to process a workpiece. That is, overhead time during which workpieces are being transferred without concurrent exposure of workpieces to the treatment process. In this regard, it should be appreciated that system 10 transfers processed workpieces out of the processed chambers simultaneous with transferring new preprocess workpieces to the process chamber. When the processed workpieces arrive at the loadlock, preprocess workpieces simultaneously arrive at the process chamber. Moreover, this transfer is accomplished in a rapid manner. For example, transfer times on the order of less than approximately 8 seconds are contemplated. At the same time, it should be appreciated that the use of a workpiece column in the loadlock provides for what may be referred to as a mini loadlock. That is, the loadlock volume is so limited as to provide for rapid pump down from atmospheric pressure to an intermediate pressure or to the treatment pressure itself. For example, a loadlock volume of approximately 20 liters is contemplated. Loadlock pumpdown times of approximately 10 seconds or less are contemplated.

Referring again to FIG. 3, as mentioned previously, pump down of loadlock 20 is accomplished through ports 87, only one of which is visible in the view of FIG. 3. Since such a rapid pump down is facilitated, at least in part, due to the small volume of the loadlock, is recommended to use as dry an ambient as possible when the loadlock is in communication with the front end. In this way, flash condensation of water vapor may be avoided. Moreover, purge ports 89, only one of which is visible, may be used to present a constant curtain of gas flow when the loadlock is in communication with the front end, to prevent mixing of ambient front end gasses with those gasses that are present in the loadlock. Thus, a pump and purge routine may be used to avoid such gas mixing at any time the door is open between the loadlock and front end, whereby gasses entering through purge ports 89 flow through the loadlock and are immediately evacuated through pump ports 87. This is attended by the further advantage, briefly described above, that contaminants will flow into trough 87 and are evacuated, as a result of pumping from this low lying region of the loadlock.

Figure 20:
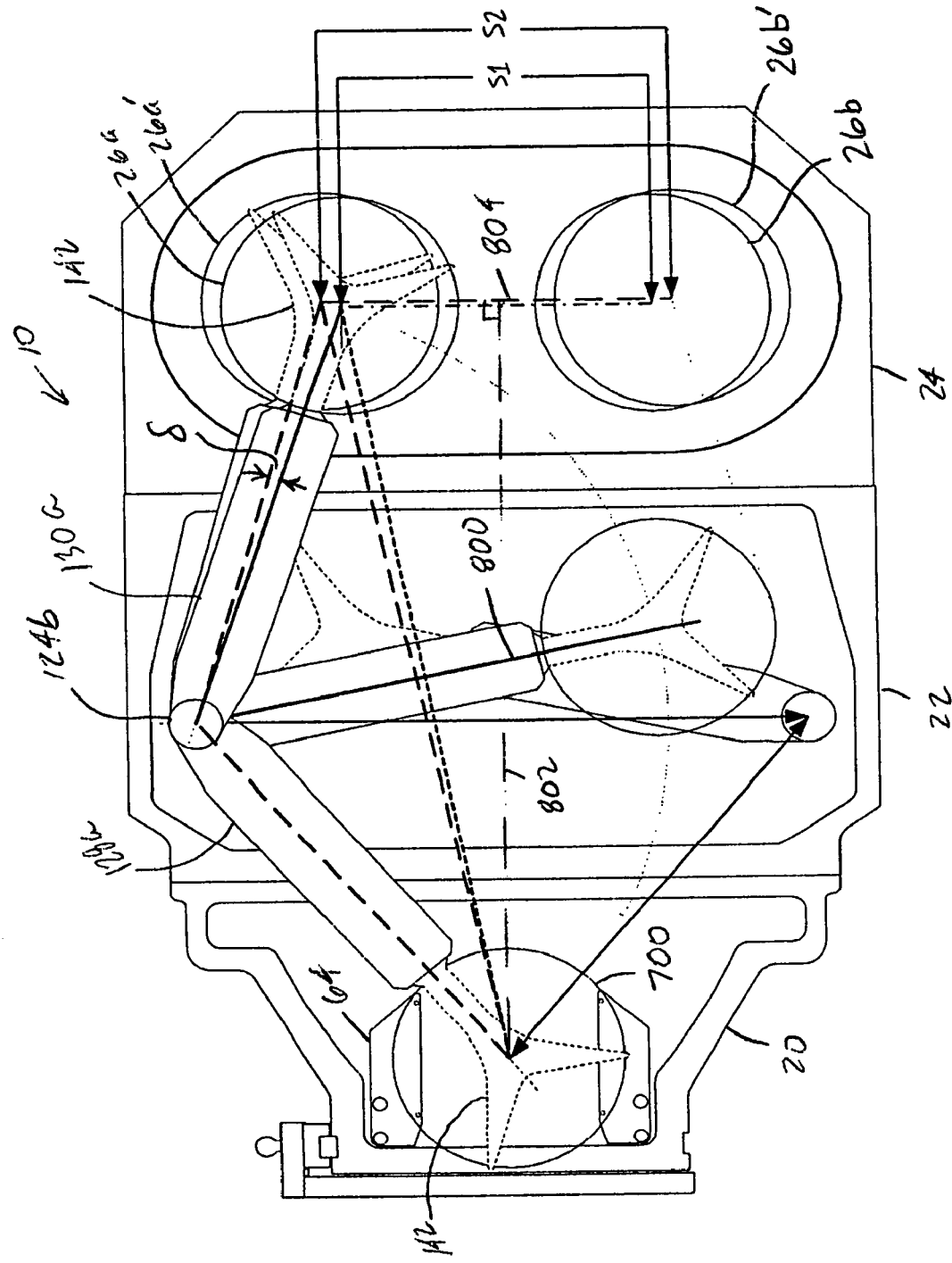
FIG. 20 is a diagrammatic plan view illustrating a process chamber, transfer chamber and loadlock for purposes of describing one way in which variation of process station to process station spacing can be accommodated.

Referring to FIG. 20, system 10 is diagrammatically illustrated without front end 12, in a plan view for purposes of describing a feature which is advantageous with respect to process station spacing. That is, the distance between the center of one process station to the center of the other process station. For purposes of clarity, only swing arm pair 124b has been illustrated, although it is to be understood that the present discussion is equally applicable with respect to the other swing arm pair. It is noted that FIG. 20 diagrammatically illustrates swing arm arrangement 120 with respect to counterrotation, however, its full symmetric movement capabilities are seen, for example, in FIGS. 18a-e. In the present example, process stations 26a and 26b are shown spaced apart by a distance S1. It may be desired, however, to change this spacing, for example, by increasing the spacing such that the spaced apart distance between processing stations 26a' and 26b' is increased to a distance S2. This change is readily accommodated by system 10, as will be described immediately hereinafter.

Turning to FIG. 5a in conjunction with FIG. 20, as described above, it is noted that upper swing arm 128a is clamped to the inner swing arm drive shaft while lower swing arm 130a is pinned or fixedly attached to the outer swing arm drive shaft. In order to accommodate any given process station to process station spacing or change thereof, lower swing arm 130a is initially fully rotated in the direction of the process stations, using motor 310. Housing 176, shown in FIG. 5a, can then be rotated in a way which allows for positioning lowermost swing arm 130a at an associated one of processing stations such as 26a'. Housing 176 is then fixed in position. Having accomplished this positioning and with upper swing arm 128a unclamped from the inner swing arm drive shaft, upper swing arm 128a is freely rotated to its desired position at wafer column 700. The upper swing arm is then clamped to the inner swing arm shaft. As a result of the counter rotation of the upper and lower swing arms, the home position will be angularly displaced by an amount that is equal to one half of the additional rotation that is introduced in the swing arm paths between the wafer column and the respective process stations. In FIG. 20, if the increased rotation is given as an angle 6, the home position of workpiece column 700 will be rotationally displaced by one half 6 toward the process stations. Of course, if the swing arm length is changed, the wafer column position will change accordingly. Shelf arrangement 64 can accommodate minor changes in swing arm length, as is. Greater changes, however, will necessitate movement of the shelf position within loadlock 20 along a line 802 that bisects and is normal to a process station to process station 804.

As another advantage of system 10, dual wafer delivery capabilities are provided using only a single wafer load/unload lock style architecture. This provides significantly reduced transfer chamber size and simplifies the mechanics associated with wafer exchange. The loadlock design allows for rapid atmospheric wafer exchanges which are facilitated through the described independent over/under robot paddles of the front end robot. This, in turn, is inherently flexible with small lots often confronted in FOUP based processing. A small volume loadlock allows for fast venting and pumping; imperative to high system throughput capability. Vacuum based transfer couples both the loadlock and process module wafer exchanges into common motions; eliminating the need for additional delays due to sequencing, and minimizing wafer exchange times. A "mini-batch" processing technology can be employed (side-by-side wafer processing), while reducing the physical size and costs associated with wafer handling technology. In this regard, the transfer chamber is also of a relatively small size. As a further advantage, during atmospheric loadlock exchange, two new wafers are placed simultaneously by the front end robot, which then removes the previously processed wafers. This exchange of wafers happens very quickly and, when coupled with fast vent and pump times associated with the reduced loadlock volume, allows for nearly invisible handling overhead. Indeed, the platform's main goal for high throughput capability is to mask all time associated with wafer replenishment entirely within the time required to process the other wafers. The result is thought to be a truly continuous processing capable system. As still a further advantage, the arrangement of opposing dual swing arms provide a trajectory which allows single wafer type load/unload lock architecture to efficiently accommodate side by side wafer processing geometry with a significantly smaller footprint than that embodied by prior designs.

As will be brought to light with reference to a number of specific examples to be described immediately hereinafter, the concepts taught herein may be embodied by a wide variety of alternative system configurations and arrangements, all of which are considered to fall within the scope of the present invention.

Figure 21:
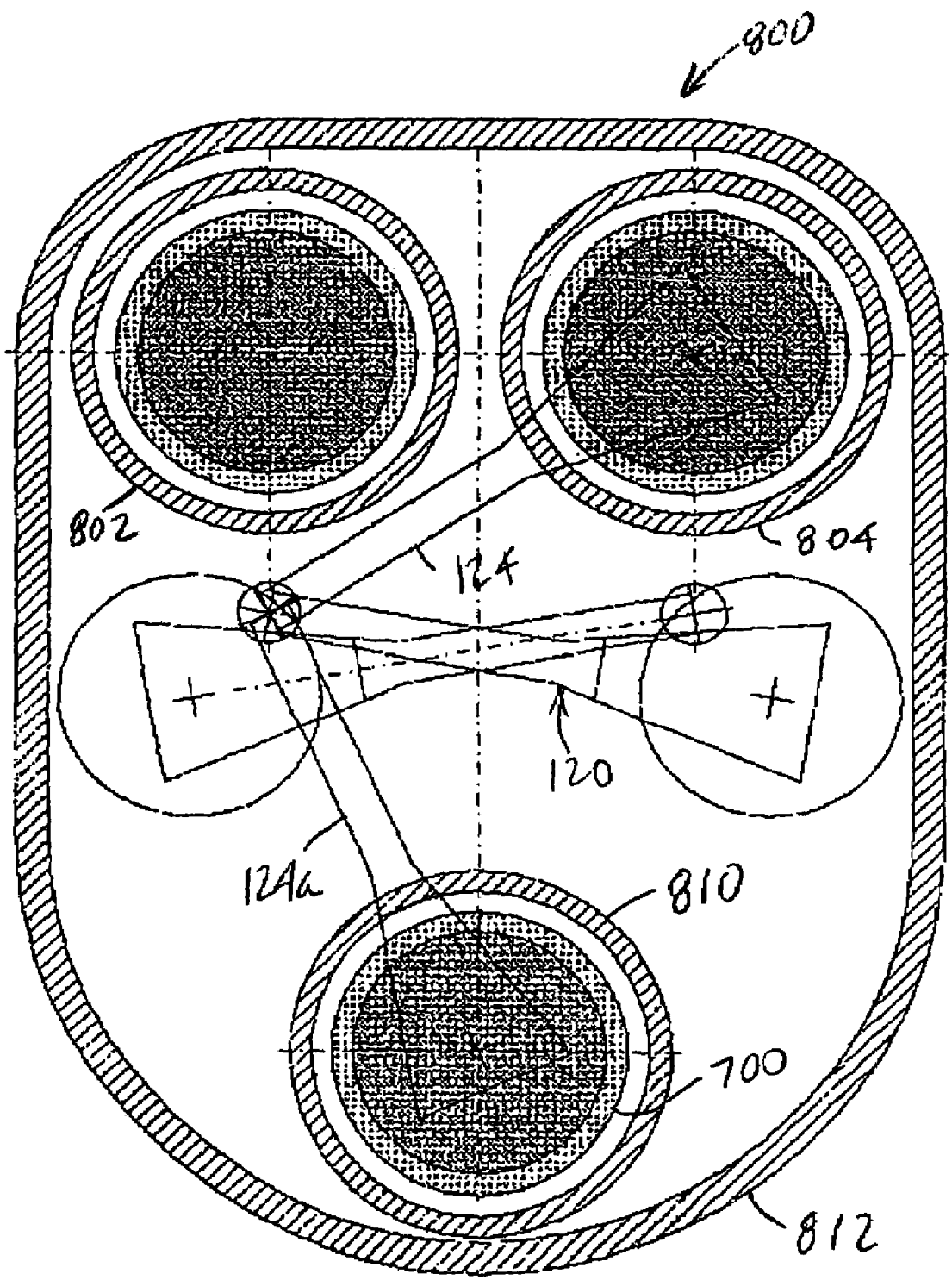
FIG. 21 is a diagrammatic plan view of one embodiment of a system using a swing arm arrangement of the present invention in conjunction with process stations that are housed in individual process chambers.

Attention is immediately directed to FIG. 21 which diagrammatically illustrates a processing arrangement that is generally indicated by the reference number 800. It is noted that FIG. 21 diagrammatically illustrates swing arm arrangement 120 with respect to counterrotation, however, its full symmetric movement capabilities are seen, for example, in FIGS. 18a-e. Processing arrangement 800 includes first and second processing chambers 802 and 804, respectively. This system further includes swing arm arrangement 120 with dual swing arm assemblies 124a and 124b. A loadlock 810 is provided which houses wafer column 700. Processing chambers 802 and 804, along with loadlock 810 are housed within an overall chamber 812. It is noted that any number of valve arrangements may be utilized for interfacing the various chambers utilized by processing arrangement 800 including, for example, one described in FIGS. 3 and 4 of U.S. Pat. No. 6,429,139 that is used in conjunction with arcuate chamber walls. Accordingly, such descriptions will not be repeated herein for purposes of brevity.

Still referring to FIG. 21, it should be appreciated that swing arm arrangements 124a and 124b can move synchronously, as described above, while processing chambers 802 and 804 are both in use. As an alternative, however, one swing arm arrangement can be disabled with respect to its rotational motion, for example, by turning off its rotational drive motor such that the swing arm assembly remains in its home position, while the other swing arm assembly remains fully operational. The disengaged swing arm assembly will continue to move vertically, as it normally would, with the operating swing arm assembly such that there is no interference between the two swing arm assemblies. The particular processing chamber that is associated with the disengaged swing arm assembly may be configured so that its utilities can be isolated from the rest of the system (i.e., turned off) such that the particular processing chamber can be serviced while the other processing chamber remains completely operational. This feature is considered to be highly advantageous, in and by itself.

Figure 22:
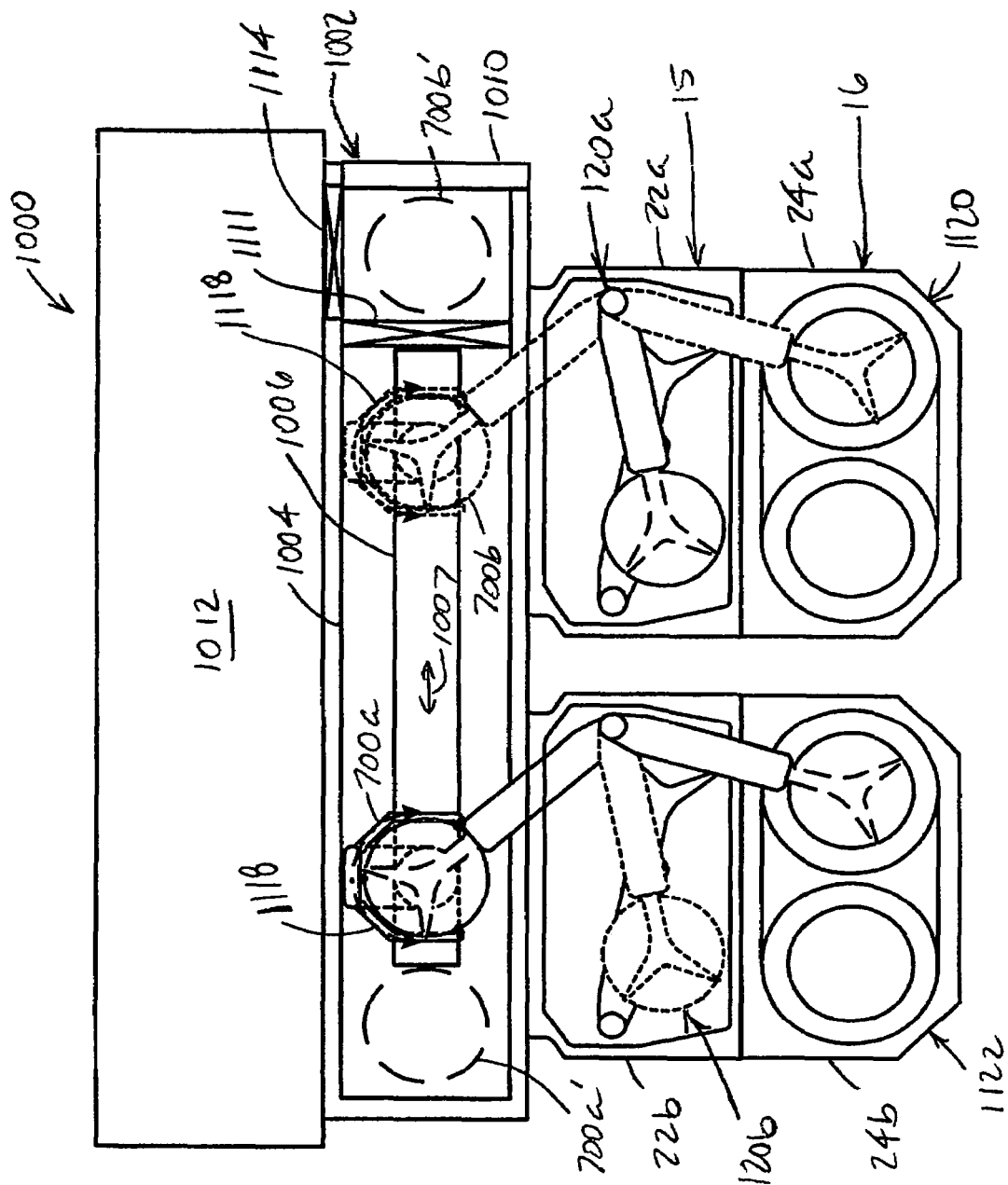
FIG. 22 is a diagrammatic plan view of another embodiment of a system, produced in accordance with the present invention, using a linear workpiece drive and a portable workpiece column.

Referring to FIG. 22, another embodiment of a system, produced in accordance with the present invention, is generally indicated by the reference number 1000. System 1000 shares the advantages of system 10 while providing still further advantages. This system uses wafer handling section 15 and processing section 16 in conjunction with a front end 1002. The latter includes an elongated transport chamber 1004 which houses a transport mechanism 1006 in the form of a linear drive for moving workpieces as indicated by arrow 1007. One suitable form of linear drive comprises a magnetic levitation linear drive, although any suitable type may be employed. A loadlock 1010 is stationed at one end of transport chamber 1004 for communication with the interior of the transport chamber through a door 1111. In this regard, it should be appreciated that transport chamber 1004 can operate at process pressure. Loadlock 1010 is, in turn, configured for communication with an atmospheric mini environment 1012 through a door 1114. Mini environment 1012 is not shown in detail, since its general details of construction will be evident to those having ordinary skill in the art in view of the foregoing discussions, but which may include, for example, a front end robot and ports for any suitable number of FOUPs. Door 1111 and door 1114 may be of any suitable type including, but not limited to slot valves of the type previously described with respect to the FIG. 17 series, depending on the configuration provided for the transport of workpieces therethrough, as will be further described.

Still referring to FIG. 22, in one embodiment, transport mechanism 1006 is configured for moving a workpiece carrier 1118 therealong which supports one or more workpiece columns. Carrier 1118 is shown stationed for access by swing arm arrangement 120b, designated as a workpiece column 700a supported by transport 1006 and, in phantom, designated as a workpiece column 700b. Each of these workpiece columns resembles previously described workpiece column 700 with the difference that each workpiece column is portable, as will be further described. It should be appreciated that carrier 1118 supports previously described shelf arrangement 64 for access by swing arm arrangements 120a and 120b.

Still referring to FIG. 22, when using a portable workpiece carrier, door 1111 may comprise any suitable door arrangement. A front end robot (which may be identical to front end robot 750 of FIG. 18e), forming part of front end 1012, may access the portable workpiece carrier at 700b' through door 1114 in a manner that is essentially identical to that described with respect to system 10 by moving the workpiece carrier to location 700b'. Specifically, the front end robot may have independent over/under paddles that can be used for a four position workpiece column. This location may also include a rotatable shelf arrangement for confronting either door 1114 for front end access or door 1111 for linear transport mechanism 1006 access. Alternatively, door 1114 may be configured for moving an entire workpiece column or workpiece carrier therethrough with the use of appropriate front end robotics. In this way, a fresh, preprocess workpiece column can enter through loadlock 1010 while another loadlock (not shown but at an opposing end of transport 1006) can be used by the front end to retrieve a postprocess workpiece column. Workpiece columns 700a and 700b are shown selectively aligned with transfer chambers 22b and 22a, respectively. It should be appreciated that more than one portable workpiece carrier can be used at a time so that, with workpiece columns 700a and 700b positioned as shown, transfer of workpieces to and from these columns can proceed as described above with respect to system 10. For descriptive purposes, one transfer chamber in combination with one process chamber may be referred to as a process platform. Accordingly, in the present example, process platforms 1120 and 1122 are provided. A workpiece column 700a' comprises a location to which the portable workpiece carrier can be moved, serving, for example, as a cooling and/or buffer station. The buffer/cooling station can be configured to rotate 180 degrees, depending on requirements, for access from linear transport 1006 and wafer carrier 1118. It is noted that this may comprise another loadlock location, as mentioned above, and with appropriate valves, so as to appear essentially the same as loadlock 1010, in order to increase system throughput, if the reduced system overhead time coupled with process time requirements warrants such a feature. Accordingly, the advantages that are attributable to the use of a stationary workpiece column in the loadlock are also provided by system 1000, while still further advantages are provided through making this workpiece column portable. Moreover, when process chamber 24a is used to practice a different process than process chamber 24b, the configuration of system 1000 provides the further advantage of allowing for sequential processing, without the need to break vacuum.

Figure 23:
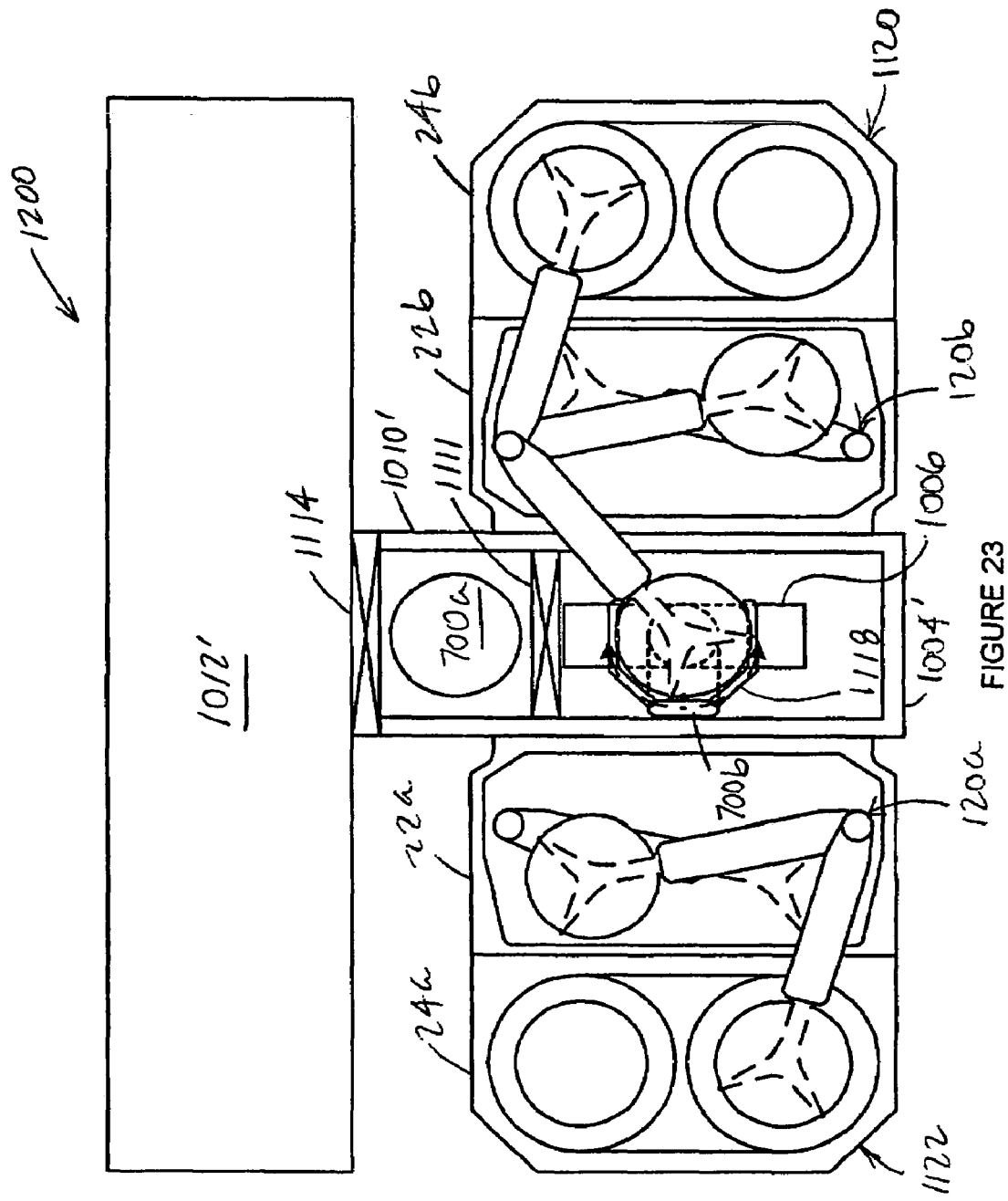
FIG. 23 is a diagrammatic plan view of an alternative embodiment of a system, produced in accordance with the present invention, using a linear workpiece drive.

Turning now to FIG. 23, another embodiment of a system, produced in accordance with the present invention is generally indicated by the reference number 1200. It is noted that, throughout appropriate ones of the remaining figures, swing arm arrangement 120 is illustrated with respect to counterrotation, however, its full symmetric movement capabilities are described in detail above and can be seen, for example, in FIGS. 18a-e. System 1200 includes a modified front end 1012' having a loadlock access door 1114 centered on one side thereof. A modified transport chamber 1004' includes a modified loadlock 1010' having doors 1114 and 1111 arranged on opposing sides thereof so as to confront front end 1012' and transport chamber 1004', respectively. Workpiece column 700a is illustrated in loadlock 1010' such that it can be accessed from the front end using the front end robot, or it can be moved into transport chamber 1004'. Workpiece column 700b and carrier 1118 are illustrated in an aligned position with process platforms 1120 and 1122. In this configuration, either process platform can move workpieces to and from this workpiece column using swing arm arrangements 120a and 120b. A cooling and/or buffer station (see FIG. 22, can readily be provided. In one implementation, a suitable arrangement may be provided for elevating a workpiece column, for example, from loadlock 1010' or from a cooling/buffer station such that multiple workpiece columns can be arranged in a stacked relationship. In this regard, a "second story" can be added to transport chamber 1004' and to loadlock 1010' to provide for a high degree of flexibility with respect to movement of workpiece column carriers in this system. It should be noted that system 1200 is also advantageous with respect to providing the capability for performing sequential processing steps without the need to break vacuum. That is, as is also the case with system 1000 and other systems yet to be described, platform 1120 may be used to execute a first process step. After having been exposed to this first process step, workpieces may then be transported to platform 1122 for exposure to a second process step.

Figure 24D:
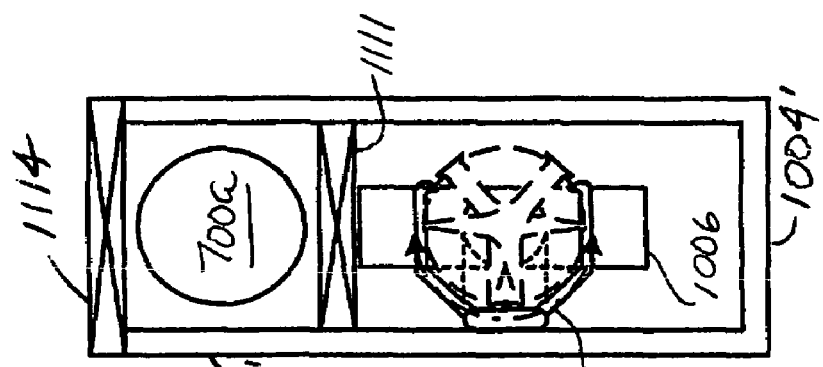
FIGS. 24a-d are diagrammatic plan views of the linear drive and loadlock of the system of FIG. 23, shown here to illustrate workpiece movement using a rotatable workpiece carrier.
Figure 24C:
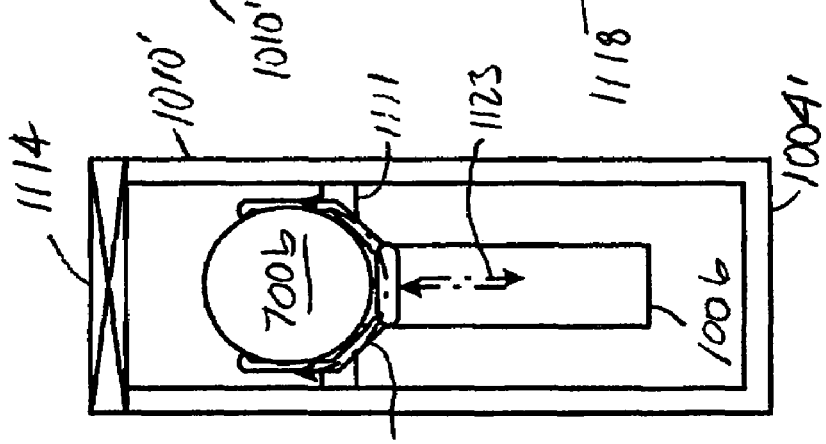
Figure 24B:
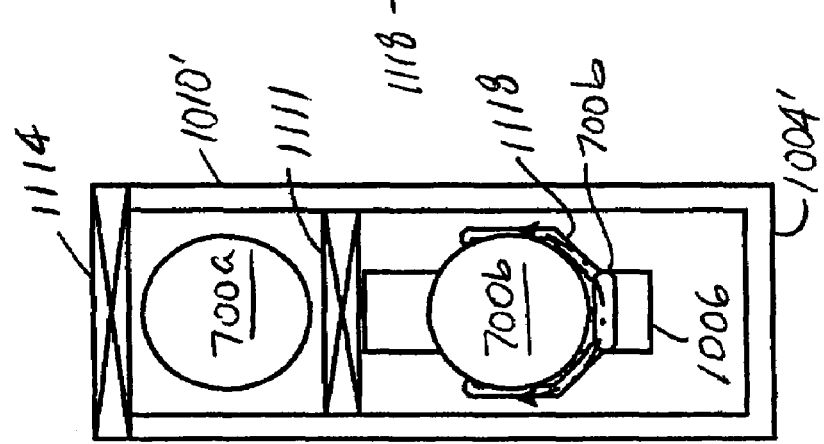
Figure 24A:
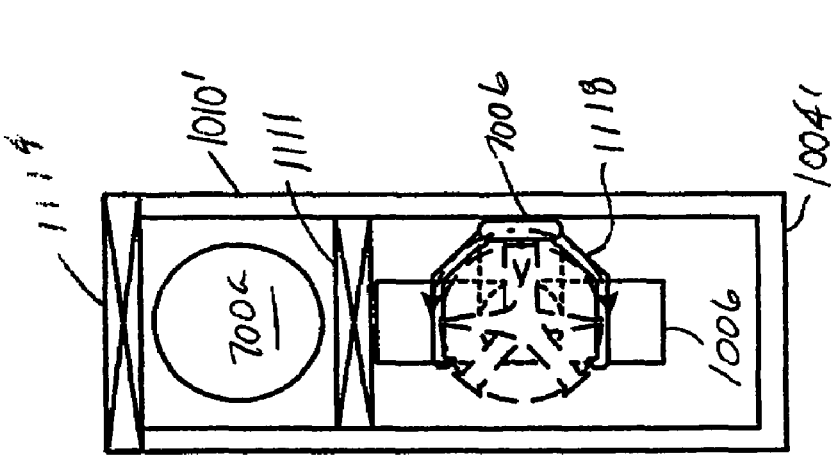

Referring to FIGS. 24a-d in conjunction with FIG. 23, further details will now be provided with respect to linear transport 1006, as shown in FIG. 23, although it is to be understood that these concepts can apply to any linear transport and/or rotatable wafer column used herein. FIG. 24a illustrates workpiece carrier 1118, which may itself be a robot with rotation and extension capability, supported by linear transport 1006 rotated to confront platform 1122 to receive/handoff workpieces with this platform.

FIG. 24b illustrates workpiece carrier 1118 rotated to a "neutral" position, in preparation for exchanging workpieces with loadlock 1010'.

In FIG. 24c, workpiece carrier 1118 is moving wafer column 700b into loadlock 1010' for access by front end 1012' of FIG. 23 with door 1111 in an open position. It is noted that linear movement is facilitated, as indicated by arrows 1123.

FIG. 24d illustrates workpiece carrier 1118 rotated to confront platform 1120 (FIG. 23) to receive/handoff workpieces with this platform.

Figure 25:
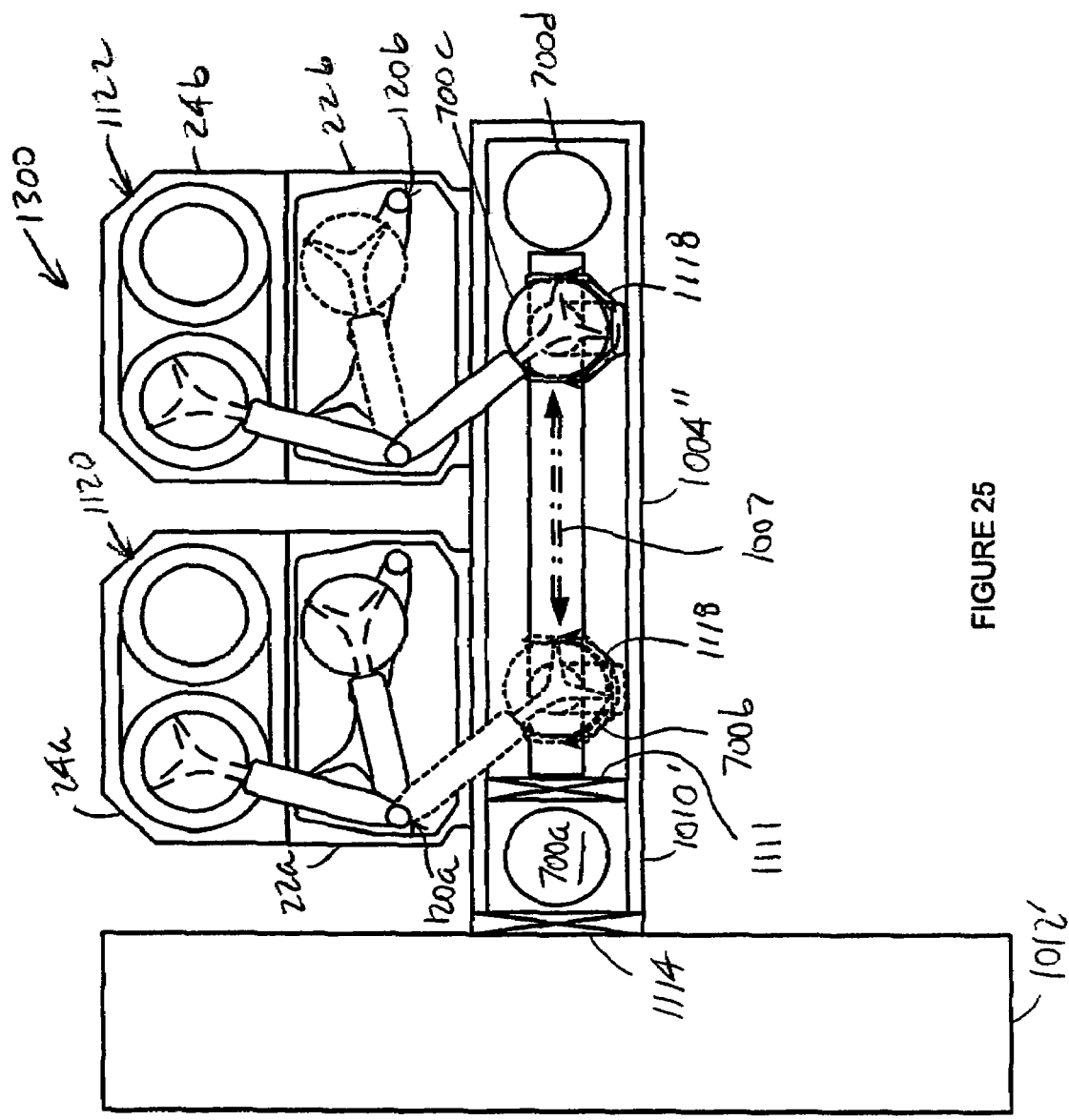
FIGS. 25-27 are plan views of additional alternative embodiments of systems that are produced in accordance with the present invention.

Turning now to FIG. 25, attention is directed to still another alternative system configuration that is generally indicated by the reference number 1300. It should be appreciated that much of the foregoing discussion with respect to alternative embodiments is equally applicable with respect to system 1300. For this reason, some details will not be repeated for purposes of brevity. System 1300 places processing platforms 1120 and 1122 in a side-by-side relationship for access using a transport chamber 1004", in a manner that is similar to that of previously described system 1000. In this case, however, front end 1012' has been rotated 90° and arranged for communication with loadlock 1010' through a door 1114. As illustrated, workpiece columns 700a-700d can be used in the system. Workpiece column 700a is stationed in loadlock 1010', workpiece column 700b is stationed for access by platform 1120, workpiece column 700c is stationed for access by platform 1122 and workpiece column 700d is positioned outward of workpiece column 700c at what may be a cooling and/or buffer station. Workpiece carrier 1118 is shown supporting workpiece column 700c and, in phantom, supporting workpiece column 700a. Again, sequential processing may be performed without the need to break vacuum.

Figure 26:
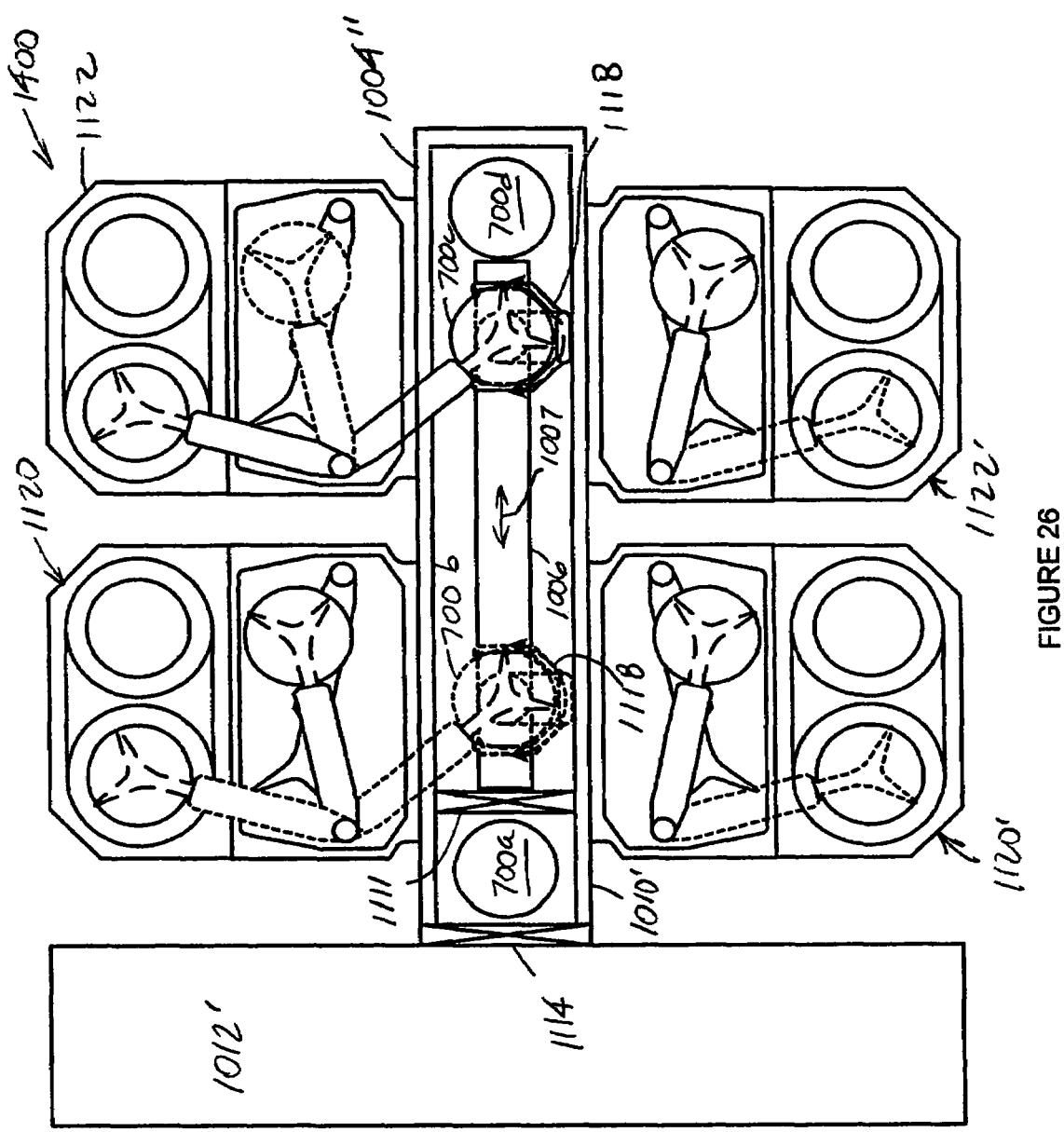

Referring to FIG. 26, yet another alternative system configuration is generally indicated by the reference number 1400. System 1400 represents a combination of previously described systems 1200 and 1300. Specifically, transport chamber 1004", of FIG. 25, has been utilized with platforms 1120 and 1122 positioned side-by-side on one side of the transport chamber, while, on the other side of the transport chamber, platforms 1120' and 1122' are stationed side-by-side in a confronting relationship with the platforms on the opposite side of the transport chamber. Accordingly, system 1400 shares all of the advantages of systems 1200 and 1300 so as to provide for robust workpiece processing capabilities.

Figure 27:
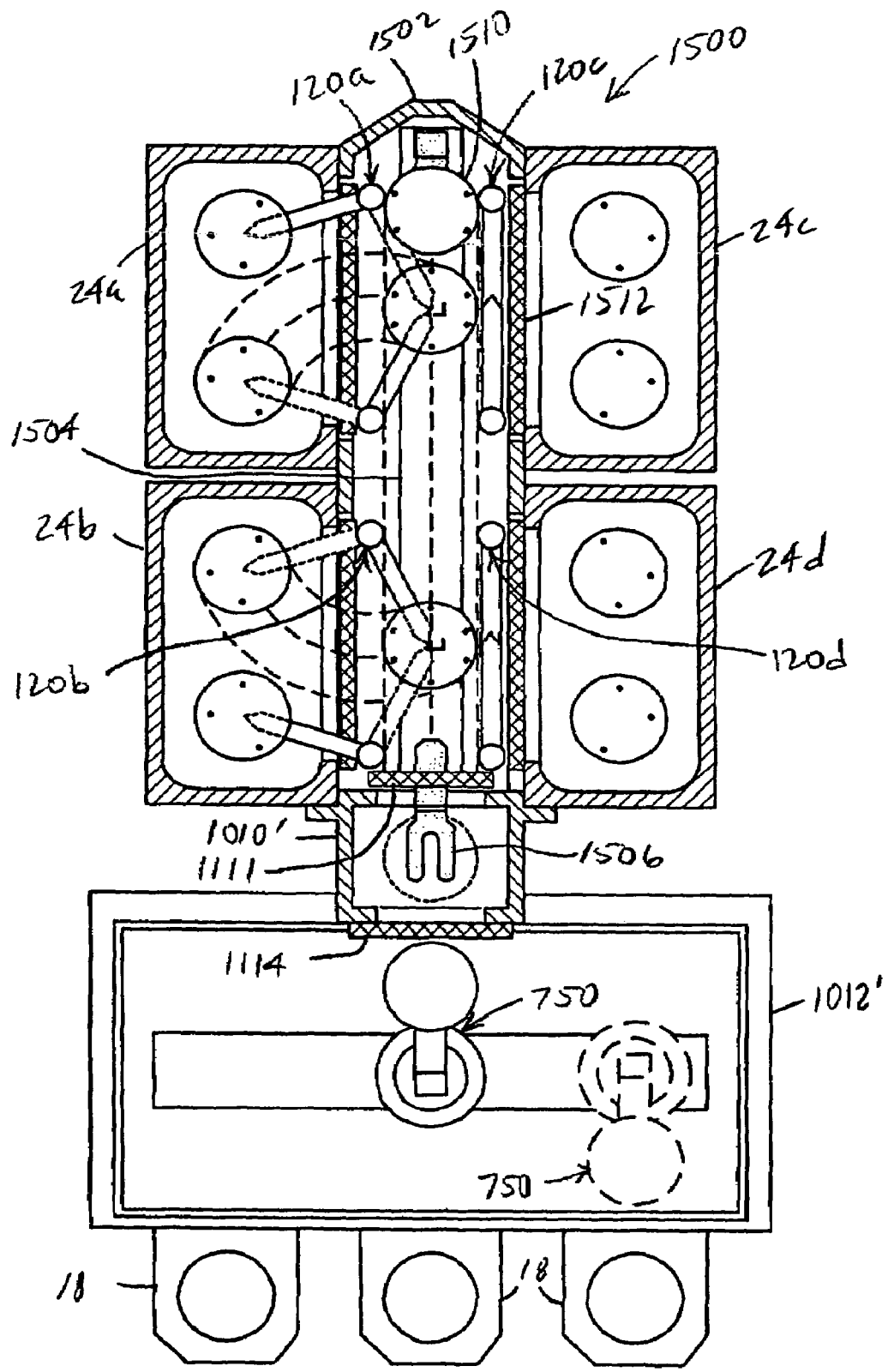

With reference to FIG. 27, an additional alternative system configuration is generally indicated by the reference number 1500. System 1500 shares a number of aspects of its configuration with system 1400 of FIG. 26, with exceptions to be noted. In the present example, a transport chamber 1502 houses a linear drive 1504 in the form of a mini robot. The latter includes a paddle assembly 1506 which may be configured with over/under paddles, as described above, for purposes of transporting one or two workpieces at a time. A paddle assembly of linear drive 1504 is shown at a lower position, in the present view, such that its paddle blades are positioned within loadlock 1010'. A buffer station 1510 is located at the uppermost end of the linear drive, in the present example. The buffer station may include, for example, from 1-30 workpiece positions. Some of the workpiece buffer positions can be used to store test workpieces for process set up and/or calibration. It is of interest to note that the pivot axes of swing arm arrangements 120a-120d are now located in transport chamber 1502. Further, the transport chamber may be held at process pressure, if so desired. Slit doors 1512 (only one of which is identified) are provided which may utilize any suitable valve arrangement such as, for example, valve arrangement 80, as described above. Accordingly, as is the case with other systems described above, sequential or parallel processing can be accomplished using this system.

Still referring to FIG. 27, in one modification of system 1500, loadlock 1010' is not required. That is, door 1111 can be eliminated such that the illustrated loadlock volume becomes part of the transport chamber. Thus, this lower illustrated position of mini robot 1506 can server as a buffer station or for other appropriate purposes. It should be appreciated that the present invention contemplates system configurations that are driven by process parameters. In particular, a small volume loadlock is highly advantageous in the instance of a fast process time, wherein a fast process time would be less than or on the order of a given overhead time required to transport one or more workpieces, including pumping times. On the other hand, slow process times may serve to eliminate the need for a loadlock, whereby configurations such as is illustrated in FIG. 27 become useful. That is, a slow process time is of a length which is generally longer than the time period that is required for wafer transport. In this sense, there is no overhead time, if the latter is viewed as time devoted to wafer transport while a processing station is inactive.

Figure 28:
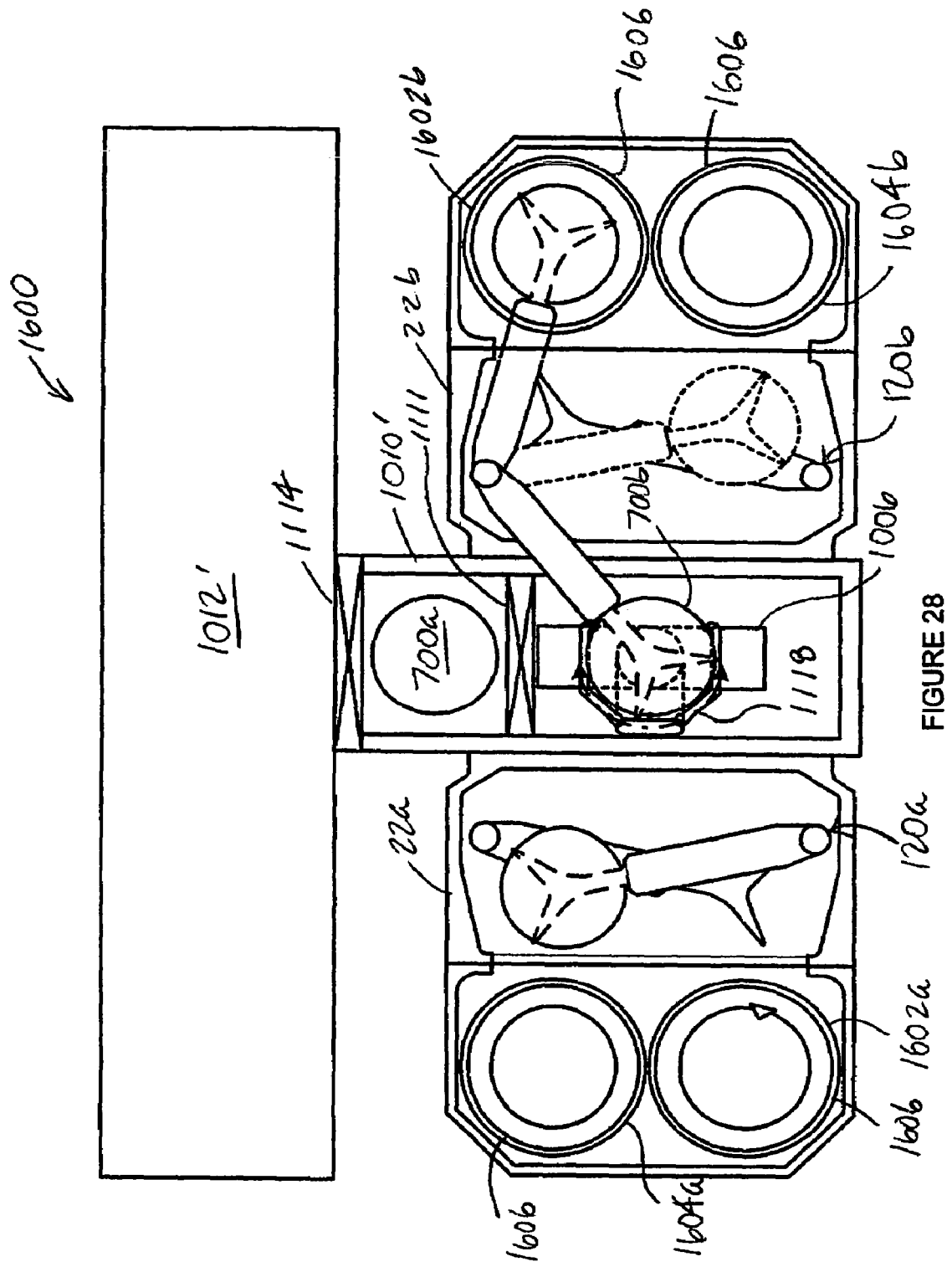
FIG. 28 is a diagrammatic plan view of another embodiment of a system using a swing arm arrangement of the present invention in conjunction with process stations that are housed in individual process chambers.

Turning now to FIG. 28, a further embodiment of a system that is configured in accordance with the present invention is generally indicated by the reference number 1600. It is noted that system 1600 includes an overall configuration which resembles system 1200 of FIG. 23, described above. Accordingly, the present discussion will be limited to certain differences between these two systems. In particular, the side-by-side common processing environment of FIG. 23 has been replaced by a pair of separate processing chambers 1602 and 1604, designated with "a" and "b" appended in the Figure. Each of these chambers is capable of performing a process that is isolated from the other chamber. Thus, a first process can be performed in chamber 1602 while a second process is performed in chamber 1604 in a sequential processing environment, although this is not a requirement. Accordingly, each of the process chambers is located within the transfer chamber and is isolatable therefrom, for example, using a vertically movable process chamber slit door 1606, as described in above incorporated U.S. Pat. No. 6,429,139. It should be noted that this embodiment shares advantages with the embodiment of FIG. 21. In particular, one process chamber, and associated, swing arm arrangement can continue to operate while the other process chamber undergoes servicing or maintenance.

Figure 30:
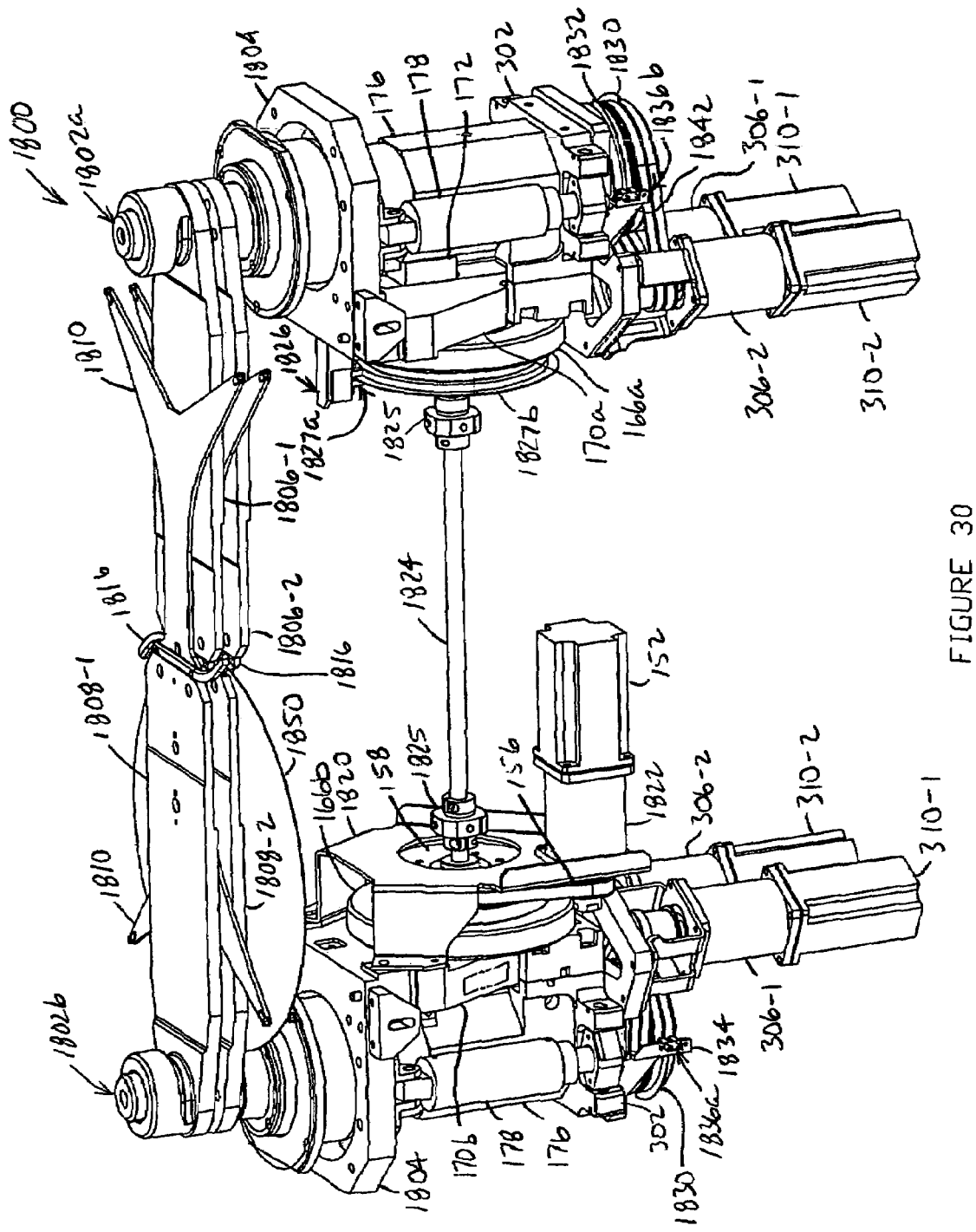
FIG. 30 is a diagrammatic view, in perspective, of another embodiment of a swing arm arrangement that is produced in accordance with the present invention.

Turning to FIG. 30 another embodiment of a swing arm arrangement, manufactured in accordance with the present invention, is generally indicated by the reference number 1800 and shown in a perspective view. It is noted that swing arm arrangement 1800 can be used with previously described chamber arrangements, such as installed with aforedescribed transfer chamber 22, or with alternative chamber embodiments to be described below. Further, swing arm arrangement 1800 shares many components with previously described swing arm arrangement 120. Hence, descriptions of these components will not be repeated for purposes of brevity and like reference numbers have been applied in the various figures. It is noted that the term "wafer" should be interpreted broadly to include not only semiconductor wafers, but any suitable substrate.

Figure 31:
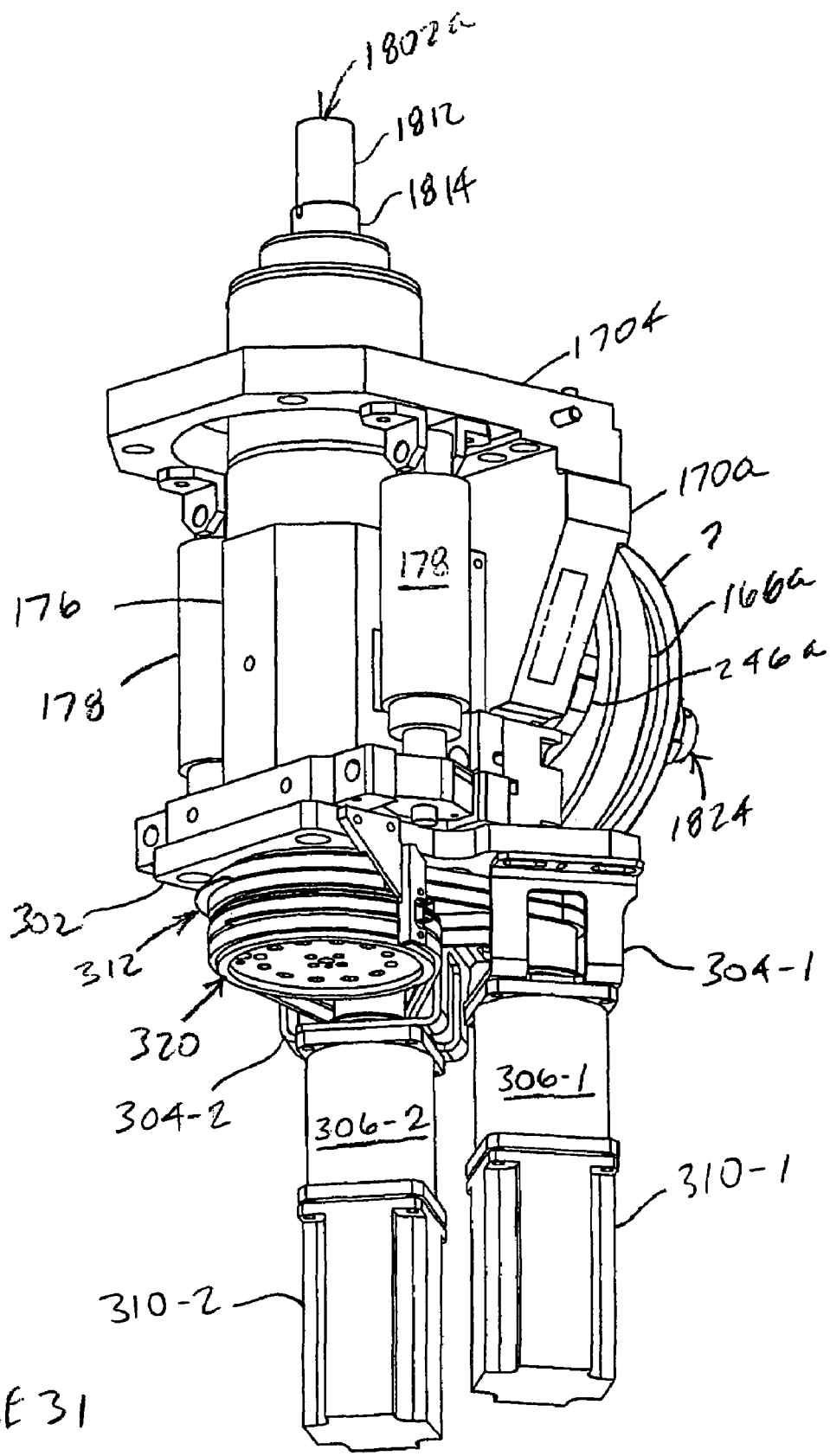
FIG. 31 is a diagrammatic view, in perspective, of one of the swing arm actuation mechanisms of FIG. 30, shown here to illustrate further details of its structure.

Referring to FIG. 31 in conjunction with FIG. 30, swing arm arrangement 1800 differs from previously described swing arm arrangement 120 since overall baseplate 122 (see FIG. 5a) is not needed. FIG. 30 illustrates both swing arm arrangements, including the swing arms, while FIG. 31 illustrates one swing arm actuation arrangement without swing arms attached, for purposes of revealing additional details with respect to its structure. Thus, in FIG. 30, a first swing arm pair 1802a and a second swing arm pair 1802b each incorporate a mounting plate 1804 such that each swing arm pair is individually mountable. Like previously described swing arm arrangement 120, the upper and lower swing arm that makes up each swing arm pair in swing arm arrangement 1800, is coaxially mounted for rotational movement in planes that are spaced apart from one another by a fixed distance. As seen in FIG. 30, The upper and lower swing arms of swing arm pair 1802a are designated by the reference numbers 1806-1 and 1806-2, respectively, while the upper and lower swing arms of swing arm pair 1802b are designated by the reference numbers 1808-1 and 1808-2, respectively. Each swing arm includes a distal end supporting a wafer paddle 1810 such that the wafer paddle defines the widest point along the overall length of the swing arm. Inner swing arm shaft 1812 and outer swing arm shaft 1814 for supporting the upper and lower swing arm, respectively, can include identical mounting features for receiving the swing arms, since rotational alignment considerations are readily accommodated using separate drive motors 310-1 and 310-2. It is noted that swing arms 1810 include a wafer guide 1816 for assisting in retaining a wafer on the swing arm. In this regard, it is noted that the configuration of the wafer guide is a result of the fact that each swing arm, as described above, moves wafers in one direction between the loadlock and processing chamber.

Still referring to FIGS. 30 and 31, swing arm arrangement 1800 also differs from swing arm arrangement 120 with respect to the location of its vertical motion stage, as well as certain details with respect to the configuration of the vertical motion stage. Specifically, a bracket 1820 is attached to bracket 170b for supporting lift motor 152. The lift motor is attached to bracket 1820 via a gear box 1822. Pulley 158 is attached directly to cam 166b and is driven by lift motor 152 using belt 156. A shaft arrangement 1824 includes a pair of couplers, each of which is indicated by the reference number 1825, and rotationally couples pulley 158 to cam 166a. Rotation of shaft arrangement 1824, for determining vertical height of the swing arms responsive to lift motor 152 is sensed using a sensor arrangement 1826 including, for example, a transmitter/detector pair 1827a, to be described in further detail below, but arranged on opposing sides of a flange 1827b for purposes of detecting a through-hole that is defined by the flange which denotes a vertical home position. Of course, an offset from this fixed vertical home position can readily be designated through appropriate control of lift motor 152.

Figure 32:
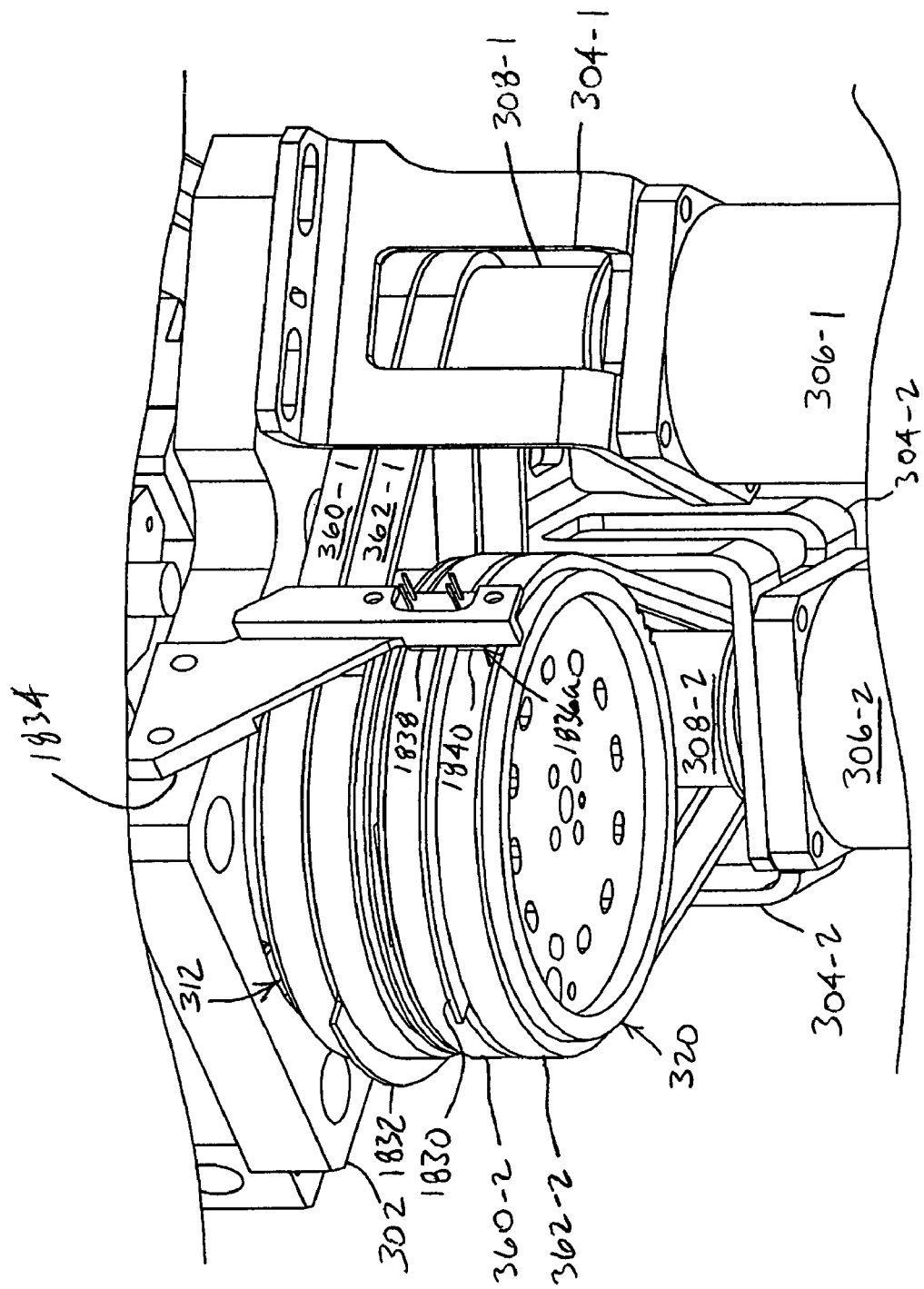
FIG. 32 is an enlarged perspective view of a portion of the swing arm mechanism of FIG. 31, shown here to more clearly illustrate the details of its dual motor drive arrangement.

Referring to FIGS. 30-32, aforedescribed pulley arrangements 312 and 320 are configured for purposes of rotating outer swing arm shaft 1814 and inner swing arm shaft 1812, respectively. In this case, however, a first motor 310-1 uses belts 360-1 and 362-1 while a second motor 310-2 uses belts 360-2 and 362-2 so as to provide a separate drive motor for each pulley arrangement and, thereby, for each swing arm. The motors are supported using gear drives 306-1 and 306-2 which are, in turn, supported by brackets 304-1 and 304-2. It is considered that one having ordinary skill in the art is capable of programming computer 40 of FIG. 1a in order to achieve the requisite functionality in view of this overall disclosure. Since swing arm arrangement 1800, unlike previously described swing arm arrangement 120, does not employ counterrotation, a separate position sensor arrangement is needed for the upper and lower swing arm of each swing arm pair, as will be described immediately hereinafter.

Referring primarily to FIGS. 30 and 32, an upper swing arm position sensor plate 1830 has been fixedly positioned between the offset pulleys which make up second pulley arrangement 320 and a lower swing arm position plate 1832 has been fixedly positioned between the pulleys which make up first pulley arrangement 312. The first and second pulley arrangements are described in detail above with respect to FIG. 12. In one embodiment, the upper and lower swing arm position plates are identical with respect to one another, except that they are angularly offset, as best seen in FIG. 32. Each position plate may include an overall disk-like configuration (not shown) and a slotted aperture arrangement (not shown) which cooperates with the elongated slots defined by the pulleys of each split pulley arrangement, as will be apparent to one of ordinary skill in the art in view of FIGS. 12 and 32, for purposes of capturing the position sensor plate between the pulleys which make up each split pulley pair. Alternatively, a sensor interrupter flange may be attached to a side margin of either pulley of the split pulley pairs so as to function in an equivalent manner. A lower sensor arrangement bracket 1834 supports a lower pulley position sensor arrangement 1836a having a transmitter 1838 and a detector 1840, that are positionally interchangeable, for purposes of detecting the edges of upper swing arm position plate 1830. In one embodiment, one of the transitions indicates the home position of the associated swing arm. If so desired, calibration of this home position may be accomplished by rotation of the swing arm in a desired direction using precision control of the associated motor in a manner that will be familiar to those of ordinary skill in the art in view of this overall disclosure. It is noted that electrical cabling to transmitter 1838 and detector 1840 have not been shown for purposes of illustrative clarity. An upper pulley position sensor arrangement 1836b (FIG. 30) is essentially identical to the lower pulley position sensor arrangement with the exception that an upper sensor arrangement bracket 1842 is used to appropriately position its transmitter/detector pair. Thus, the upper and lower sensor arrangements are positioned on opposing sides of the swing arm drive pulleys. Further, transmitter 1838 and detector 1840 are useful as transmitter/detector pair 1827a of FIG. 30.

Applicants have recognized that a number of advantages are associated with the use of a separate drive motor for each swing arm. Of course, counterrotation is readily achieved, if so desired, in a way which emulates the motion provided by previously described swing arm arrangement 120. Swing arm arrangement 1800, surprisingly, has been found to enable what are considered as remarkable modifications and advantages with respect to the chamber arrangement in which it is used, as will be further described.

Figure 33:
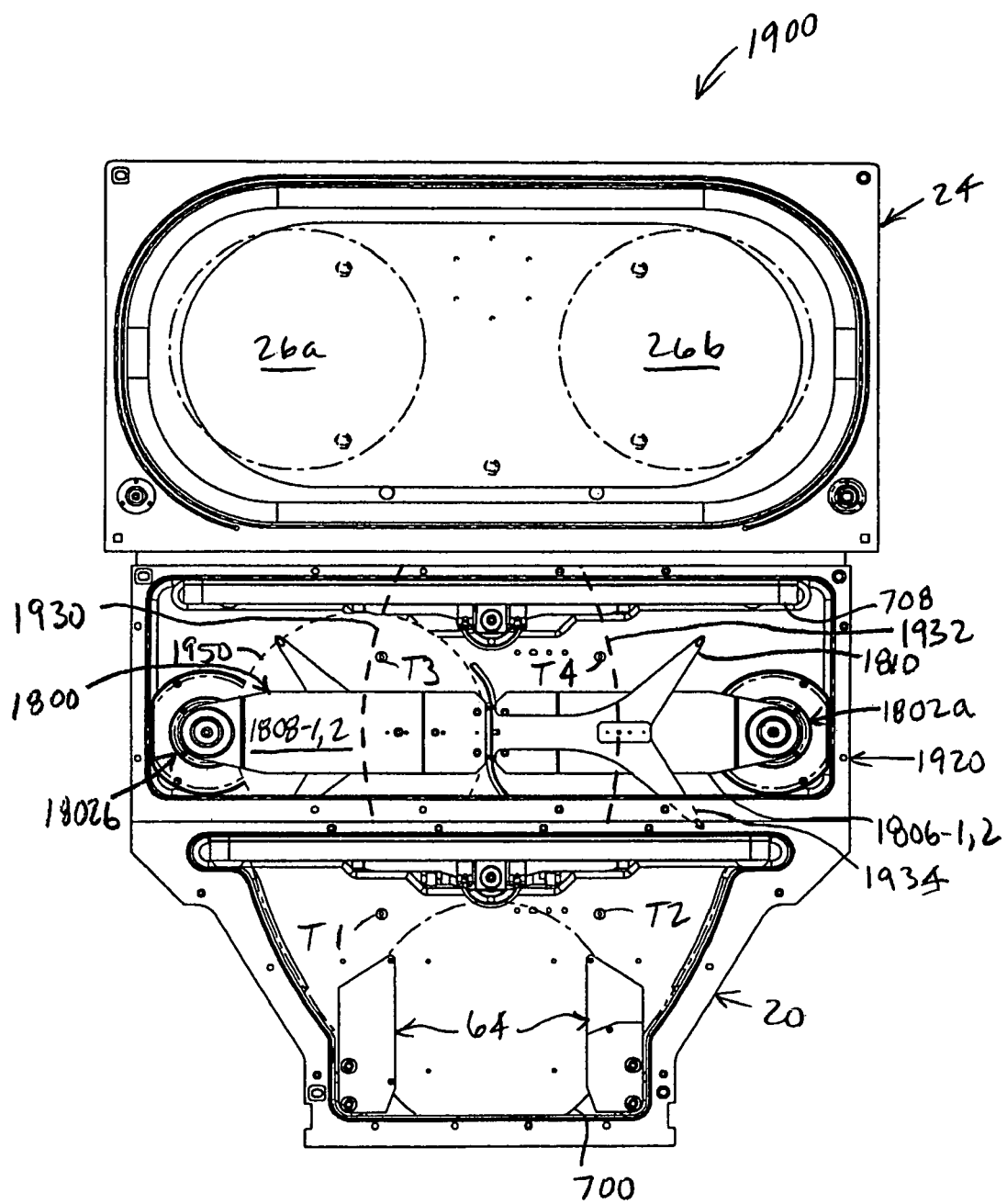
FIG. 33 is a diagrammatic plan view of a system, produced in accordance with the present invention, and using the swing arm arrangement of FIGS. 30-32, shown here to illustrate details of the structure of the system and its associated advantages.

Referring now to FIG. 33, swing arm arrangement 1800 is illustrated in a plan view as installed in a chamber arrangement 1900 including aforedescribed loadlock 20 and process chamber 24. It is noted that the lids are not shown on the chambers for illustrative purposes. Chamber arrangement 1900 includes a transfer chamber 1920 arranged between loadlock 20 and process chamber 24 such that wafers can be moved therebetween, via the transfer chamber. Slit door 706 is used to selectively seal loadlock 20 from transfer chamber 1920 and slit door 708 is used to selectively seal process chamber 24 from transfer chamber 1920. Accordingly, transfer chamber 1920 is selectively pressure isolatable from the process chamber and/or the loadlock.

Still referring to FIG. 33, wafers are moved through transfer chamber 1920 along first and second wafer transfer paths 1930 and 1932, respectively, each of which is shown as a semicircular dashed line and is defined by the path taken by the center of the wafer through the transfer chamber. In the present example, slit doors 706 and 708 are shown in their closed positions with each of the first and second swing arm pairs illustrated at what may be referred to as a home position, without supporting wafers, for reasons yet to be described. For the illustrated home position of the swing arms, is noted that the upper and lower swing arms of each swing arm pair are vertically aligned and the width of wafer paddles 1810 is received entirely within the pressure isolatable volume defined by the transfer chamber. Stated in a slightly different way, the transfer chamber defines a configuration of lateral extents in which the transfer arrangement is receivable in pressure isolation from the loadlock and the process chamber. In this regard, portions 1934 of the wafer paddles associated with swing arm arrangement 1802b are shown in phantom using dashed lines as they extend into the slit door opening leading into loadlock 20. Thus, these portions of the wafer paddles are adjacent to closed slit door 706. It is to be understood that any home position can be used within the transfer chamber so long as the swing arms do not interfere with the slit door valves that are arranged its opposing sides. Moreover, the home position can employ a slight rotational offset between the upper and lower swing arm of each swing arm pair which may facilitate individually sensing or detecting the presence or absence of a wafer on each wafer paddle.

With respect to vertical or "Z" motion using lift motor 152 (shown in FIG. 30), such movement is not limited to the home position, but may be performed at any appropriate position or during rotational movement of the swing arms such that the vertical movement occurs over a range of rotation of the swing arms. Consideration should be given to the vertical height or width of the slit doors, since at least the wafer will undergo vertical movement within the confined vertical extents of at least one of the slit doors, as will be further described.

An outline of a wafer 1950 is illustrated using a dashed line in FIG. 33. Based on the latter, it is evident that the lateral extents of transfer chamber 1920 with respect to the distance between slit door 706 and slit door 708, while being capable of receiving the width of paddles 1810 therebetween, is less than the diameter of the wafer, as will be further described.

Figure 34:
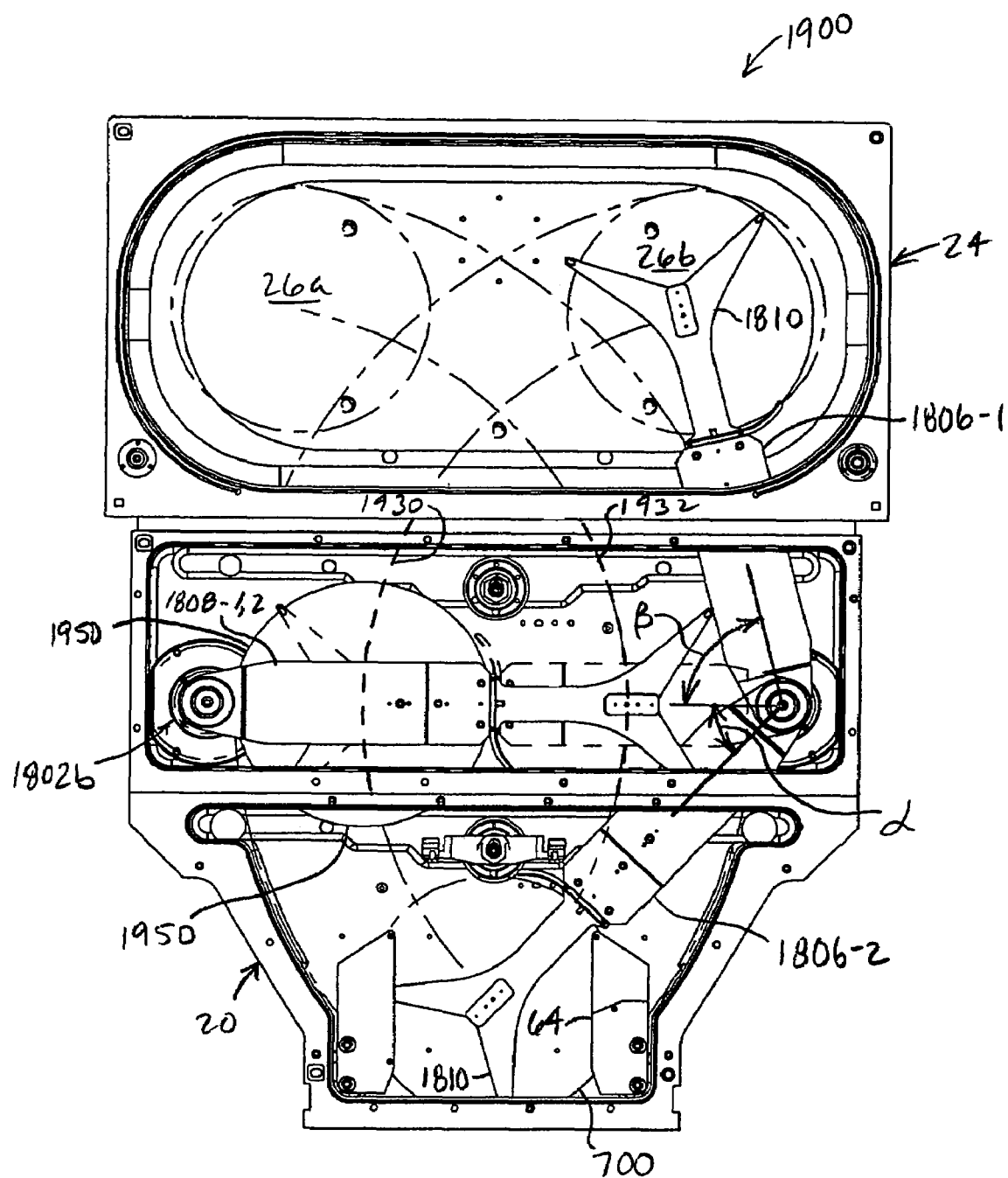
FIG. 34 is another diagrammatic plan view of the system of FIG. 33, showing the swing arm arrangement in a rotated orientation and associated details.

Referring to FIG. 34 in conjunction with FIG. 33, the former is a diagrammatic plan view that illustrates swing arm arrangement 1802a engaged in a transfer operation. It is noted that slit doors 706 and 708 have not been shown for purposes of clarity in the figure, but are necessarily open during a transfer operation. While swing arm arrangement 1802b could be used to simultaneously perform a similar operation, the present example serves to illustrate the independent nature of the two swing arm arrangements. Swing arm arrangement 1802a is shown with swing arm 1806-1 positioned at processing station 26b and swing arm 1806-2 positioned at wafer column 700. While wafers have not been illustrated at the wafer column or the process station, it is to be understood that, with respect to picking up and placing wafers, this embodiment operates in essentially the same manner as the embodiment described above. Swing arm arrangement 1802a is also illustrated in phantom at its home position, supporting wafer 1950. Rotation from the home position to/from wafer column 700 requires movement through an angle α, while rotation to/from the home position to process station 26a requires movement through an angle β. It is noted that these angular values do not change with respect to whether a swing arm is the upper or lower one of each swing arm pair. Unlike the aforedescribed embodiment of FIG. 20, these two angular values, as is clearly seen in FIG. 34, are different from one other. Specifically, angle α is less than angle β. As mentioned above, accommodation of the use of different angular offset values is achieved through the use of separate and independently controlled swing arm drive motors.

Having established that angular offset α from the home position to the wafer column in the loadlock is different from angular offset β from the home position to the process station, it should be appreciated that a number of alternative approaches may be used with respect to rotational movement of the upper and lower swing arm of a particular swing arm pair to and from the home position using separate drive motors. For example, the swing arms can be rotated at differing angular velocities so as to arrive at their destinations at approximately the same time. Alternatively, the swing arms can be rotated at least approximately at the same angular velocity so that the swing that is traveling through angle α arrives at its destination prior to the swing arm that is traveling through angle β. Of course, it is contemplated that many bidirectional and counter-rotational motions of the swing arms will take place between the loadlock and one of the process stations (i.e., an angular value of α+β). In this case, both swing arms will rotate by the same total angle of α+β and, hence, both swing arms will arrive at their destinations at approximately the same time when rotated at approximately the same angular velocity.

Referring to FIG. 34, it is clearly seen that wafer 1950, which is shown as if supported by swing arm arrangement 1802a in its home position, extends partially into loadlock 20. It should be appreciated, in this regard, that the lateral extents of the loadlock are insufficient to house a wafer. Thus, for purposes of the illustration of this figure, at least the slit door leading into the loadlock must be in its opened position when a wafer is supported by a wafer paddle in its home position. Moreover, if a vertical movement is performed in the home position, wafer 1950 extends into loadlock 20 through the associated slit door such that the vertical extents of this slit door must be sufficient to accommodate the vertical movement. In accordance with this embodiment, wafers are never present on the transport arrangement when both slit doors are closed. That is, wafers are transferred through the loadlock such that the wafer paddles are always empty when the transfer chamber is in vacuum isolation from the loadlock and process chamber. For any given position of a wafer along wafer transfer paths 1930 and 1932, during transport between the loadlock and process chamber, the wafer would interfere with at least one of the loadlock and the process chamber in a way which would not provide for pressure isolation of the transfer chamber from the loadlock and transfer chamber. For this reason, a highly advantageous sensing arrangement is described below for confirming that the wafer paddles are empty prior to closing the slit doors.

Referring again to FIGS. 33 and 34, the concept of using differing angular offsets to the processing station and wafer station/column from the home position has been recognized by Applicants with respect to providing for a number of advantages with respect to the chamber arrangement that is employed. For purposes of the present Application, this concept may be referred to below as an "asymmetric offset configuration." For example, the asymmetric offset configuration allows transfer chamber 1920 to be significantly smaller than aforedescribed transfer chamber 22 (see, for example, FIG. 20). It is readily apparent that the distance, which may be referred to as the transfer chamber length, between the opposing walls of transfer chamber 1920 which define slit doors 706 and 708 is reduced. As another example, because of the transfer chamber length reduction, the swing arms are also reduced in length. In an actual implementation, the swing arm length has been reduced by approximately 28%.

A number of advantages flow from the use of relatively shorter swing arms as part of the asymmetric offset configuration. For example, shorter swing arms provide for reducing the width of transfer chamber 1920. As another example, the tendency of the swing arms to droop is reduced. As still example, vibration of the distal end of each swing arm may be reduced dramatically since such vibration is generally a function of multiple powers of the length of the swing arm. As yet another example, wafer transfer times are reduced based on at least two factors. As a first factor, the distance between processing stations 26 and wafer columns 700 is actually reduced. As a second factor, the use of a shorter radius swing arm reduces rotation related forces to which a wafer is subjected during a transfer. Therefore, relatively higher rates of rotation can be employed. In combination, these factors cooperate to provide for markedly improved performance.

Figure 35:
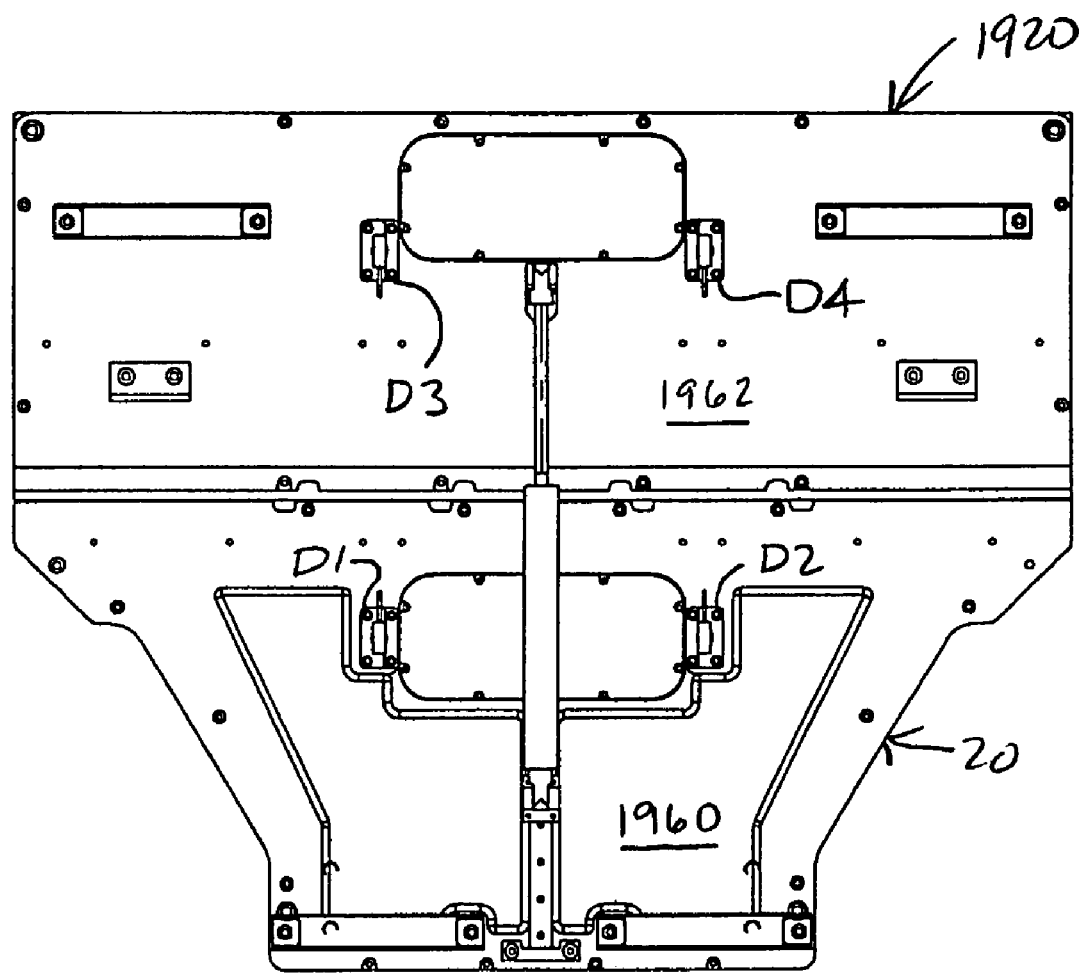
FIG. 35 is a diagrammatic plan view of the loadlock and transfer chamber that is used in the system of FIGS. 33 and 34, shown here to illustrate an arrangement of detector that is supported by the transfer chamber and loadlock lids.

Turning to FIGS. 33 and 35, as mentioned above, it is important that the wafer paddles are empty prior to closing swing arm doors 706 and 708. Accordingly, a sensing arrangement is employed whereby the presence of a wafer is independently sensed for each swing arm paddle 1810. This is accomplished using a "through the beam" sensor configuration that is illustrated in the figures under discussion wherein four sensors are arranged in a highly advantageous way. Each sensor is comprised of a transmitter mounted to the bottom of the loadlock and transfer chamber proximate to ports that are defined by the respective chambers. The transmitters are designated in FIG. 33 as T1-T4. FIG. 35 illustrates loadlock 20 and transfer chamber 1920 including lids 1960 and 1962, respectively, installed thereon which support detectors D1-D4 in a confronting relationship with respective ones of transmitters T-T4 such that the signal path between any transmitter/detector pair is disrupted when a wafer passes therethrough. Any suitable type of transmitter/detector pairs may be used and are readily commercially available for this purpose. It is noted that the transmitter/detector pairs may be referred to as S1-S4 below.

Figure 36B:
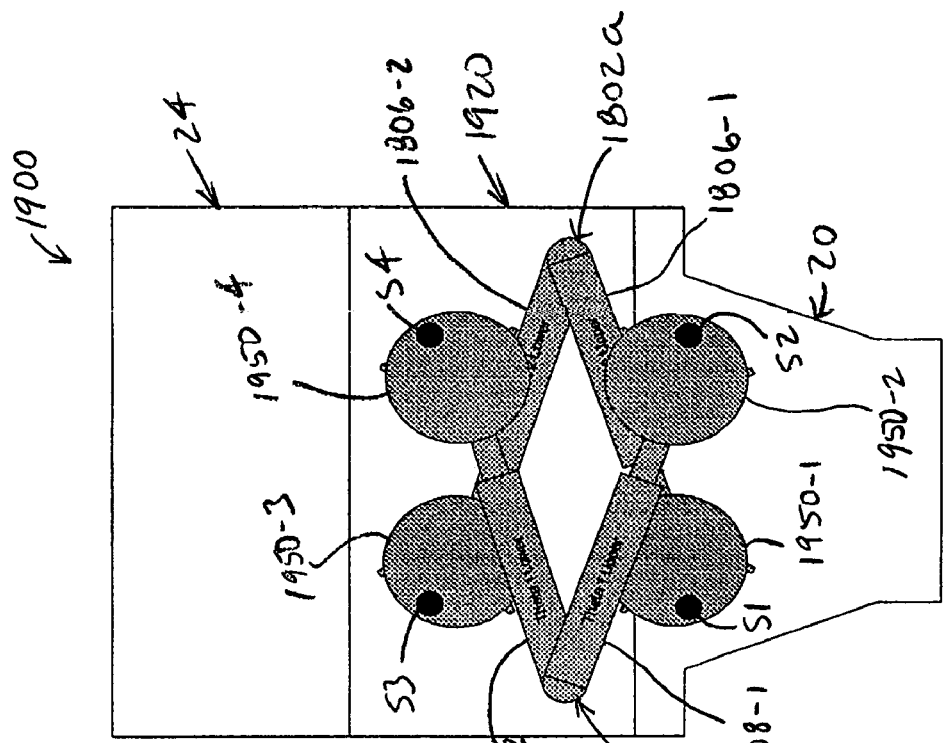
FIGS. 36a and 36b are diagrammatic plan views of the system of FIGS. 33-35, shown here to illustrate the operation and further details with respect to the wafer sensing arrangement.
Figure 36A:
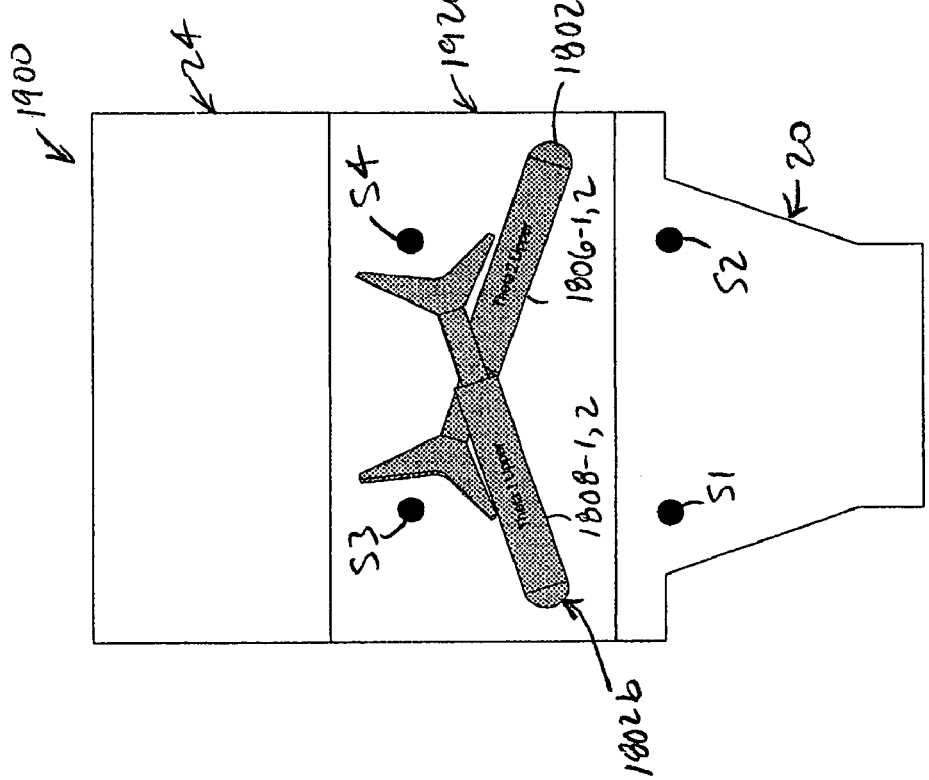

Referring to FIGS. 36a and 36b, system 1900 is diagrammatically illustrated, including sensors S1-S4. In FIG. 36a, swing arm arrangements 1802a and 1802b are rotationally positioned such that the upper and lower swing arms of each swing arm pair are, at least approximately, vertically aligned. While this position may be a home position, it is not a requirement. However, it is considered that this position is highly advantageous, in cooperation with the positions of sensor pair S3 and S4, for purposes of confirming that the paddles of all of the swing arms are empty. Such a confirmation is useful prior to closing the slit doors, described above, in order to avoid interference between a door and an unexpected wafer.

In FIG. 36b, all swing arm paddles are illustrated as carrying wafers, designated as 1950-1 through 1950-4, and the sensors are shown as if the wafers are transparent for purposes of the present discussion. Upper swing arms 1806-1 and 1808-1 are shown as rotated downward, in the view of the figure, so that these swing arms align with sensors S2 and S1, respectively, for purposes of sensing for the presence of wafers 1950-2 and 1950-1. Thus, the presence or absence of a wafer with respect to individual ones of the swing arms can be confirmed, for example, when all of the paddles are expected to be supporting wafers. Accordingly, this sensor arrangement is considered to be highly advantageous with respect to confirming an anticipated status of each wafer paddle. At any point that the detected wafer status is inconsistent with the anticipated status, an alarm can be sounded in order to correct the detected problem.

Figure 37:
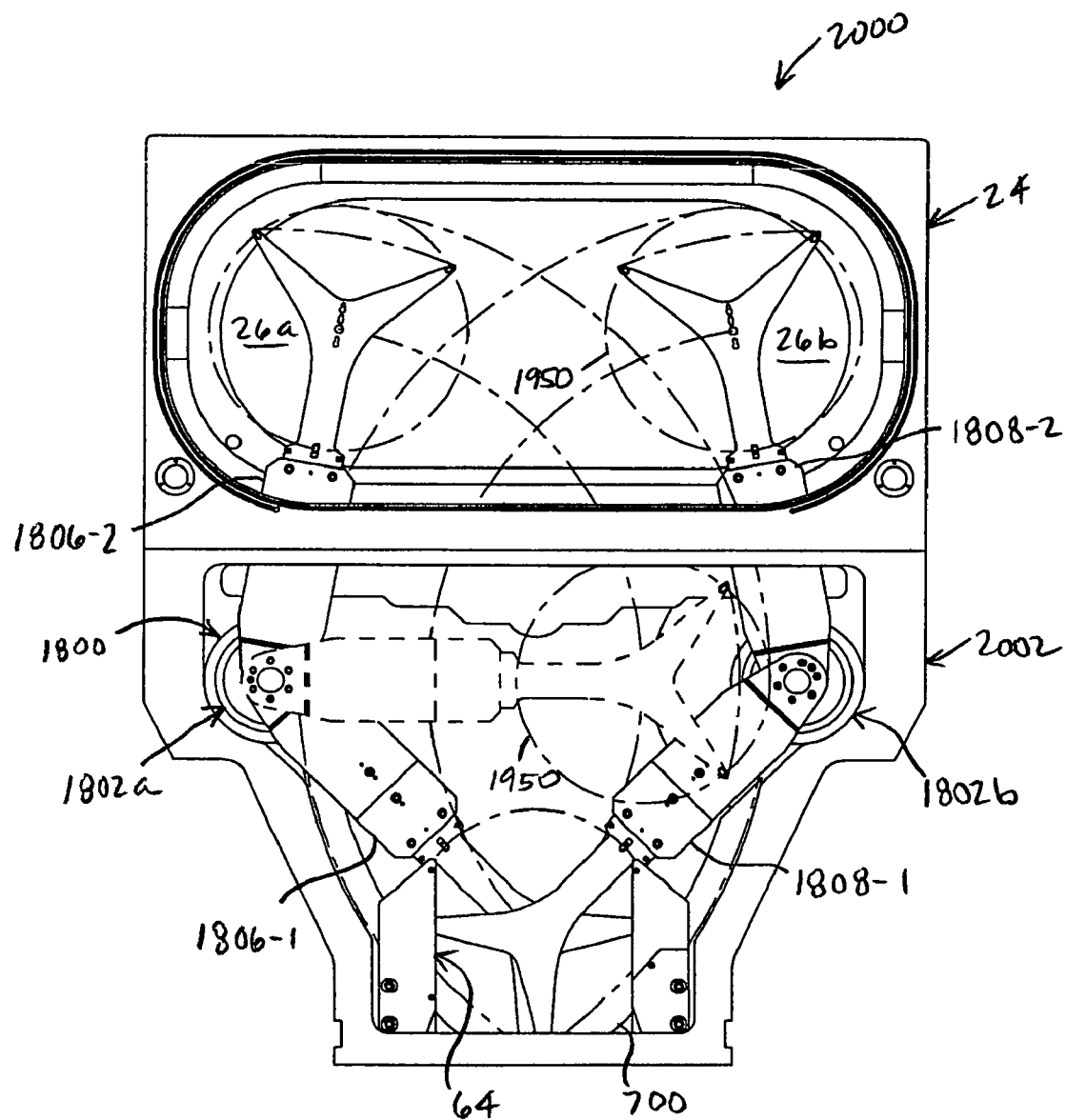
FIG. 37 is a diagrammatic plan view of another system, produced in accordance with the present invention, and using the swing arm arrangement of FIGS. 30-32, shown here to illustrate details of the structure of the system and its associated advantages wherein a transfer chamber is not included.

Another embodiment of a system, produced in accordance with the present invention, is illustrated in FIG. 37 and generally indicated by the reference number 2000. System 2000 includes previously described swing arm arrangement 1800 installed in a loadlock 2002. In this embodiment, no transfer chamber is used so as to provide for a slighter broader range of positions that may be used as a home position as well as eliminating the slit door between the transfer chamber and loadlock (as shown in FIG. 33). Embodiments which do not use a transfer chamber are useful in circumstances such as, for example, when long process times are employed wherein the wafer transfer time is a relatively small fraction of the process time.

Referring to FIG. 30, it is noted that all embodiments contemplated herein using lift motor 152, or any equivalent vertical lift stage, are advantageous with respect to an ability to tune the motion profile experienced by the associated swing arms. That is, when motor 152 is activated to change the height of the swing arms, at some time during the period when the swing arms move between the process chamber and the loadlock, the swing arms will react based on the motion profile, as well as their mechanical characteristics. Of concern with respect to the motion profile is its acceleration component and, more particularly, its vertical component of acceleration induced using the vertical lift stage, which can cause bouncing and/or oscillation that may be implicated in particle generation through producing relative motion between a paddle and wafer supported thereby. Accordingly, motor 152 can be driven in accordance with motion profiles, in conjunction with the mechanical characteristics of the swing arms, that result in minimal bounce and/or oscillation of the swing arms and paddles. It is considered that one having ordinary skill in the art is capable of developing appropriate motion profiles in view of the recognition brought to light herein.

Although each of the aforedescribed physical embodiments have been illustrated with various components having particular respective orientations, it should be understood that the present invention may take on a variety of specific configurations with the various components being located in a wide variety of positions and mutual orientations. Furthermore, the methods described herein may be modified in an unlimited number of ways, for example, by reordering, modifying and recombining the various steps. Accordingly, it should be apparent that the arrangements and associated methods disclosed herein may be provided in a variety of different configurations and modified in an unlimited number of different ways, and that the present invention may be embodied in many other specific forms without departing from the spirit or scope of the invention. Therefore, the present examples and methods are to be considered as illustrative and not restrictive, and the invention is not to be limited to the details given herein.

What is claimed is:

1. A system for processing wafers comprising:
at least one loadlock including a wafer station wherein said wafer station is configured for supporting said wafers in a column within the loadlock;
a transfer chamber in selective pressure communication with said loadlock;
a processing chamber including at least one processing station such that the processing chamber is in selective communication with said transfer chamber and said wafers can be transferred between the loadlock and the processing chamber through the transfer chamber; and
a swing arm arrangement including at least one swing arm that is pivotally supported in said transfer chamber and having a distal end that is configured for rotationally moving said wafers between the wafer station in the loadlock and the processing station, said swing arm being positionable in a home position within said transfer chamber, when said loadlock and said processing chamber are both in pressure isolation from said transfer chamber, and configured for swinging said distal end a first angular displacement in one direction from the home position to said wafer station such that any horizontal component of movement of the distal end from the home position to the wafer station is along one portion of a semicircular path and for swinging said distal end a second angular displacement in an opposite direction from said home position to said processing station such that any horizontal component of movement of the distal end from the home position to the processing station is along another portion of the semicircular path and the first angular displacement is different from said second angular displacement such that the loadlock and the processing chamber are simultaneously pressure isolatable from the transfer chamber and from one another substantially only when the swing arm is in the home position and said swing arm is configured for transporting said wafers directly into and out of said column by reaching into the loadlock and wherein said swing arm is configured for placing and picking said wafers to and from said processing station.

2. The system of claim 1 wherein said first angular displacement is less than said second angular displacement.

3. The system of claim 1 wherein each swing arm is limited to providing transfer of said wafers on a radial path that extends in a plan view between one processing station in the processing chamber and said wafer station in the loadlock.

4. The system of claim 1 wherein said loadlock and said processing chamber are arranged on a pair of opposite sidewalls of said transfer chamber which opposite sidewalls partially form a peripheral boundary of the transfer chamber such that the processing chamber and the loadlock are each adjacent to one of the opposite sidewalls outside of the transfer chamber and so that the distal end of the swing arm can pick and place one of said wafers at either one of the wafer station in the loadlock and the processing station in the processing chamber.

5. The system of claim 1 wherein the swing arm pivots around no more than one axis of rotation such that any lateral movement of the distal end in a plan view is limited to a circular motion around the axis of rotation.

6. The system of claim 1 wherein said semicircular path serves as a wafer transfer path between the wafer station in the loadlock and the processing station in the processing chamber and includes the home position therebetween.

7. The system of claim 1 wherein said swing arm is at least generally rigid in extending from a pivot axis to said distal end during the rotational movement such that the distal end moves on the semicircular path.

8. The system of claim 7 wherein said swing arm is configured for laterally moving the wafer only by rotation about said pivot axis.

9. The system of claim 1 wherein said swing arm arrangement is receivable in the transfer chamber at said home position in pressure isolation from said processing chamber without supporting said wafers and, when the swing arm arrangement otherwise supports at least one wafer at the home position, that wafer extends at least partially into the loadlock such that the loadlock is not pressure isolatable from the transfer chamber.

10. The system of claim 9 wherein said loadlock and said transfer chamber cooperate to define a first slit aperture for transferring said wafers therethrough between the loadlock and the transfer chamber, and said transfer chamber and said processing chamber cooperate to define a second slit aperture for transferring said wafers therethrough between the transfer chamber and the processing chamber, said first slit aperture and said second slit aperture being arranged on opposing sides of the transfer chamber with respect to one another and at least approximately parallel with one another and said transfer arrangement includes one or more wafer paddles each one of which is configured for supporting one of said wafers such that each wafer paddle extends at least partially into the first slit aperture at said home position.

11. The system of claim 10 wherein said wafers each include a wafer diameter and wherein each wafer paddle is configured for supporting one of said wafers having said wafer diameter and said system further comprising:
a first slit door supported in said loadlock and configured for movement between a first sealed position and a first open position such that the loadlock is pressure sealed from the transfer chamber with the first slit door in the first sealed position; and
a second slit door supported in said transfer chamber and configured for movement between a second sealed position and a second open position such that the transfer chamber is pressure sealed from the processing chamber with the second slit door in the second sealed position and each wafer paddle is receivable at said home position laterally between the first and second slit doors in said first and second sealed positions while said wafer diameter is not laterally receivable between said first and second slit doors in said first and second sealed positions when one of the wafers is supported by one of the wafer paddles in the home position.

12. The system of claim 1, wherein
said processing chamber includes a pair of side-by-side first and second process stations defining a process station center line extending through a first center of the first process station and a second center of the second process station and each process station is configured for applying the treatment process to one of said wafers, and a line of symmetry extends between the process stations normal to said process station center line,
said wafer station is configured for supporting at least one of said wafers laterally offset from said process station center line and located on said line of symmetry, and
said swing arm arrangement includes at least a first swing arm and a second swing arm, each of which defines an at least generally rigid elongation axis and each of which pivots about a first pivot axis and a second pivot axis, respectively, located between the wafer station and the process station center line, and each of the first swing arm pivot axis and the second swing arm pivot axis is equally offset from said line of symmetry on opposite sides thereof to define a pivot axis center line that is parallel to the process chamber center line and normal to said line of symmetry and, at said home position, the elongation axis of the first swing arm is substantially parallel to the elongation axis of the second swing arm with the first swing arm extending toward the second pivot axis of the second swing arm and the elongation axis of the second swing arm extending toward the first pivot axis of the first swing arm.

13. The system of claim 12 wherein said wafer station is configured for supporting a plurality of said wafers at least generally in a stacked relationship to form said column.

14. The system of claim 13 wherein the first process station, the second process station, the first axis, the second axis and the wafer column cooperate to define a pentagonal shape in a plan view.

15. In a system for processing wafers at least including a load lock having a wafer station and a processing chamber having a processing station, an improvement comprising:
a transfer arrangement including a transfer chamber in selective pressure communication with said loadlock and said processing chamber, said transfer chamber including a swing arm arrangement having at least a first swing arm and a second swing arm configured for coaxial rotation about a common axis of rotation and each swing arm includes a wafer paddle for supporting one of said wafers thereon for use in rotationally transporting the wafers along a semicircular transfer path between the wafer station in the loadlock and the processing station in the processing chamber, said first and second swing arms being configured so that one of the swing arms can rotate one wafer paddle on the transfer path toward the processing station while the other one of the swing arms independently rotates another wafer paddle on the transfer path toward the wafer station and each of the first and second swing arms moves each wafer paddle through a home position in rotating between the wafer station and the processing station with the first swing arm and the second swing arm being positionable in said home position within the transfer chamber such that the load lock and the processing chamber are simultaneously pressure isolatable from the transfer chamber and from one another substantially only when the swing arms are in the home position, and the wafer station is reached by rotating through a first angular offset from the home position such that any horizontal component of movement of each wafer paddle from the home position to the wafer station is along one portion of the semicircular path with the processing station being reached by rotating through a second angular offset from the home position such that any horizontal component of movement of each wafer paddle from the home position to the processing station is along another portion of the semicircular path and the first angular offset is different from the second angular offset; and
said wafer station is configured for supporting said wafers in a column and each swing arm is configured for transporting said wafers into and out of said column by reaching directly into said loadlock with each wafer paddle and each swing arm configured for placing and picking the wafers to and from said processing station by reaching directly into said processing chamber with each wafer paddle.

16. The improvement of claim 15 wherein the first angular offset is less than the second angular offset.

17. The improvement of claim 15 wherein the first and second swing arms, in said home position, support a first one and a second one of said wafers, respectively, in a way which provides for sensing the presence of at least one of the first and second ones of the wafers.

18. The improvement of claim 17 further comprising:
a sensor arrangement for sensing the presence of at least one of the first and second wafers when supported in a side-by-side generally spaced apart relationship.

19. In a system for processing wafers at least including a load lock having a wafer station and a processing chamber having a processing station, an improvement comprising:
a transfer arrangement including a transfer chamber in selective pressure communication with said loadlock and said processing chamber and said transfer chamber including a swing arm arrangement having at least a first swing arm and a second swing arm configured for coaxial rotation about a common axis of rotation and each swing arm includes a wafer paddle for supporting one of said wafers thereon for use in rotationally transporting the wafers along a semicircular transfer path between the wafer station in the loadlock and the processing station in the processing chamber wherein said semicircular transfer path serves as a wafer transfer path between the wafer station in the loadlock and the processing station in the processing chamber and includes a home position, said first and second swing arms being configured so that one of the swing arms can rotate one wafer on the semicircular transfer path toward the processing station while the other one of the swing arms independently rotates another wafer on the semicircular transfer path toward the wafer station with the first swing arm and the second swing arm being positionable in said home position within the transfer chamber such that the loadlock and the processing chamber are simultaneously pressure isolatable from the transfer chamber and from one another substantially only when the swing arms are in the home position and any lateral component of movement of each wafer paddle is on the semicircular transfer path and said swing arm arrangement includes a drive arrangement at least for simultaneously selectively rotating the first swing arm and the second swing arm paddles at different angular velocities on the semicircular transfer path such that one of the swing arms rotates one paddle between the home position and the wafer station at one angular velocity while the other swing arm rotates another paddle between the home position and the processing station at another, different angular velocity so that rotating the swing arms oppositely from the home position causes one of the swing arms to arrive at the processing station while the other one of the swing arms simultaneously arrives at the wafer station; and
said wafer station is configured for supporting said wafers in a column and each swing arm is configured for transporting said wafers into and out of said column by reaching directly into said loadlock with each wafer paddle and each swing arm is configured for placing and picking the wafers to and from said processing station by reaching directly into said processing chamber with each wafer paddle.

20. The improvement of claim 13 wherein each swing arm pivots only around said common axis of rotation such that any lateral movement of each wafer paddle in a plan view is limited to a circular motion on the semicircular transfer path around the common axis of rotation.

21. The improvement of claim 15 wherein said semicircular transfer path serves as a wafer transfer path between the loadlock and the processing chamber and includes the home position therebetween.

22. The improvement of claim 15 wherein each swing arm is at least generally rigid in extending from the common axis of rotation to its wafer paddle during the rotational movement such that the paddle moves on the semicircular path.

23. The improvement of claim 22 wherein each swing arm is configured for laterally moving the wafer only by a circular rotation about said common axis.

24. The improvement of claim 19 wherein each swing arm pivots only around said common axis of rotation such that any lateral movement of each wafer paddle in a plan view is limited to a circular motion on the semicircular transfer path around the common axis of rotation.

25. The improvement of claim 19 wherein each swing arm is at least generally rigid in extending from the common axis of rotation to its wafer paddle during the rotational movement such that the paddle moves on the semicircular path.

26. The improvement of claim 25 wherein each swing arm is configured for laterally moving the wafer only by a circular rotation about said common axis.

27. In a system for processing wafers at least including a load lock having a wafer station and a processing chamber having a processing station, an improvement comprising:
a transfer arrangement including a transfer chamber in selective pressure communication with said loadlock and said processing chamber and said transfer chamber including a swing arm arrangement having at least a first swing arm and a second swing arm configured for coaxial rotation about a common axis of rotation and each swing arm includes a wafer paddle for supporting one of said wafers thereon for use in rotationally transporting the wafers along a semicircular transfer path between the wafer station in the loadlock and the processing station in the processing chamber, said first and second swing arms being configured so that one of the swing arms can rotate one wafer paddle on the semicircular transfer path from a home position toward the processing station while the other one of the swing arms independently rotates another wafer paddle on the semicircular transfer path from the home position toward the wafer station with the first swing arm and the second swing arm being positionable in said home position within the transfer chamber when said transfer chamber is in pressure isolation from both the processing chamber and the loadlock such that the loadlock and the processing chamber are simultaneously pressure isolatable from the transfer chamber and from one another substantially only when the swing arms are in the home position and any lateral component of movement of each wafer paddle is on the semicircular transfer path and said swing arm arrangement includes a drive arrangement at least for selectively rotating the paddles of the first swing arm and the second swing arm in opposite directions from the home position on the semicircular path by different angular amounts; and
said wafer station is configured for supporting said wafers in a column and each swing arm is configured for transporting said wafers into and out of said column by reaching directly into said loadlock with each wafer paddle and each swing arm is configured for placing and picking the wafers to and from said processing station by reaching directly into said processing chamber with each wafer paddle.

28. The improvement of claim 27 wherein said first swing arm and said second swing arm each rotate at least approximately at the same given angular velocity in said opposite directions in relation to the home position such that one of the swing arms rotates for a first length of time from the home position to reach the wafer station and the other one of the swing arms rotates for a second length of time, that is different from the first length of time, from the home position to reach the processing station.

29. The improvement of claim 28 wherein said drive arrangement includes a first motor for selectively rotating said first swing arm and a second motor for selectively rotating said second swing arm, independent of the rotation of the first swing arm.

30. The improvement of claim 27 wherein said semicircular transfer path serves as a wafer transfer path between the wafer station in the loadlock and the processing station in the processing chamber such that each swing arm pivots only around said common axis of rotation and any lateral movement of each wafer paddle in a plan view is limited to a circular motion on the semicircular transfer path around the common axis of rotation.

31. The improvement of claim 27 wherein each swing arm is at least generally rigid in extending from the common axis of rotation to its wafer paddle during the rotational movement such that the paddle moves on the semicircular path.

32. The improvement of claim 31 wherein each swing arm is configured for laterally moving the wafer only by a circular rotation about said common axis.

* * * * *